United States Patent
Van Dal et al.

(10) Patent No.: US 10,535,780 B2
(45) Date of Patent: Jan. 14, 2020

(54) SEMICONDUCTOR DEVICE INCLUDING AN EPITAXIAL LAYER WRAPPING AROUND THE NANOWIRES

(71) Applicant: TAIWAN SEMICONDUCTOR MANUFACTURING CO., LTD., Hsinchu (TW)

(72) Inventors: Mark Van Dal, Linden (BE); Gerben Doornbos, Leuven (BE)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/588,830

(22) Filed: May 8, 2017

(65) Prior Publication Data
US 2018/0323312 A1 Nov. 8, 2018

(51) Int. Cl.
*H01L 29/786* (2006.01)
*H01L 29/423* (2006.01)
(Continued)

(52) U.S. Cl.
CPC ...... *H01L 29/78696* (2013.01); *H01L 27/092* (2013.01); *H01L 29/0673* (2013.01); *H01L 29/1037* (2013.01); *H01L 29/401* (2013.01); *H01L 29/41725* (2013.01); *H01L 29/42376* (2013.01); *H01L 29/42392* (2013.01); *H01L 29/66439* (2013.01); *H01L 29/66742* (2013.01); *H01L 29/66772* (2013.01);
(Continued)

(58) Field of Classification Search
CPC ......... H01L 29/42392; H01L 29/66545; H01L 29/775; H01L 29/66439; H01L 29/66666; H01L 29/785; H01L 29/1033; H01L 21/02532; H01L 21/02381; H01L 21/02603; H01L 21/823807; H01L 29/78696; H01L 29/0669
See application file for complete search history.

(56) References Cited

U.S. PATENT DOCUMENTS

| 8,399,314 B2 * | 3/2013 | Cohen | H01L 29/0673 257/E21.703 |
| 9,219,154 B1 * | 12/2015 | Cheng | H01L 29/7853 |

(Continued)

OTHER PUBLICATIONS

Kelin J. Kuhn et al., "Considerations for Ultimate CMOS Scaling", IEEE vol. 59, No. 7 Jul. 1813-1828, May 16, 2012.

(Continued)

*Primary Examiner* — Khiem D Nguyen
(74) *Attorney, Agent, or Firm* — Birch, Stewart, Kolasch & Birch, LLP

(57) ABSTRACT

A multi-stack nanowire device includes a plurality of fins. Each of the fins has a multi-layer stack comprising a first nanowire and a second nanowire. A first portion of the first nanowire and second nanowire are doped to form source and drain regions. A second portion of the first nanowire and second nanowire is channel regions between the source and drain regions. An epitaxial layer wraps around the second portion of first nanowire and second nanowire. A gate is disposed over the second portion of the first nanowire and second nanowire. The epitaxial layer is interposed in between the first nanowire and the second nanowire over the channel region.

20 Claims, 89 Drawing Sheets

(51) Int. Cl.
  *H01L 29/06* (2006.01)
  *H01L 29/10* (2006.01)
  *H01L 29/66* (2006.01)
  *H01L 29/417* (2006.01)
  *H01L 29/40* (2006.01)
  *H01L 29/775* (2006.01)
  *H01L 27/092* (2006.01)
  *H01L 21/8238* (2006.01)
  *B82Y 10/00* (2011.01)
  *B82Y 40/00* (2011.01)

(52) U.S. Cl.
  CPC ...... *H01L 29/775* (2013.01); *H01L 29/78654* (2013.01); *B82Y 10/00* (2013.01); *B82Y 40/00* (2013.01); *H01L 21/823807* (2013.01); *H01L 29/42368* (2013.01); *H01L 29/66469* (2013.01)

(56) References Cited

U.S. PATENT DOCUMENTS

| | | | | |
|---|---|---|---|---|
| 9,583,399 | B1* | 2/2017 | Chen | H01L 21/823821 |
| 9,691,851 | B1* | 6/2017 | Fung | H01L 29/0684 |
| 2010/0065887 | A1* | 3/2010 | Goebel | H01L 29/045 |
| 2011/0233522 | A1* | 9/2011 | Cohen | H01L 29/0673 |
| | | | | 257/24 |
| 2013/0234215 | A1* | 9/2013 | Okano | H01L 29/42392 |
| | | | | 257/255 |
| 2013/0279145 | A1* | 10/2013 | Then | H01L 29/66431 |
| | | | | 361/820 |
| 2014/0042386 | A1* | 2/2014 | Cea | H01L 29/42392 |
| | | | | 257/9 |
| 2014/0197377 | A1* | 7/2014 | Kim | H01L 27/092 |
| | | | | 257/29 |
| 2015/0053928 | A1* | 2/2015 | Ching | H01L 21/823821 |
| | | | | 257/29 |
| 2015/0104918 | A1* | 4/2015 | Liu | H01L 29/42392 |
| | | | | 438/283 |
| 2015/0287782 | A1* | 10/2015 | Sassiat | H01L 29/0673 |
| | | | | 257/327 |
| 2016/0099344 | A1* | 4/2016 | Liu | H01L 29/42392 |
| | | | | 438/284 |
| 2016/0204195 | A1* | 7/2016 | Wen | H01L 21/02532 |
| | | | | 257/347 |
| 2016/0225849 | A1* | 8/2016 | Wong | H01L 29/0673 |
| 2017/0005195 | A1* | 1/2017 | Ching | H01L 29/7848 |
| 2017/0104061 | A1* | 4/2017 | Peng | H01L 21/3081 |
| 2017/0140996 | A1* | 5/2017 | Lin | H01L 29/42392 |
| 2017/0162714 | A1* | 6/2017 | Zhu | H01L 29/0673 |

OTHER PUBLICATIONS

Shu-Han Hsu1 et al., "Triangular-channel Ge NFETs on Si with (111) Sidewall-Enhanced Ion and Nearly Defect-free Channels", IEEE IEDM12-525-IEDM12-528, 2012.

* cited by examiner

US 10,535,780 B2

SEMICONDUCTOR DEVICE INCLUDING AN EPITAXIAL LAYER WRAPPING AROUND THE NANOWIRES

BACKGROUND

Semiconductor nanowires are becoming a major research focus in nanotechnology. Various methods of forming metal-oxide-semiconductor field-effect transistors (MOSFETs) comprising nanowires have been explored, including the use of dual material nanowire, where different material nanowires are used for N-channel field-effect transistor (NFET) and P-channel field-effect transistor (PFET) devices. For example, silicon (Si) nanowires may be used as the channel material for the NFET devices, while silicon germanium (SiGe) nanowires may be used as the channel material for the PFET devices. As another example, multiple-stacked ("multi-stack") nanowires have been used in forming NFET and PFET devices, having the advantage of increasing the current carrying capability of these devices. One of the leading multi-stack candidates is the trigate FET. A trigate FET device consists of a vertical standing Si body (fin) and the gate is wrapped around either side creating two channels on the sides and one on the top. High-aspect-ratio trigate FETs with aggressively scaled fin widths (30 nm and narrower) are of particular interest as they combine excellent short channel effect (SCE) immunity with high drivability per unit chip area.

The use of selective epitaxial Si growth (SEG) for channel region epitaxy (in-situ doped) decreases access resistance. However, densely packed FET has very restricted space available for epitaxial growth. The epitaxial layer may be not fit for its intended purpose because of undesired configuration.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
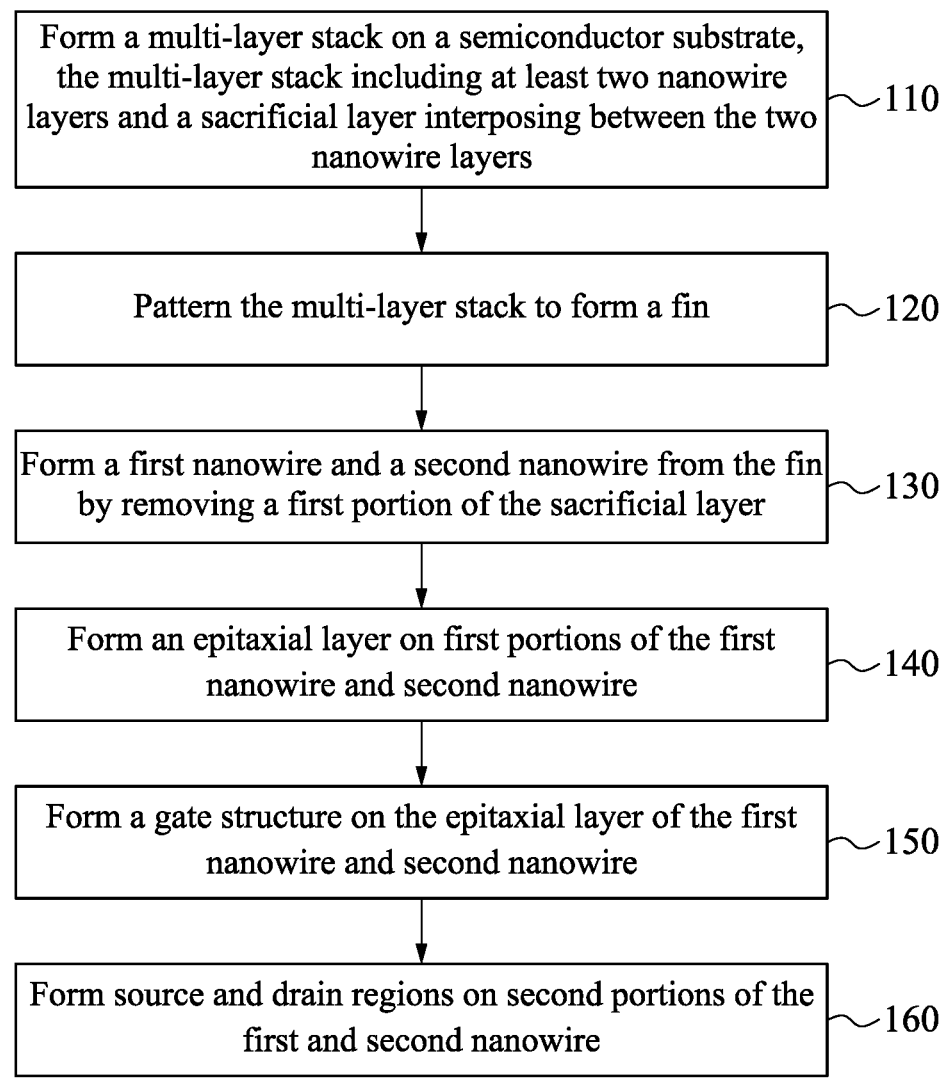
FIG. 1 is a flow chart illustrating a method of fabricating a multi-stack nanowires in FET device in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

A multi-stack Si/SiGe structure may be used to generate multi-stack nanowire devices. Such multi-stack nanowire devices may include one or more PFET devices and one or more NFET devices, where the PFET devices include Ge nanowire and the NFET devices comprise Si nanowire. Nanowires are typically rounded, square or rectangular in cross-section. However, hole and electron mobility may vary significantly with different materials in different plane like <111> or <110>. Illustrative embodiments described herein utilize a diamond shape nanowire for channel region.

Referring to FIG. 1, illustrated a flow chart of a method 100 of fabricating a multi-stack nanowire FET device in accordance with some embodiments of the instant disclosure. The method begins with operation 110 in which a multi-layer stack is formed on a semiconductor substrate. The multi-layer stack includes at least two nanowire layers and a sacrificial layer interposing between the two nanowire layers. The method continues with operation 120 in which the multi-layer stack is patterned to form a fin. Subsequently, operation 130 is performed. A first nanowire and a second nanowire are formed from the fin by removing a first portion of the sacrificial layer. The method continues with operation 140 in which an epitaxial layer is formed on first portions of the first nanowire and second nanowire. The method continues with operation 150 in which a gate structure is formed on the epitaxial layer of the first nanowire and second nanowire. Next in operation 160 source and drain regions are formed on second portions of the first nanowire and second nanowire. The discussion that follows illustrates embodiments of semiconductor devices that can be fabricated according to the method 100 of FIG. 1.

An illustrative embodiment for forming a multi-stack nanowire FET device will be described below with reference to FIGS. 2-17D. Each of the structures illustrates steps which may be used in the process of forming a multi-stack nanowire FET device.

Figure 2:
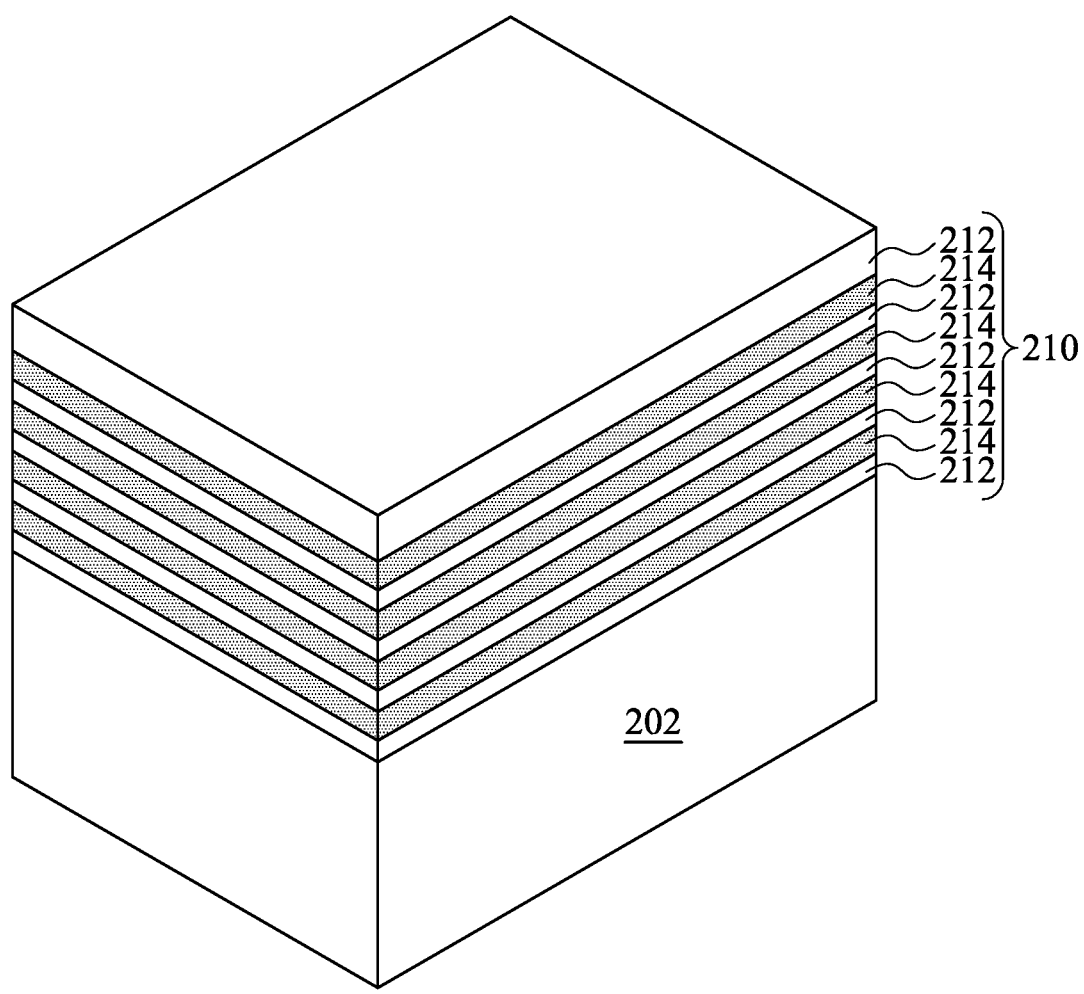
FIG. 2 is a schematic diagram illustrating a portion of a semiconductor substrate at a stage in a multi-stack nanowire FET device formation process in accordance with some embodiments of the instant disclosure.

Reference is made to FIG. 2 and operation 110 of method 100 in FIG. 1. FIG. 2 is a schematic diagram of a structure 200. The structure 200 includes a semiconductor substrate 202 and a multi-layer stack 210. In some embodiments, the semiconductor substrate 202 includes Si. The multi-layer stack 210 includes sacrificial layers 212 and nanowires 214. The sacrificial layers 212 and the nanowires 214 are stacked alternatively. For example, a sacrificial layer 212 is interposed in between every two nanowires 214. In some embodiments, the sacrificial layers 212 may include SiGe or Si, and the nanowires 214 may include Si, SiGe, Ge, GaAs, InAs, InSb and GaSb, and the instant disclosure is not limited thereto. The nanowires 214 may use the same material as the semiconductor substrate 202. The number of layers (sacrificial layer 212 and nanowire 214) in the multi-layer stack 210 determines the number of nanowires in a fin after patterning. FIG. 2 shows a multi-layer stack 210 having five sacrificial layers 212 and four nanowires 214. In this case, four nanowires are formed later, and the instant disclosure is not limited thereto. The thickness of the sacrificial layers 212 also determines the pitch between the nanowires, and the thickness of the nanowires 214 determines the dimension of the nanowires. The pitch between the nanowire will elaborated hereinafter.

Figure 3A:
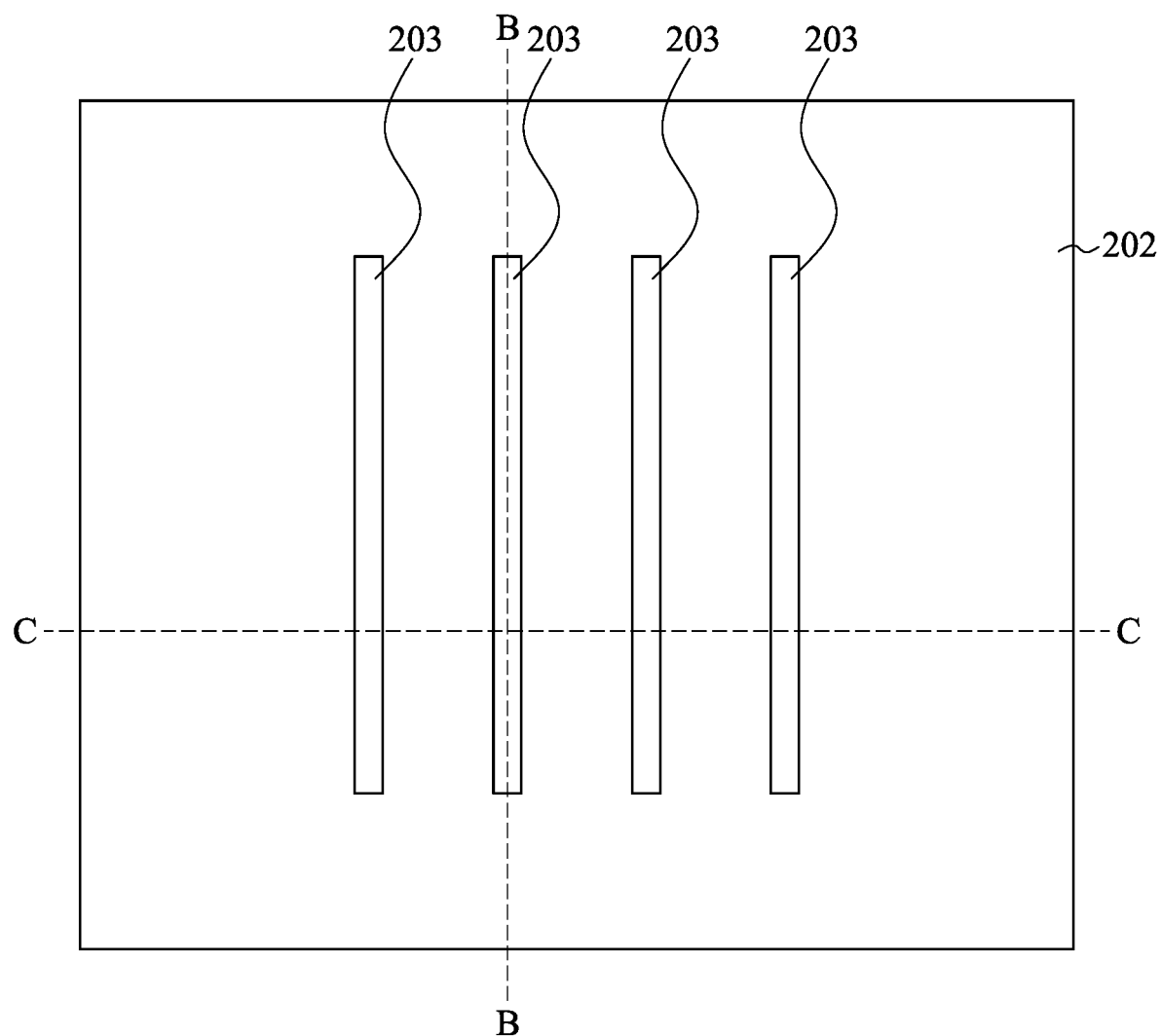
FIGS. 3A-3C illustrate a top view, a cross-sectional view along section BB, and a cross-sectional view along section C-C of the device of FIG. 3A, respectively, in a multi-stack nanowire FET device formation process in accordance with some embodiments of the instant disclosure.
Figure 3B:
Figure 3C:
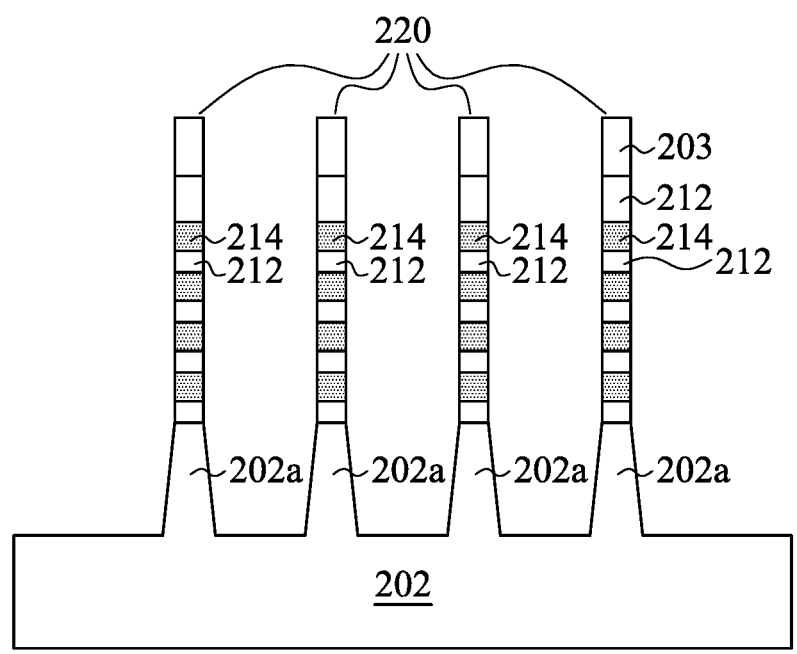

Reference is made to FIGS. 3A-3C and operation 120 of method 100 in FIG. 1. FIG. 3A is a top view of the structure 200. FIGS. 3B and 3C are cross-sectional views taken along section BB and CC in FIG. 3A respectively. The multi-layer stack 210 is patterned to form fins 220. A hard mask 203 is formed over a portion of the top sacrificial layer 212 resulting in fins 220. The hard mask 203 may initially be formed over the entire top sacrificial layer 212, and selectively removed in the areas in which a FET stacked nanowire device is to be formed. Although the resulting hard mask 203 shown in FIGS. 3A and 3C is patterned into four strips (fins 220) with equal spacing, embodiments are not so limited. The resulting hard mask 203 may be in five, six or more strips, and the spacing between the strips may be varied in other embodiments. The hard mask 203 may be an oxide or nitride for example $SiO_2$ and $SiN_4$. When the multi-layer stack 210 is patterned, a portion of the underlying semiconductor substrate 202 is also removed. As shown in FIG. 3C, the fins 220 include protruded portions 202a of the semiconductor substrate 202.

Figure 4A:
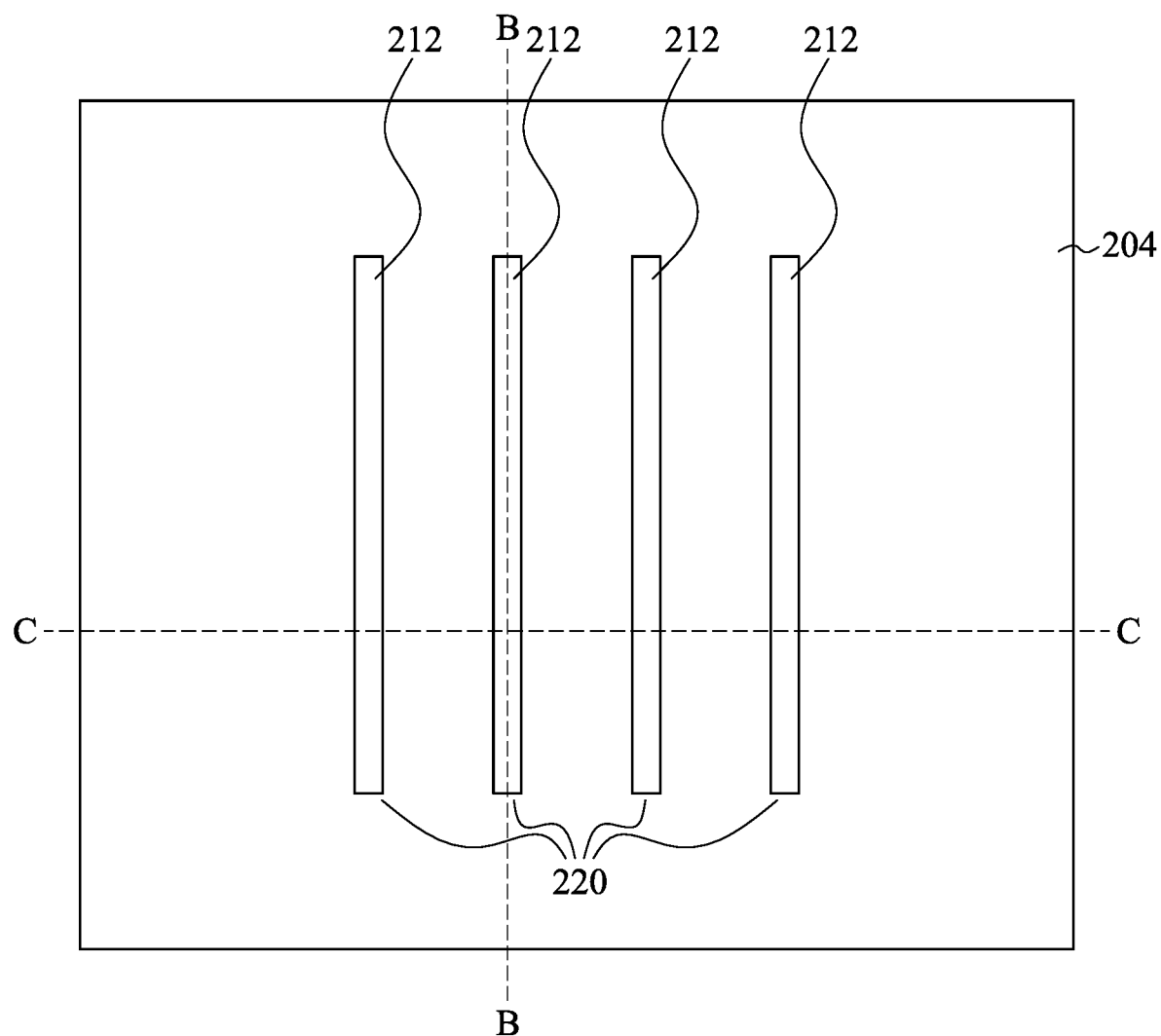
FIGS. 4A-4C illustrate a top view, a cross-sectional view along section BB, and a cross-sectional view along section C-C of the device of FIG. 4A, respectively, in a multi-stack nanowire FET device formation process in accordance with some embodiments of the instant disclosure.
Figure 4B:
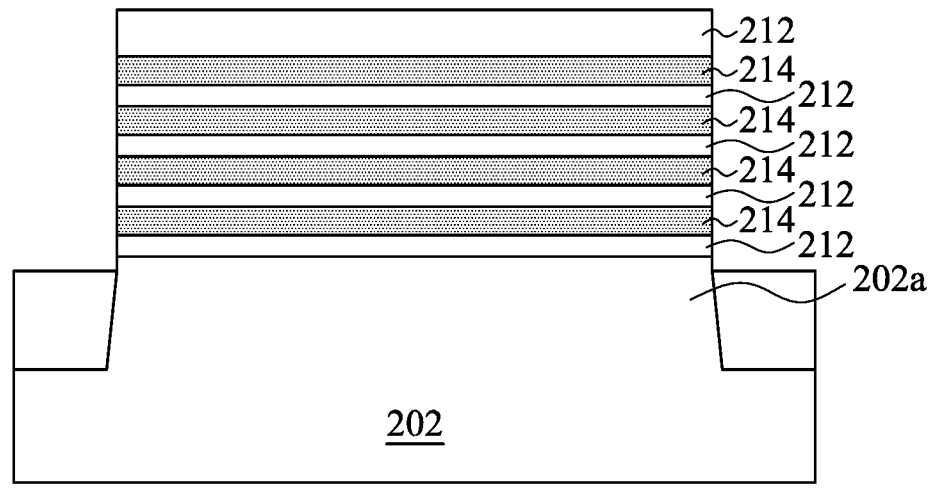
Figure 4C:
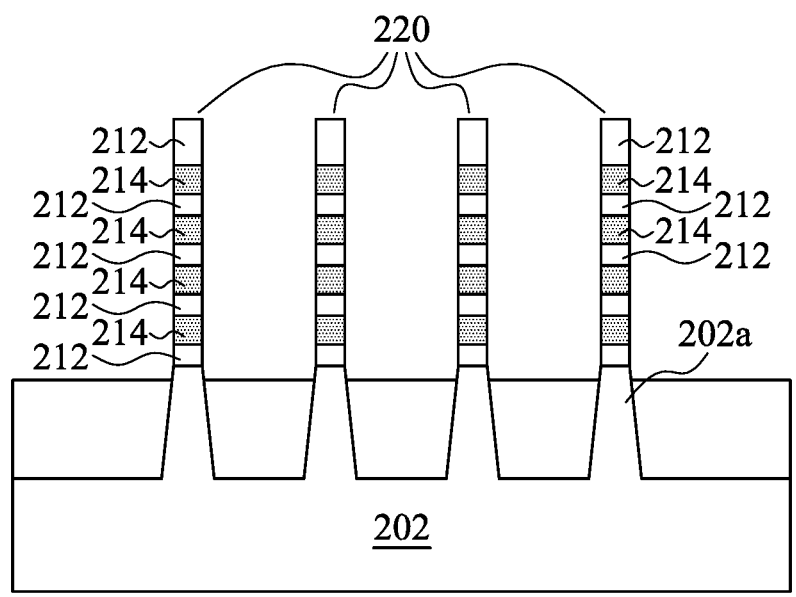

Reference is made to FIGS. 4A-4C. FIG. 4A is a top view of the structure 200. FIGS. 4B and 4C are cross-sectional views taken along section BB and CC in FIG. 4A respectively. The hard mask 203 is removed from the top sacrificial layer 212, and isolation structures 204 are formed. After the removal of the hard mask 203, an oxide is deposited to form isolation structures 204 in the spaces between the fins 220. An etching process is used to recess the oxide into the semiconductor substrate 202 at the base of the fins 220. The fins 220 are completely exposed above the isolation structures 204. A top portion of the protruded portion 202a of the semiconductor substrate 202 is not covered by the isolation structures 204. As shown in FIG. 4C, from the top surface of the isolation structures 204, a total of five sacrificial layers 212 and four nanowires 214 are exposed. The sacrificial layer 212 now caps the fins 220.

Figure 5A:
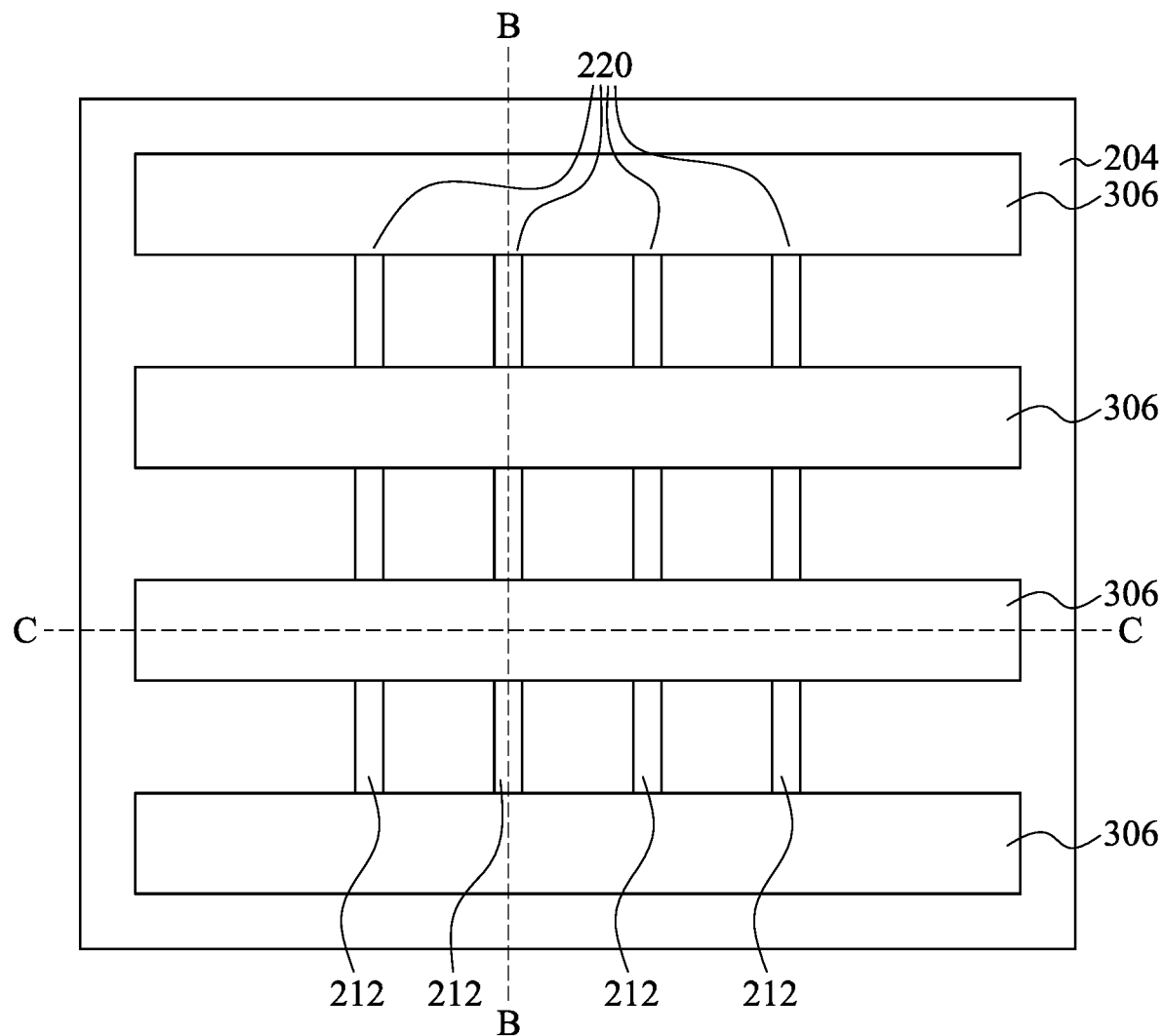
FIGS. 5A-5C illustrate a top view, a cross-sectional view along section BB, and a cross-sectional view along section C-C of the device of FIG. 5A, respectively, in a multi-stack nanowire FET device formation process in accordance with some embodiments of the instant disclosure.
Figure 5B:
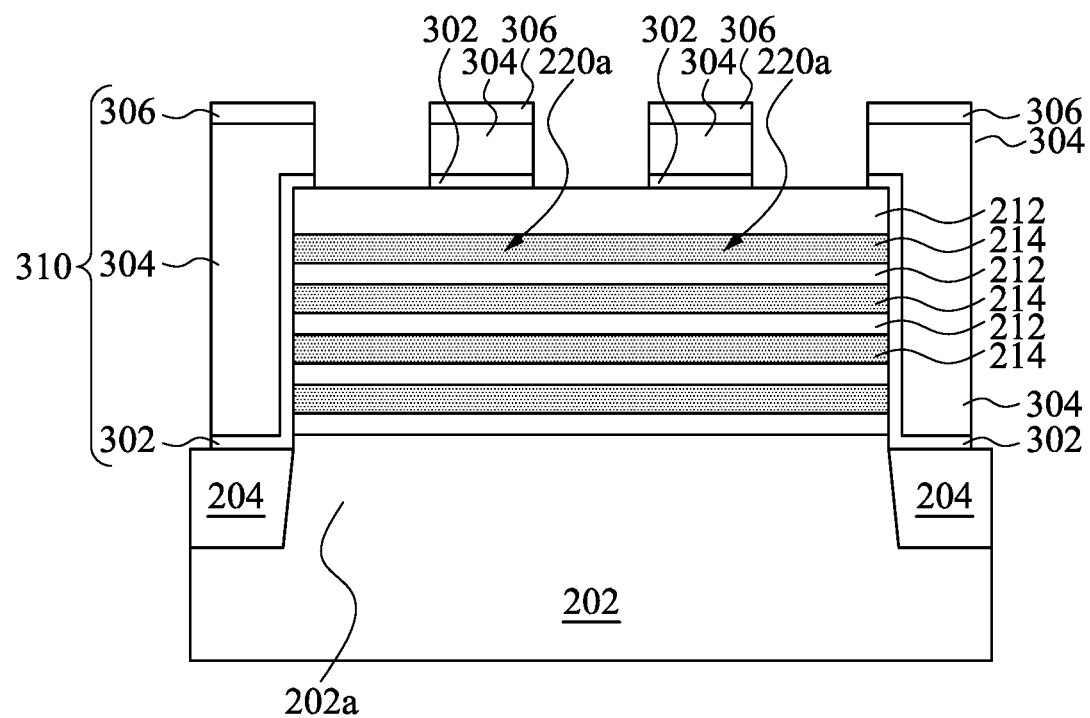
Figure 5C:
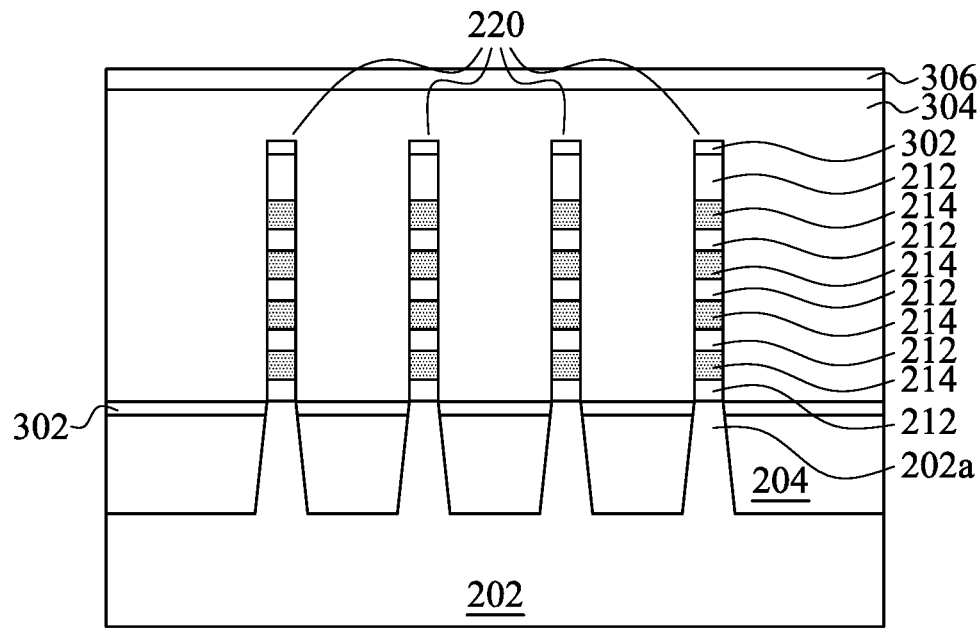

Reference is made to FIGS. 5A-5C. FIG. 5A is a top view of the structure 200. FIGS. 5B and 5C are cross-sectional views taken along section BB and CC in FIG. 5A respectively. Dummy gates 310 are formed over channel regions 220a of the fins 220. The dummy gates 310 may include a dielectric layer 302, a polysilicon layer 304, and an oxide or nitride hard mask 306, and other materials may also be used. In some embodiments, the dummy gates 310 are deposited as a blanket layer and then patterned. FIGS. 5A and 5B, as an example, four rows of dummy gates 310 (hard mask 306 is shown in top view in FIG. 5A) are formed across the fins 220. That is, the fins 220 go along a first direction and the dummy gates 310 go along a second direction. The first and second directions are substantially perpendicular to each other. The dummy gates 310 define the channel regions 220a of the fins 220. As shown in FIG. 5A, the dummy gates 310 at either ends of the fins 220 anchor the fins 220, and therefore the anchoring dummy gates 310 have a portion over the fins 220 and the remaining portion touches down to the isolation structures 204.

Figure 6A:
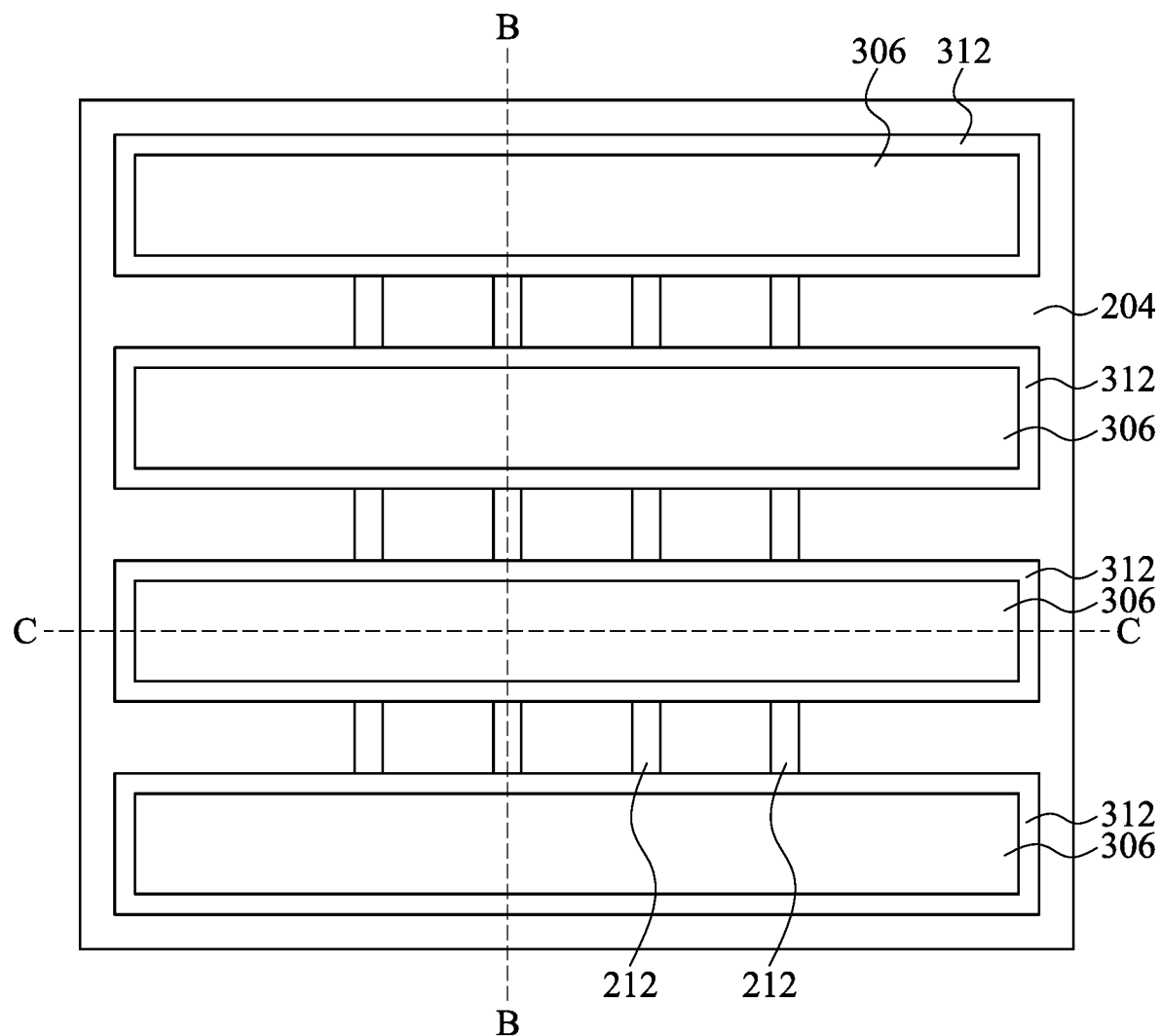
FIGS. 6A-6C illustrate a top view, a cross-sectional view along section BB, and a cross-sectional view along section C-C of the device of FIG. 6A, respectively, in a multi-stack nanowire FET device formation process in accordance with some embodiments of the instant disclosure.
Figure 6B:
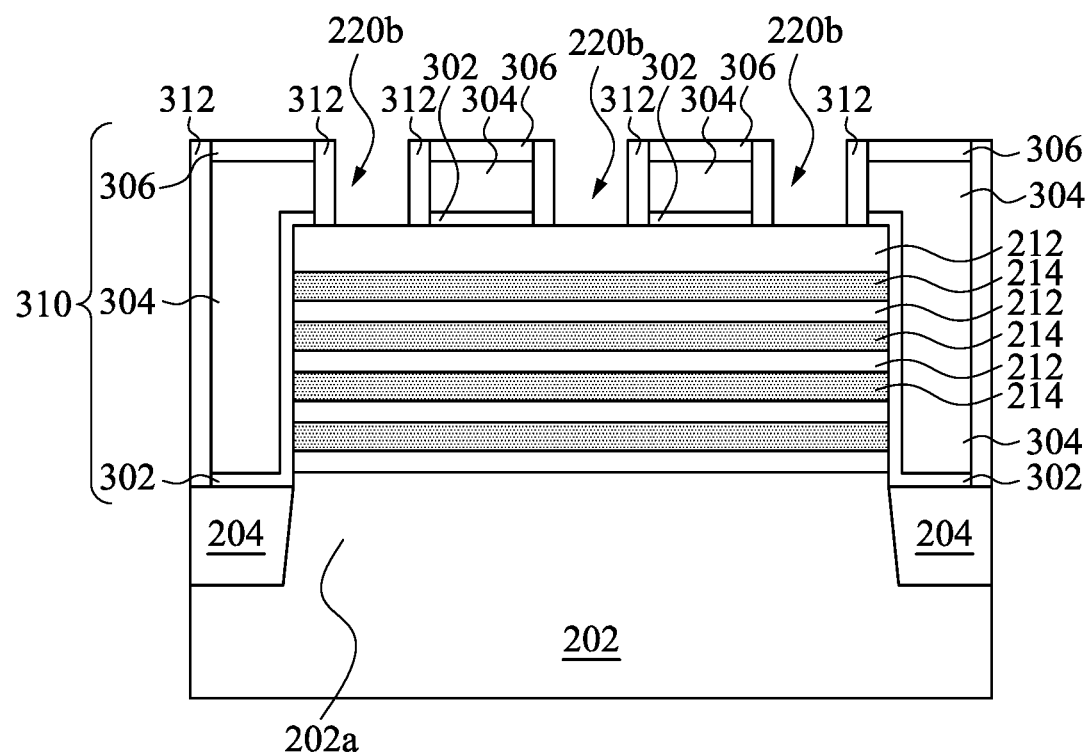
Figure 6C:
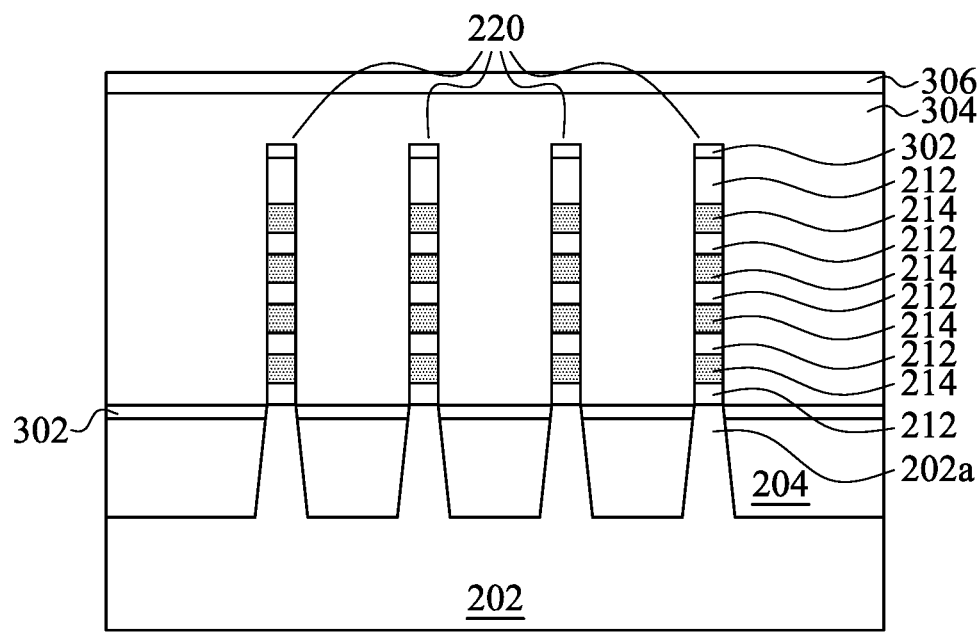

Reference is made to FIGS. 6A-6C. FIG. 6A is a top view of the structure 200. FIGS. 6B and 6C are cross-sectional views taken along section BB and CC in FIG. 6A respectively. After dummy gates 310 deposition, spacers 312 are formed on both sides of the dummy gates 310. The spacers 312 are formed by depositing an insulation layer (such as oxide or nitride) and then anisotropically etching from the surface. The etching process removes spacer layer from fin side walls. Spacers 312 are formed on the sides of the dummy gates 310, and spaces are left between the spacers 312 as shown in FIG. 6B. The spaces left between the spacers 312 define the source and drain regions 220b on the fins 220.

Still referring to FIGS. 6A-6C, the source and drain regions 220b of fins 220, which are between the spaces left between the spacers 312, are doped. The source and drain regions 220b of the fins 220 are doped by, for example, epi or plasma doping. N-type doping is used for the NFET devices in the fins 220, and p-type doping is used for the PFET devices in the fins 220. As shown in FIGS. 6A and 6B, the source and drain regions 220b of fins 220 are not covered by the dummy gates 310, and they are converted into the source and drain regions after doping. As shown in FIG. 6B, the dummy gates 310 are used as a mask where the channel regions 220a are located. For the sake of clarity, spacers 312 are not shown in FIG. 6C and the following cross-sectional views along section CC.

Figure 7A:
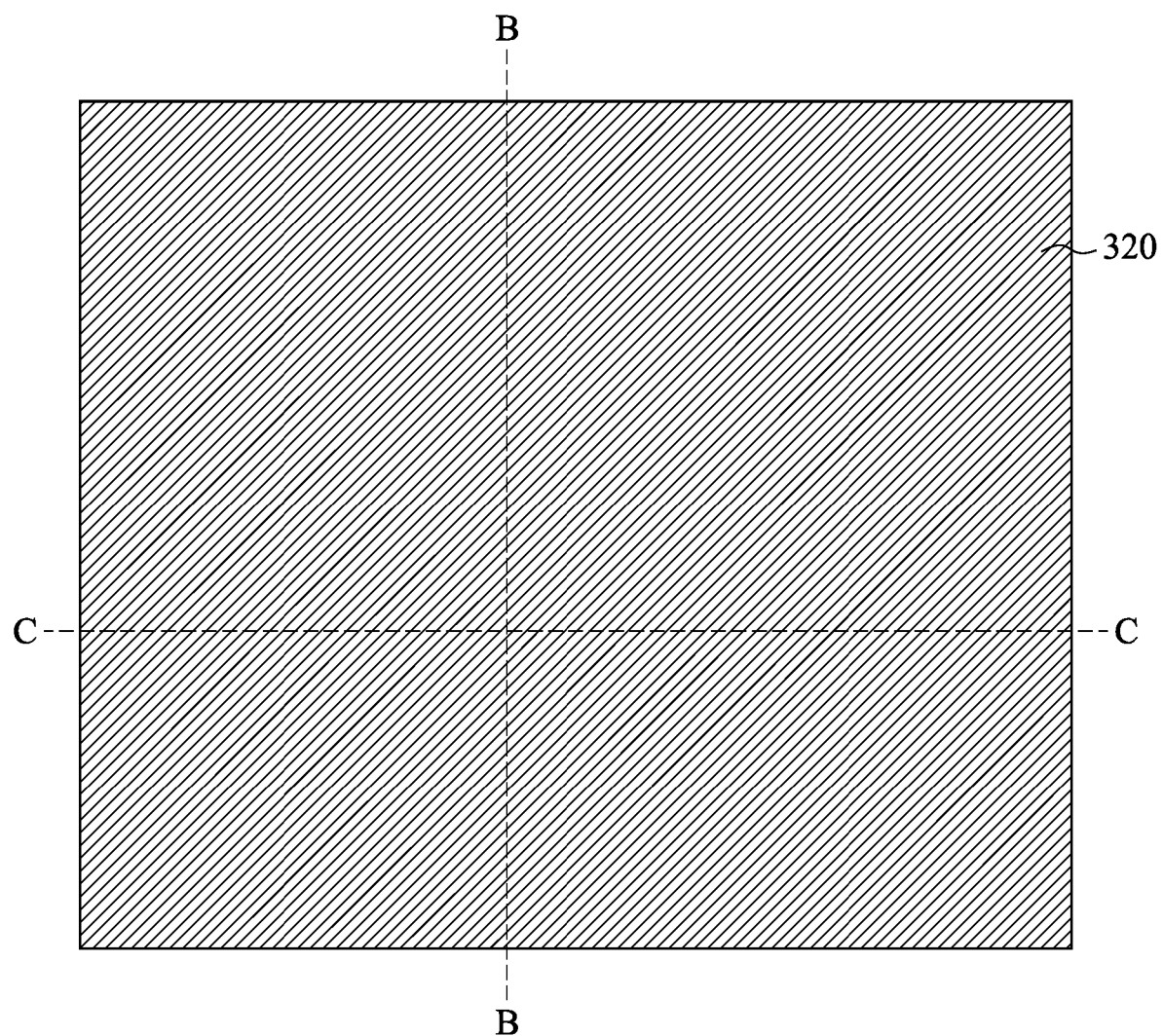
FIGS. 7A-7C illustrate a top view, a cross-sectional view along section BB, and a cross-sectional view along section C-C of the device of FIG. 7A, respectively, in a multi-stack nanowire FET device formation process in accordance with some embodiments of the instant disclosure.
Figure 7B:
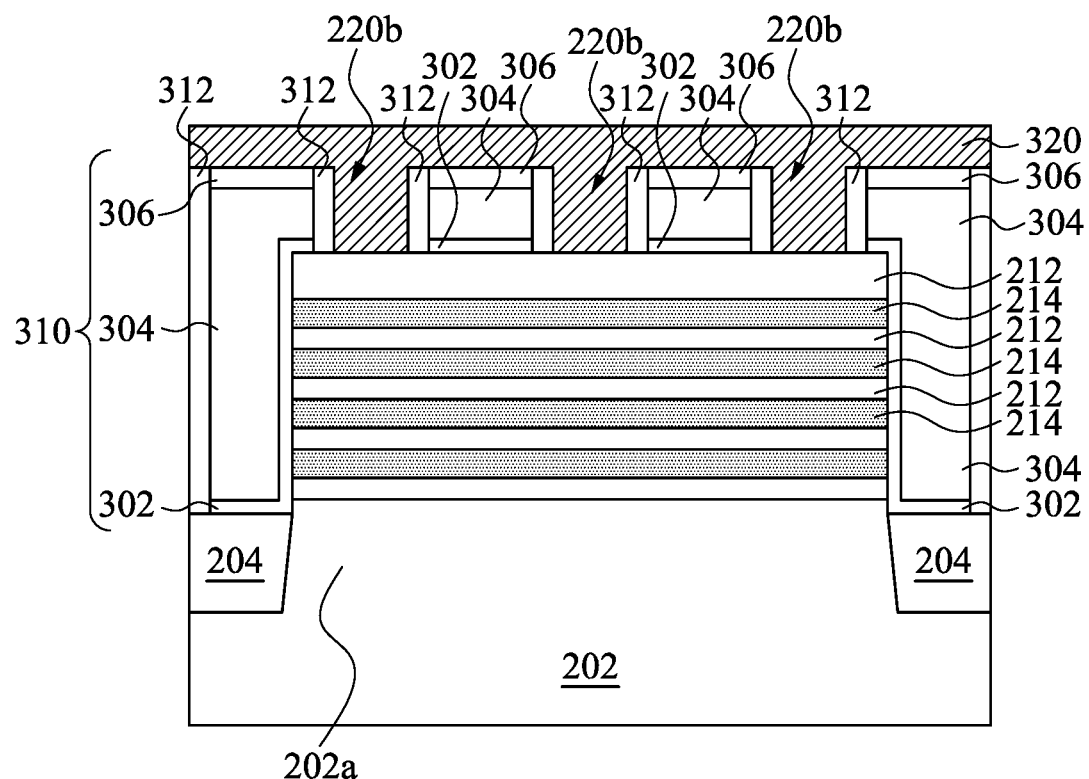
Figure 7C:
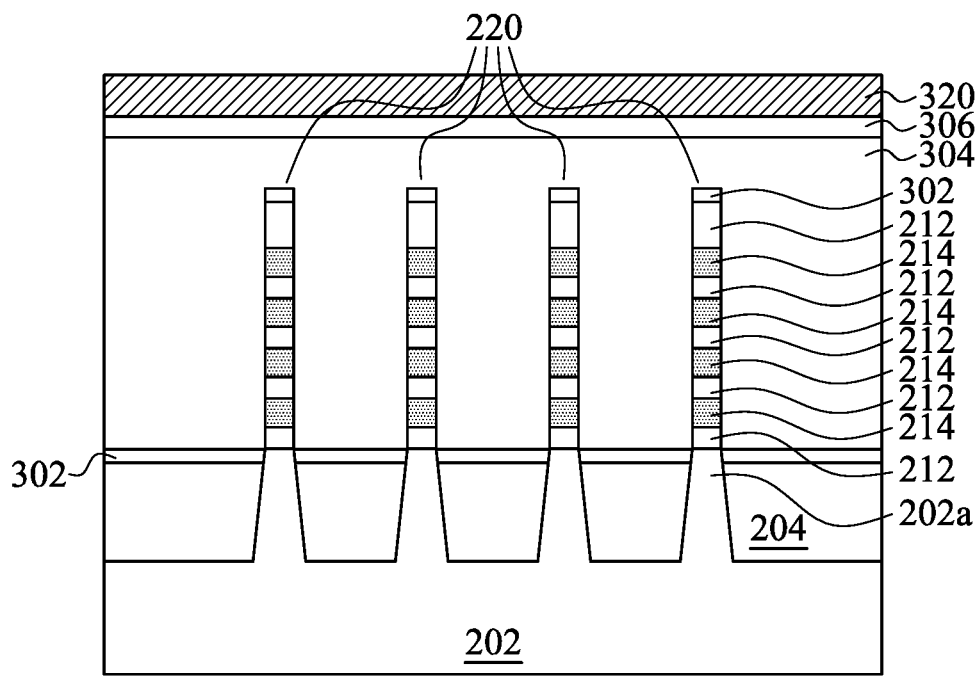

Reference is made to FIGS. 7A-7C. FIG. 7A is a top view of the structure 200. FIGS. 7B and 7C are cross-sectional views taken along section BB and CC in FIG. 7A respectively. A first interlayer dielectric layer 320 is deposited on the semiconductor substrate 202. The first interlayer dielectric layer 320 is blanket deposited on the semiconductor substrate 202 and fills in the spaces left between the spacers 312 on the fin side walls. The source and drain regions 220b of the fins 220 are then covered by the first interlayer dielectric layer 320. As shown in FIG. 7A, the first interlayer dielectric layer 320 covers up the spacers 312 and the dummy gates 310.

Figure 8A:
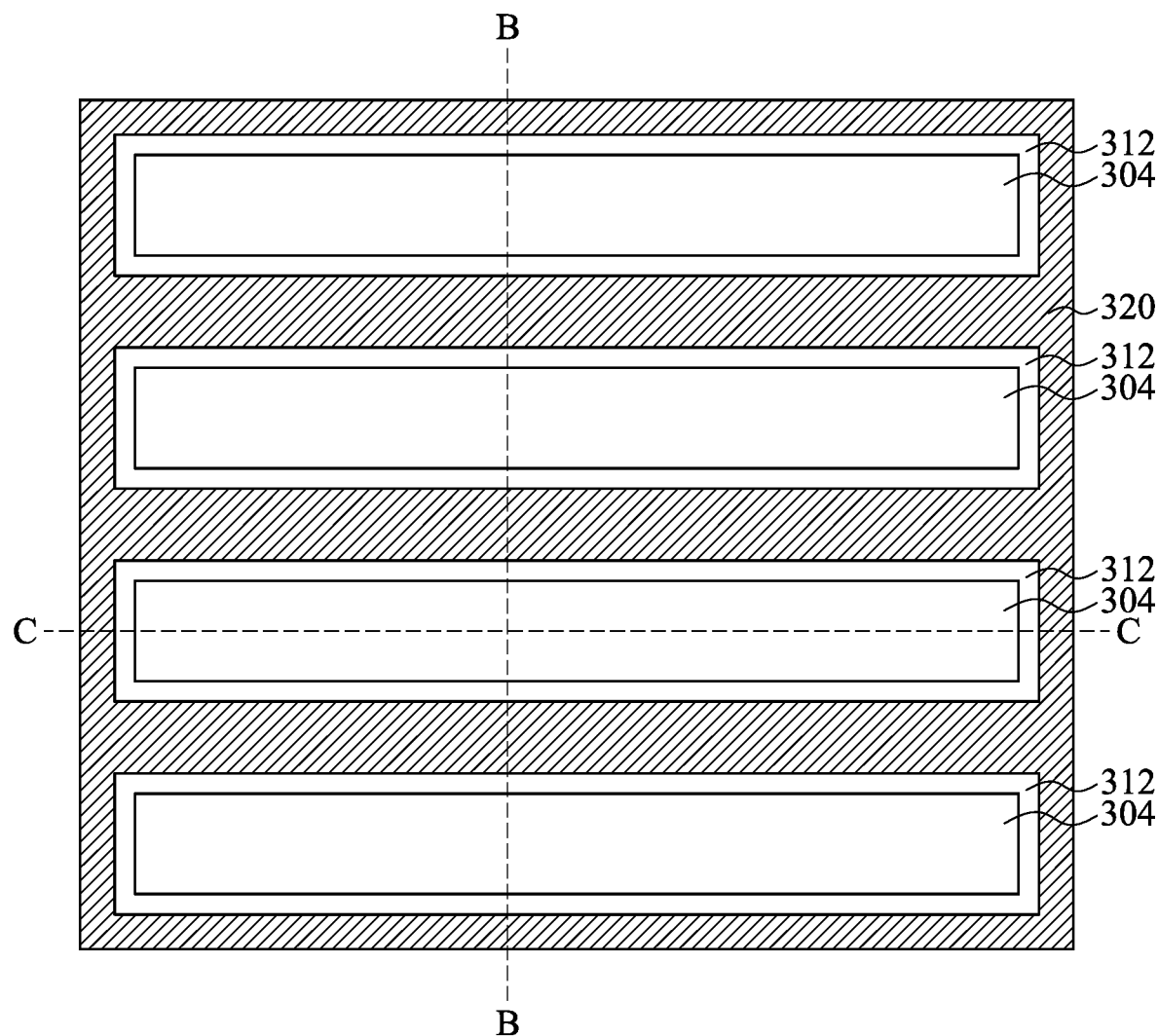
FIGS. 8A-8C illustrate a top view, a cross-sectional view along section BB, and a cross-sectional view along section C-C of the device of FIG. 8A, respectively, in a multi-stack nanowire FET device formation process in accordance with some embodiments of the instant disclosure.
Figure 8B:
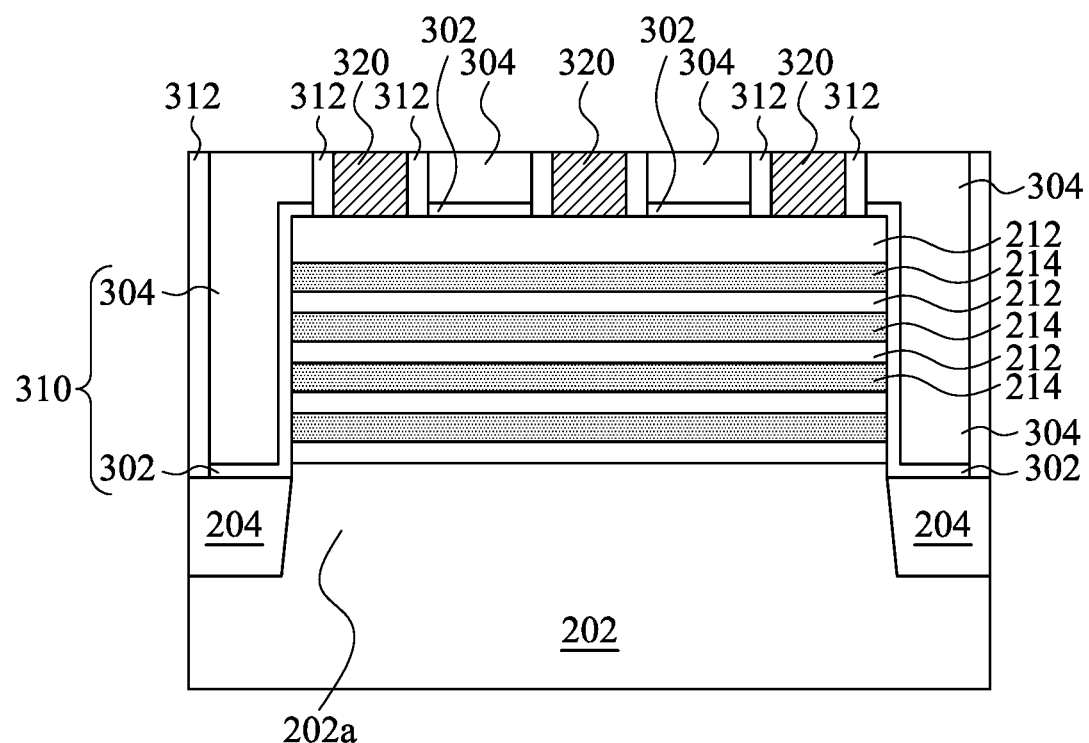
Figure 8C:
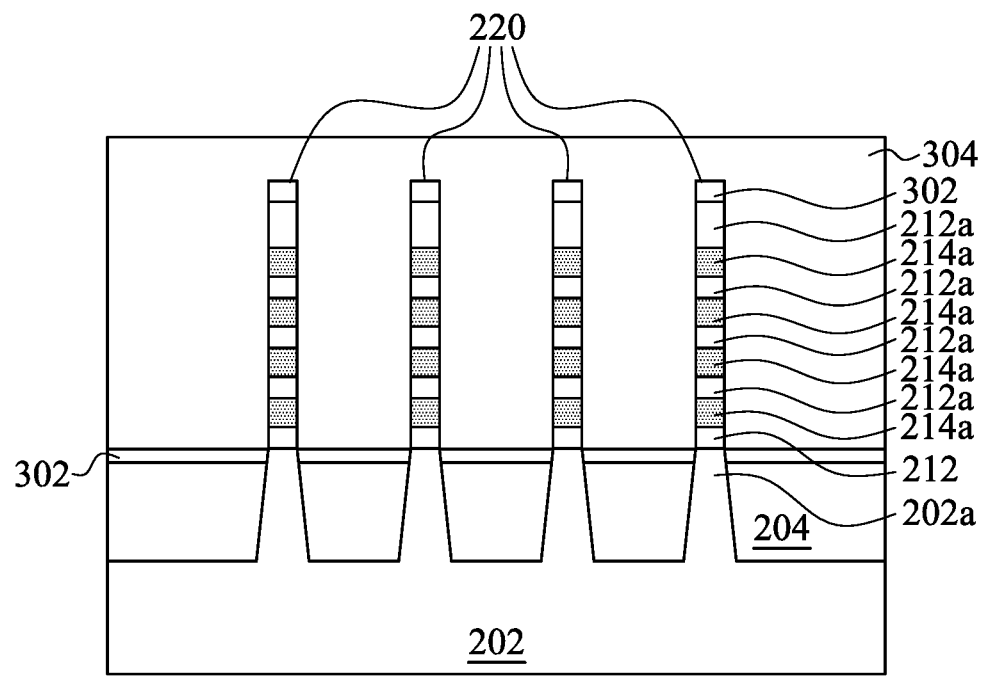

Reference is made to FIGS. 8A-8C. FIG. 8A is a top view of the structure 200. FIGS. 8B and 8C are cross-sectional views taken along section BB and CC in FIG. 8A respectively. A planarization process is performed to the semiconductor substrate 202. The planarization process may be chemical mechanical polishing or any other suitable process. Portions of the first interlayer dielectric layer 320 are removed. The first interlayer dielectric layer 320 between the spacers 312 on the fin side walls remains. As shown in FIG. 8B, in the planarization process, the hard masks 306 of the dummy gates 310 and portions of the spacers 312 are removed. On top of the source and drain regions 220b of the fins 220, a layer of the first interlayer dielectric layer 320 remains. As shown in FIG. 8C, the channel regions 220a are covered by the dielectric layer 302 and the polysilicon layer 304.

Figure 9A:
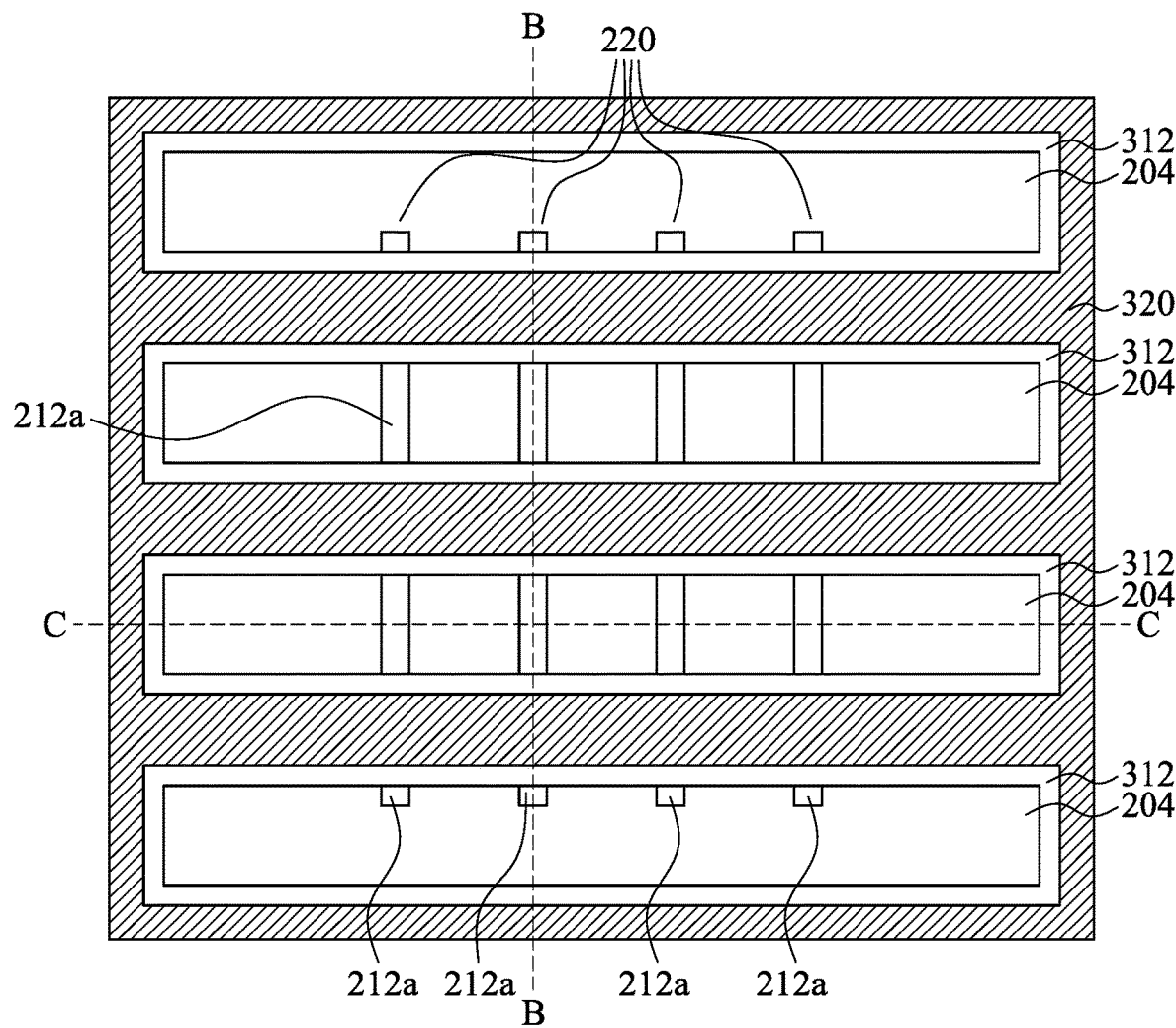
FIGS. 9A-9C illustrate a top view, a cross-sectional view along section BB, and a cross-sectional view along section C-C of the device of FIG. 9A, respectively, in a multi-stack nanowire FET device formation process in accordance with some embodiments of the instant disclosure.
Figure 9B:
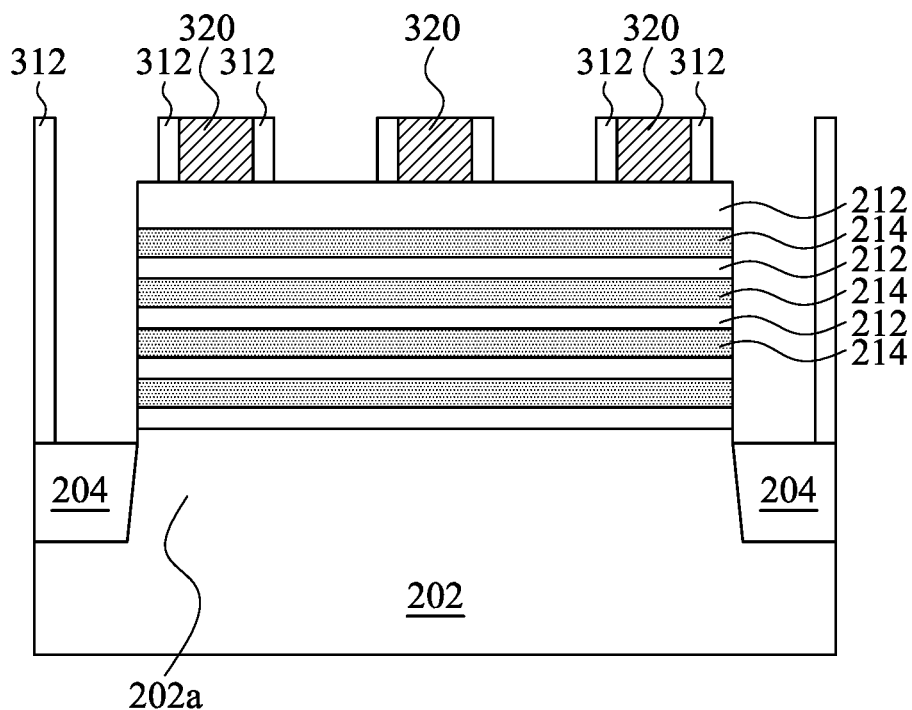
Figure 9C:
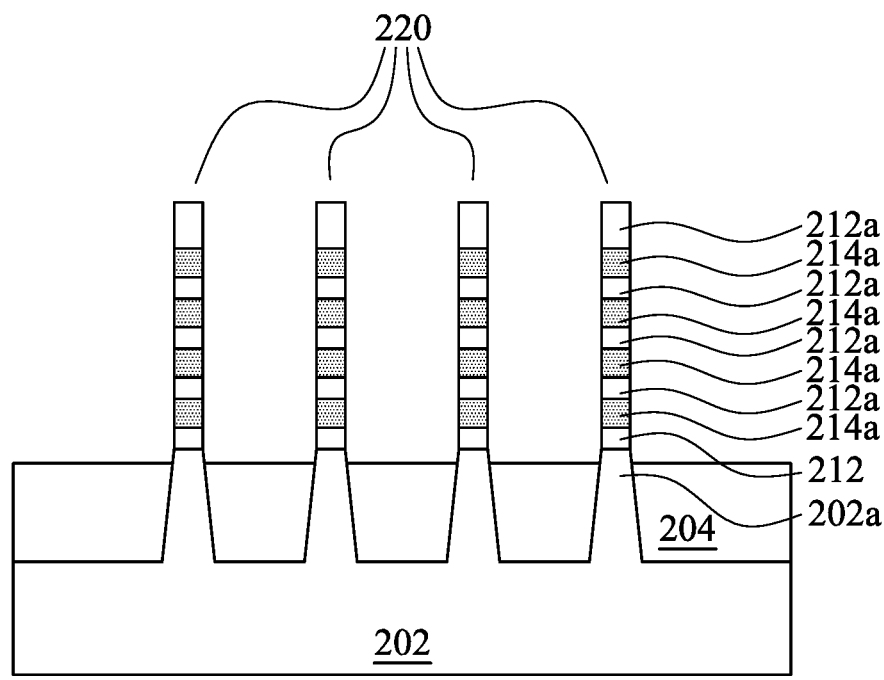

Reference is made to FIGS. 9A-9C. FIG. 9A is a top view of the structure 200. FIGS. 9B and 9C are cross-sectional views taken along section BB and CC in FIG. 9A respectively. After planarization, the dummy gates 310 are removed, but the spacers 312 remain. The polysilicon layer 304 and the dielectric layer 302 are removed by any suitable process, leaving spaces between the spacers 312. The channel regions 220a of the fins 220 are then exposed, while the source and drain regions 220b of the fins 220 are still under the coverage of the first interlayer dielectric layer 320.

Figure 10A:
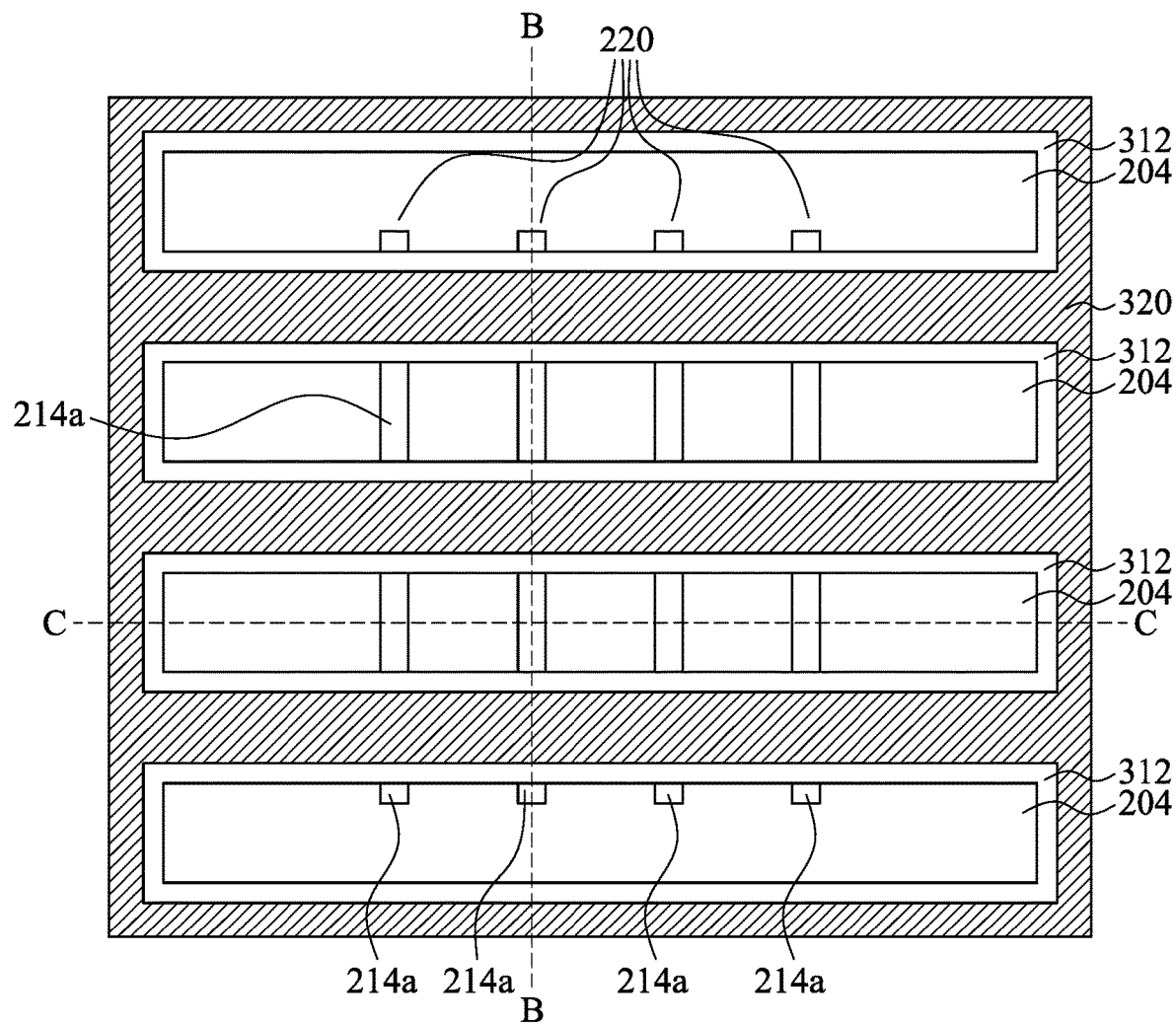
FIGS. 10A-10C illustrate a top view, a cross-sectional view along section BB, and a cross-sectional view along section C-C of the device of FIG. 10A, respectively, in a multi-stack nanowire FET device formation process in accordance with some embodiments of the instant disclosure.
Figure 10B:
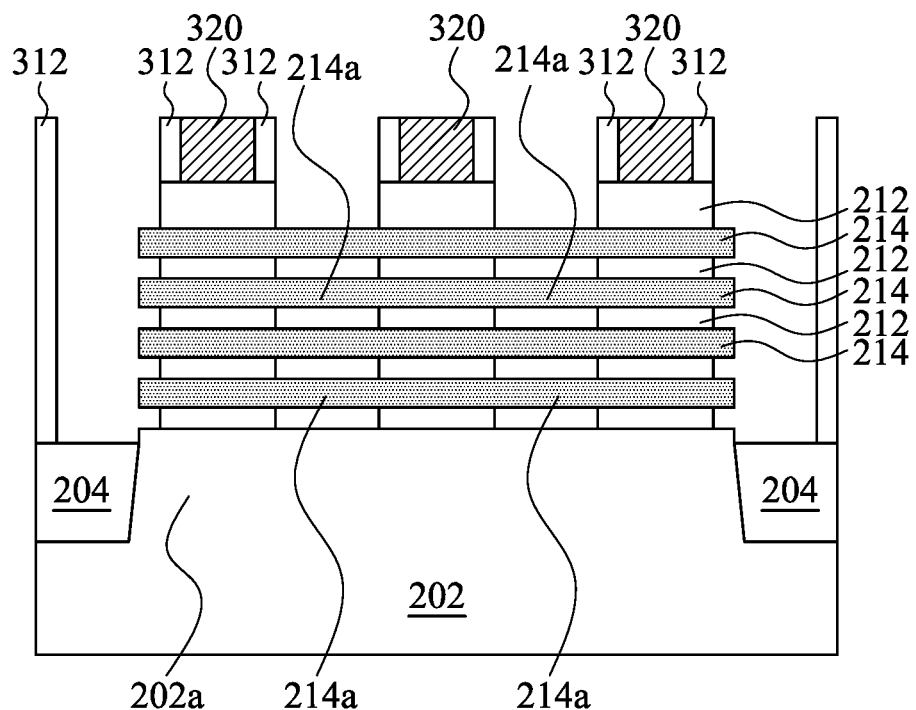
Figure 10C:
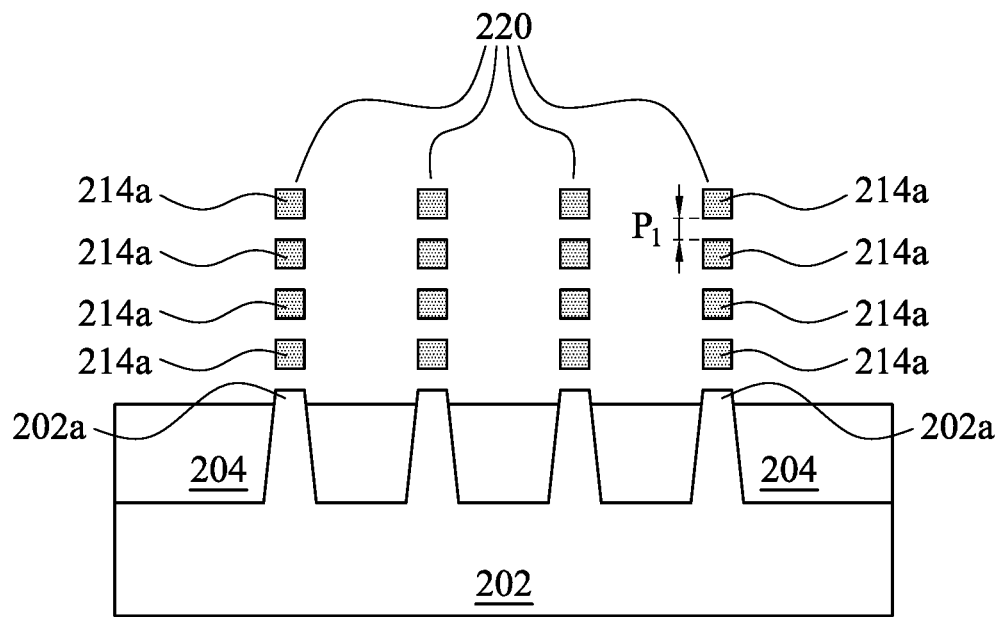

Reference is made to FIGS. 10A-10C and operation 130 of method 100 in FIG. 1. FIG. 10A is a top view of the structure 200. FIGS. 10B and 10C are cross-sectional views taken along section BB and CC in FIG. 10A respectively. After removal of the dummy gates 310, first portions 212a of the sacrificial layers 212 are removed. The first portions 212a of the sacrificial layer correspond to the channel regions 220a of the fins 220. As shown in FIG. 10A, the first portion 212a of the top sacrificial layer 212 is removed, leaving the underlying nanowire 214 exposed. The sacrificial layers 212 between the nanowires 214 are also removed. Attention is invited to FIG. 10B. The sacrificial layers 212 under the coverage of the first interlayer dielectric layer 320 remain in place. On the other hand, the second portions 212b of the sacrificial layer 212, which are under the spacers 312 and first interlayer dielectric layers 320 remains. The first portions 214a of the nanowires 214 are released from the fins 220 and spaced apart from each other. The first portions 214a of the nanowires 214 are not flanked by the sacrificial layer 212 anymore.

Attention is invited to FIG. 10C. After the removal of the first portions 212a of the sacrificial layers 212, spaces are left between the nanowires 214. The pitch $P_1$ between the nanowires 214 are determined by the thickness of the sacrificial layer 212. The first portions 214a of the nanowires 214 suspend over one another without making contact. The pitch $P_1$ between the nanowires 214 reflects where the first portions 212a of the sacrificial layers 212 use to stand. For example, if the sacrificial layer 212 has a thickness of 8 nm, after the removal of the first portions 212a of the sacrificial layers 212, the pitch $P_1$ is measured of 8 nm. The pitch $P_1$ has pivotal effect in the nanowire 214 configuration at the channel regions 220a. The relationship between the pitch $P_1$ and nanowire 214 configuration will be elaborated hereinafter.

Figure 11A:
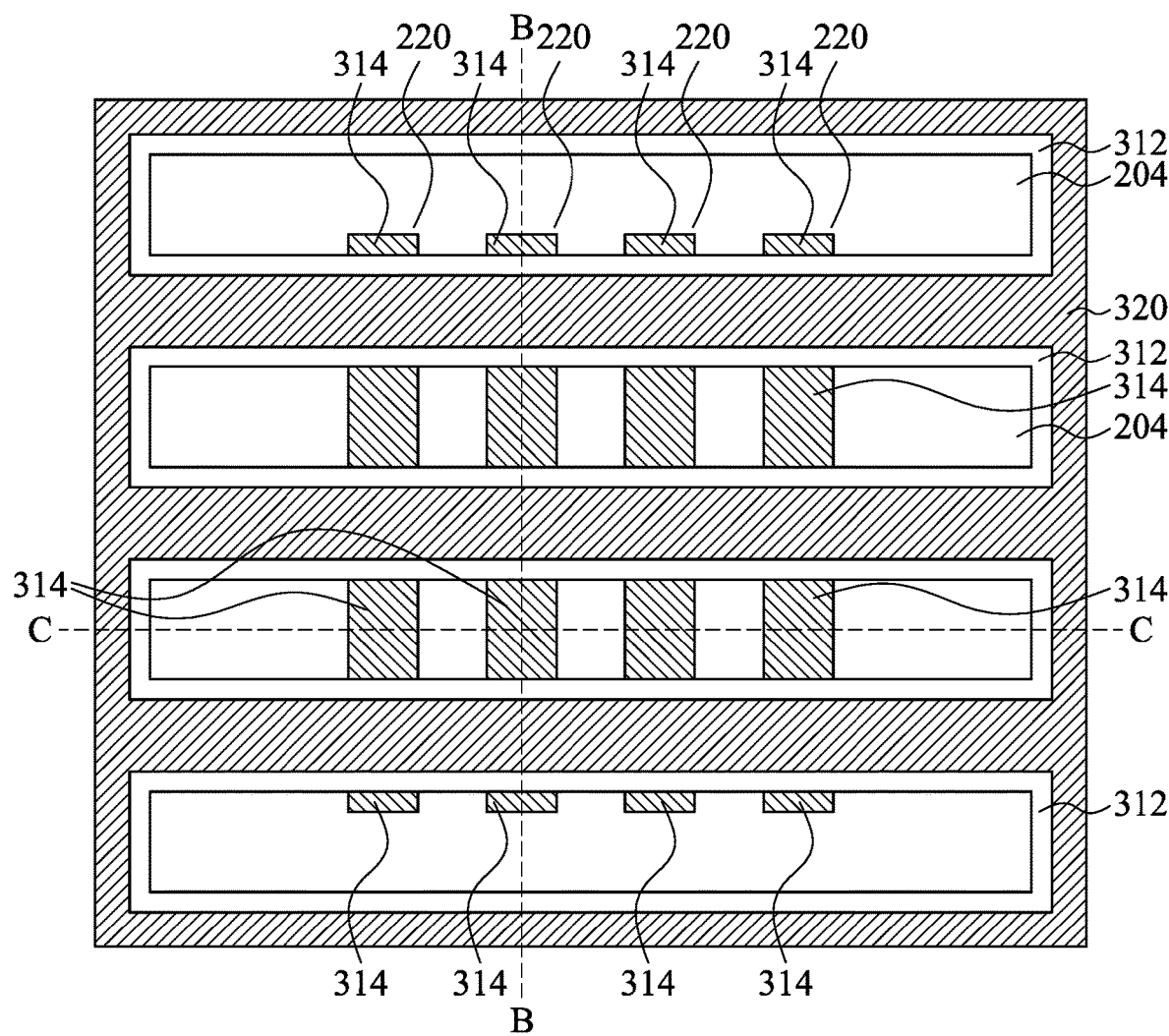
FIGS. 11A-11C illustrate a top view, a cross-sectional view along section BB, and a cross-sectional view along section C-C of the device of FIG. 11A, respectively, in a multi-stack nanowire FET device formation process in accordance with some embodiments of the instant disclosure.
Figure 11B:
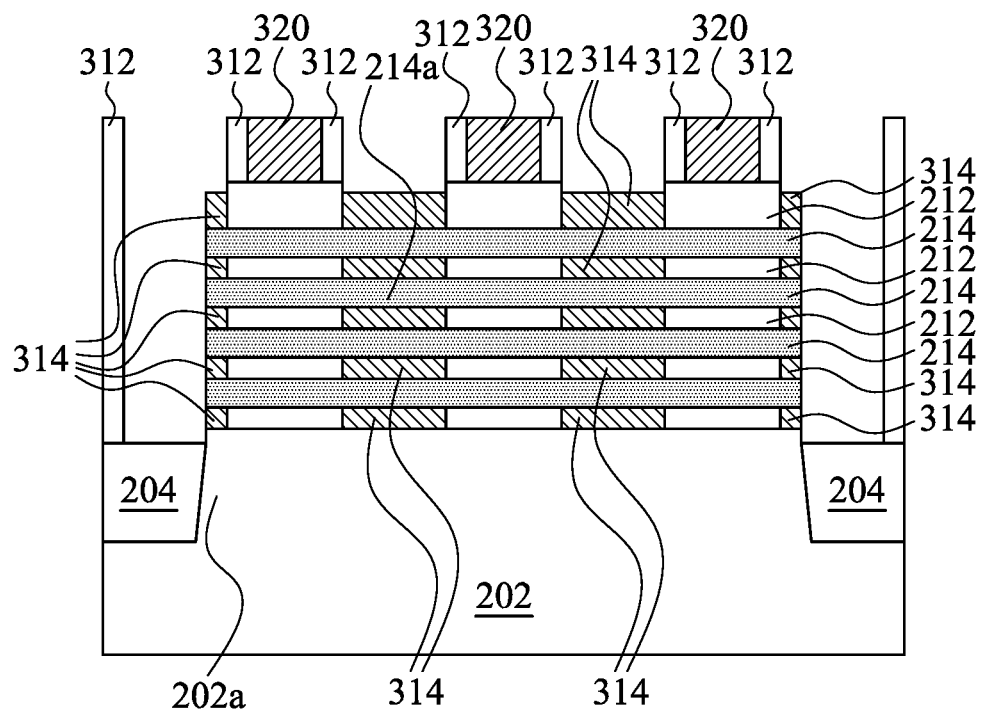
Figure 11C:
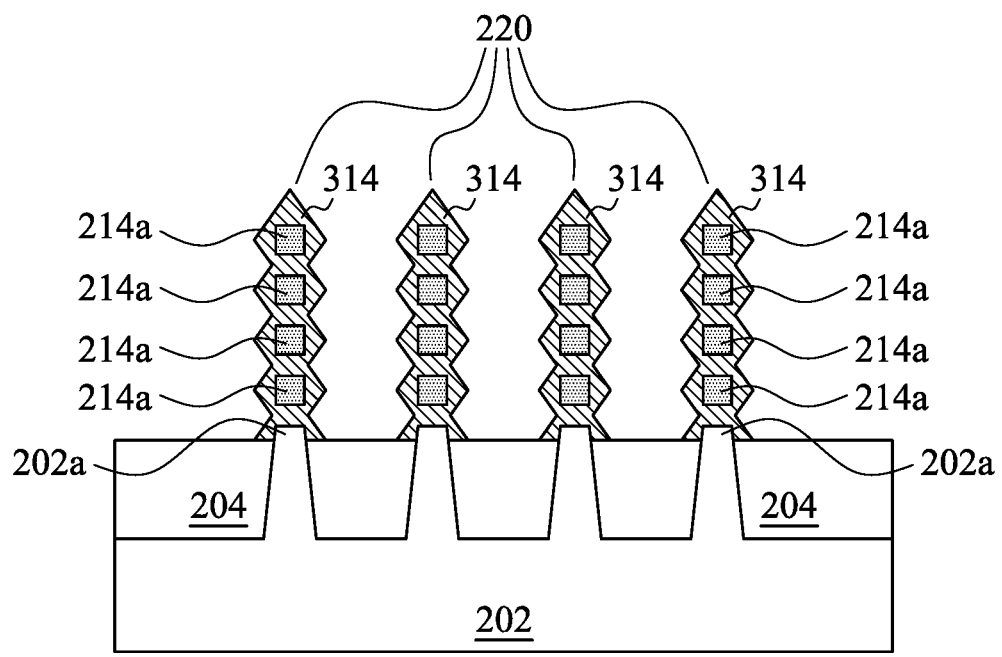

Reference is made to FIGS. 11A-11C and operation 140 of FIG. 1. FIG. 11A is a top view of the structure 200. FIGS. 11B and 11C are cross-sectional views taken along section BB and CC in FIG. 11A respectively. An epitaxial layer 314 is formed on the first portions 214a of the nanowires 214. The epitaxial layer 314 is epitaxially grown on the first portions 214a of the nanowires 214. The epitaxial layer 314 may include the same material as the nanowires 214 or a different material from the nanowires 214. The epitaxial layer 314 may include for example Si, SiGe, Ge, GaAs, InAs, InSb, and GaSb. As shown in FIG. 11C, the nanowires 214 provide <100> and <110> sidewalk for the epitaxial growth. The epitaxial layer 314 expands toward the <111> plane. The <111> plane shows higher electron mobility in comparison with the <110> and <100> plane. Unlike conventional rounded or square nanowire, the epitaxial layer-wrapped nanowires 214 has zig-zag contour projecting in <111> plane direction.

In addition to the <111> plane projection of the nanowires 214, in some embodiments, the pitch $P_1$ between the nanowires 214 is smaller, and therefore the epitaxial layer 314 merges during the epitaxial growth as shown in FIG. 11C. The separated first portions 214a of the nanowires 214 join again by the epitaxial layer 314. The epitaxial layer 314 occupies the spaces left by the first portions 212a of the sacrificial layers 212 and becomes <111> plane extension of the first portions 214a of the nanowires 214. In the epitaxial growth, the epitaxial layer 314 wraps around individual nanowires 214 and then stretches further from the nanowire core to merge with the neighbouring epitaxial layer 314. The first portions 214a of the nanowires 214 are then spaced apart by the epitaxial layer 314. The first portions 214a of the nanowires are still in one singular cluster under the zig-zag overcoat of the epitaxial layer 314. The channel regions 220a (first portions 214a of the nanowires 214) are in a collective coat of the epitaxial layer 314 as shown in FIG. 11C.

Figure 12A:
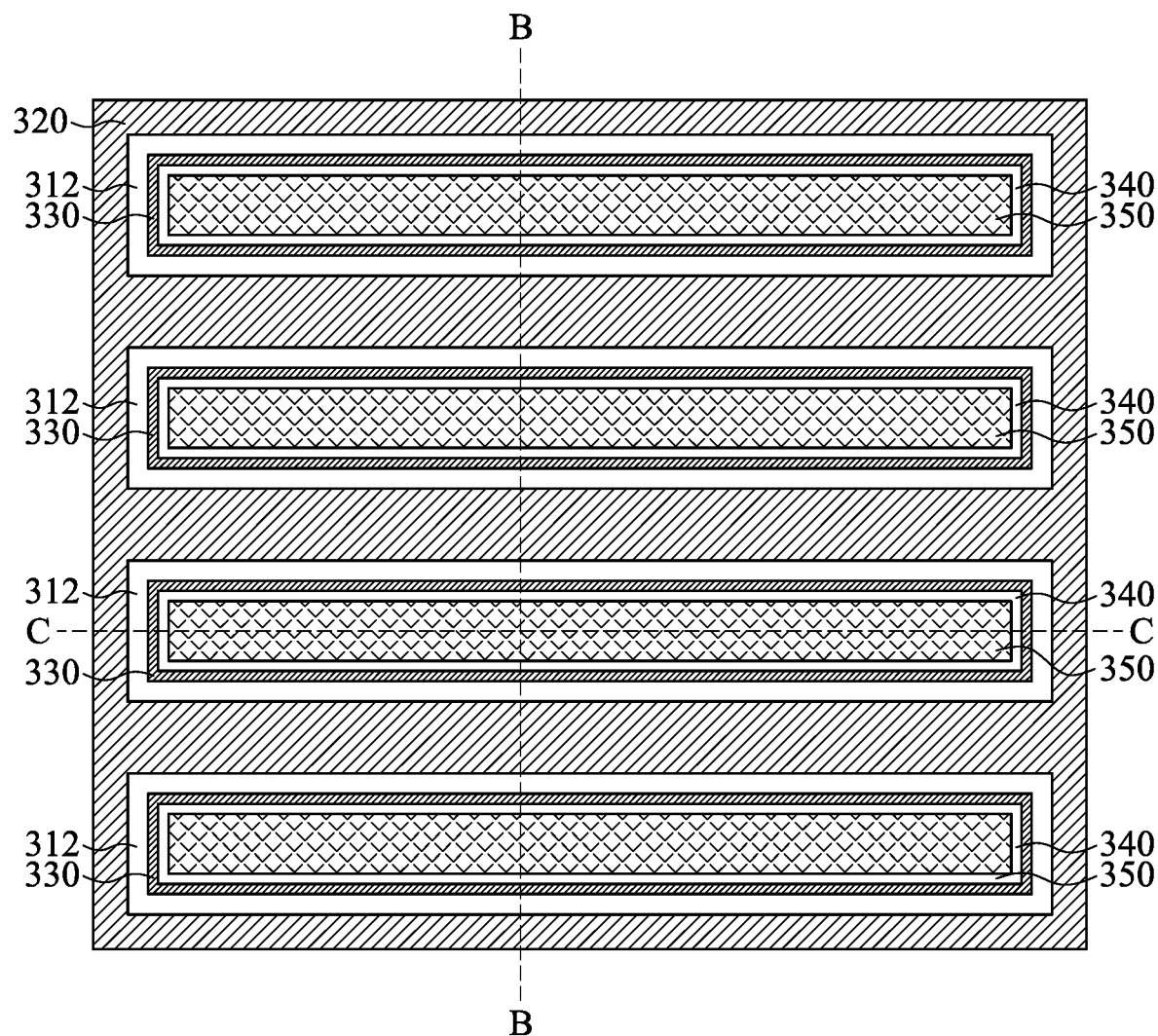
FIGS. 12A-12C illustrate a top view, a cross-sectional view along section BB, and a cross-sectional view along section C-C of the device of FIG. 12A, respectively, in a multi-stack nanowire FET device formation process in accordance with some embodiments of the instant disclosure.
Figure 12B:
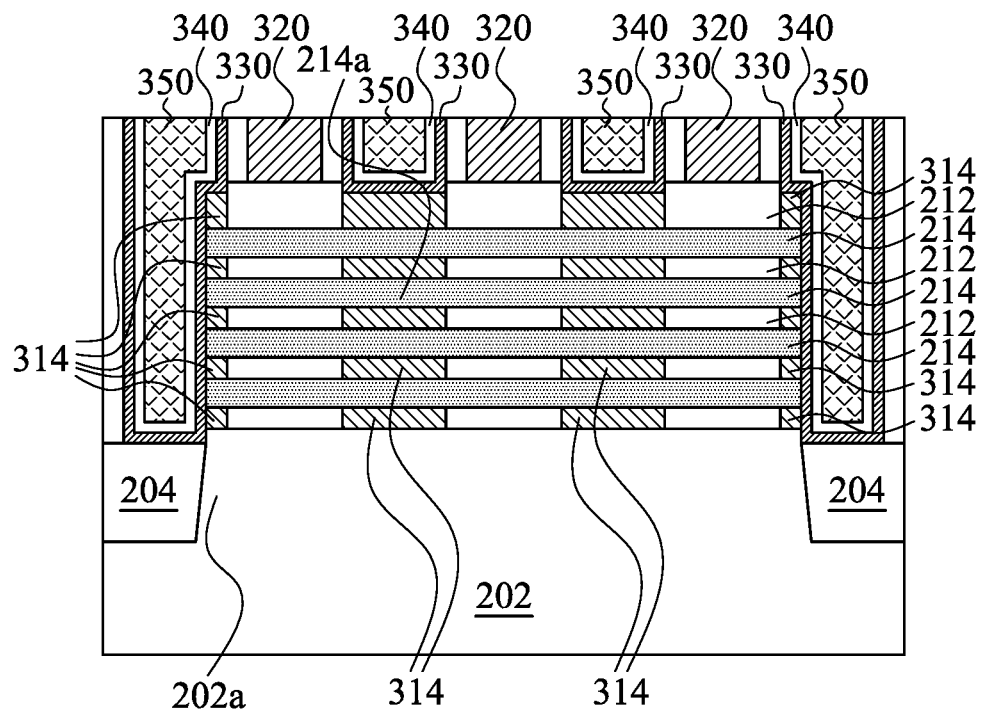
Figure 12C:
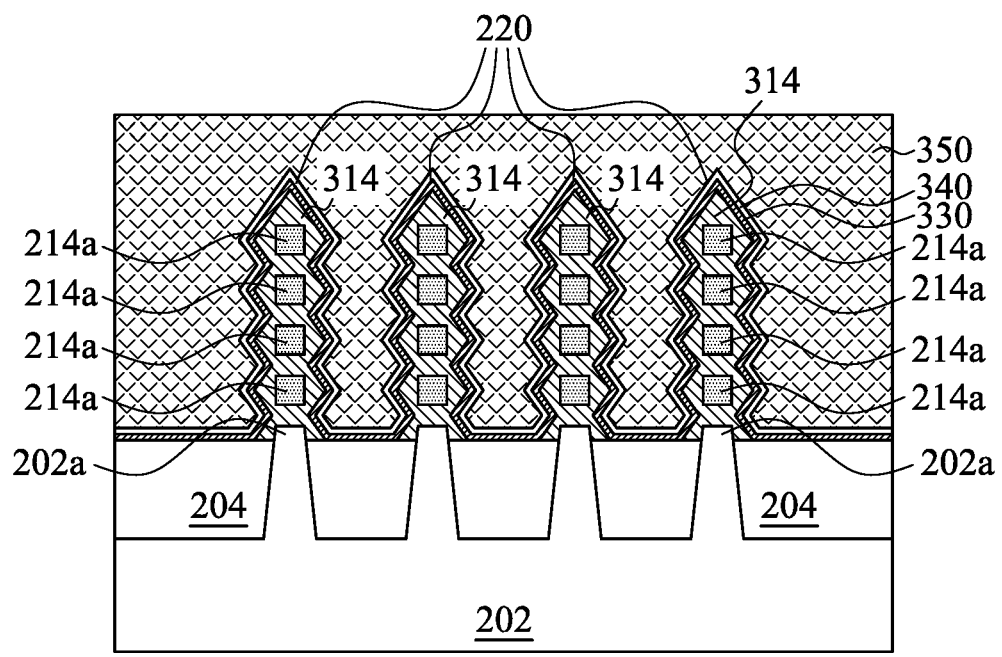

Reference is made to FIGS. 12A-12C and operation 150 of method 100 in FIG. 1. FIG. 12A is a top view of the structure 200. FIGS. 12B and 12C are cross-sectional views taken along section BB and CC in FIG. 12A respectively. A high-k gate dielectric layer 330 is formed on the first portions 214a of the nanowires 214. The high-k gate dielectric layer 330 is a thin layer formed on the exposed surfaces including the sidewalls of the spacers 312 and first portions 214a of the nanowires 214. The high-k gate dielectric layer 330 includes a material such as $HfO_2$, $ZrO_2$, $HfZrO_2$, $Ga_2O_3$, $Gd_2O_3$, $TaSiO_2$, $Al_2O_3$, or $TiO_2$. The high-k gate dielectric layer 330 may include more than one layer. As shown in FIG. 12C, the high-k gate dielectric layer 330 goes along the zig-zag contour created by the epitaxial layer 314. The zig-zag contour of the epitaxial layer 314 is therefore translated to the high-k gate dielectric layer 330. The surface of the isolation structures 204 and the protruded portions 202a of the semiconductor substrate 202 are also covered by the high-k gate dielectric layer 330.

Reference is still made to FIGS. 12A-12C and operation 150 of method 100 in FIG. 1. A work function metal layer 340 and a gate electrode 350 are formed. The work function metal layer 340 may include materials such as TiN, W, WN, Mo, MoN, TiAl, TiAlC, or TaAlC depending on P-type or N-type gate structure. The gate electrode 350 may include material such as Al, W, Co, or Cu. As shown in FIG. 12B, the work function metal layer 340 follows the route of the high-k gate dielectric layer 330 and crawls along the peaks and valleys created by the epitaxial layer 314. Subsequently, as shown in FIG. 12C, the gate electrode 350 fills up the spaces surrounding the nanowires, thereby completely sealing around the first portions 214a of the nanowires 214. The gate electrode 350 replaces the dummy gates 310. It is understood the first portions 214a of the nanowires 214 corresponds to the channel regions 220a of the fins 220.

Figure 13A:
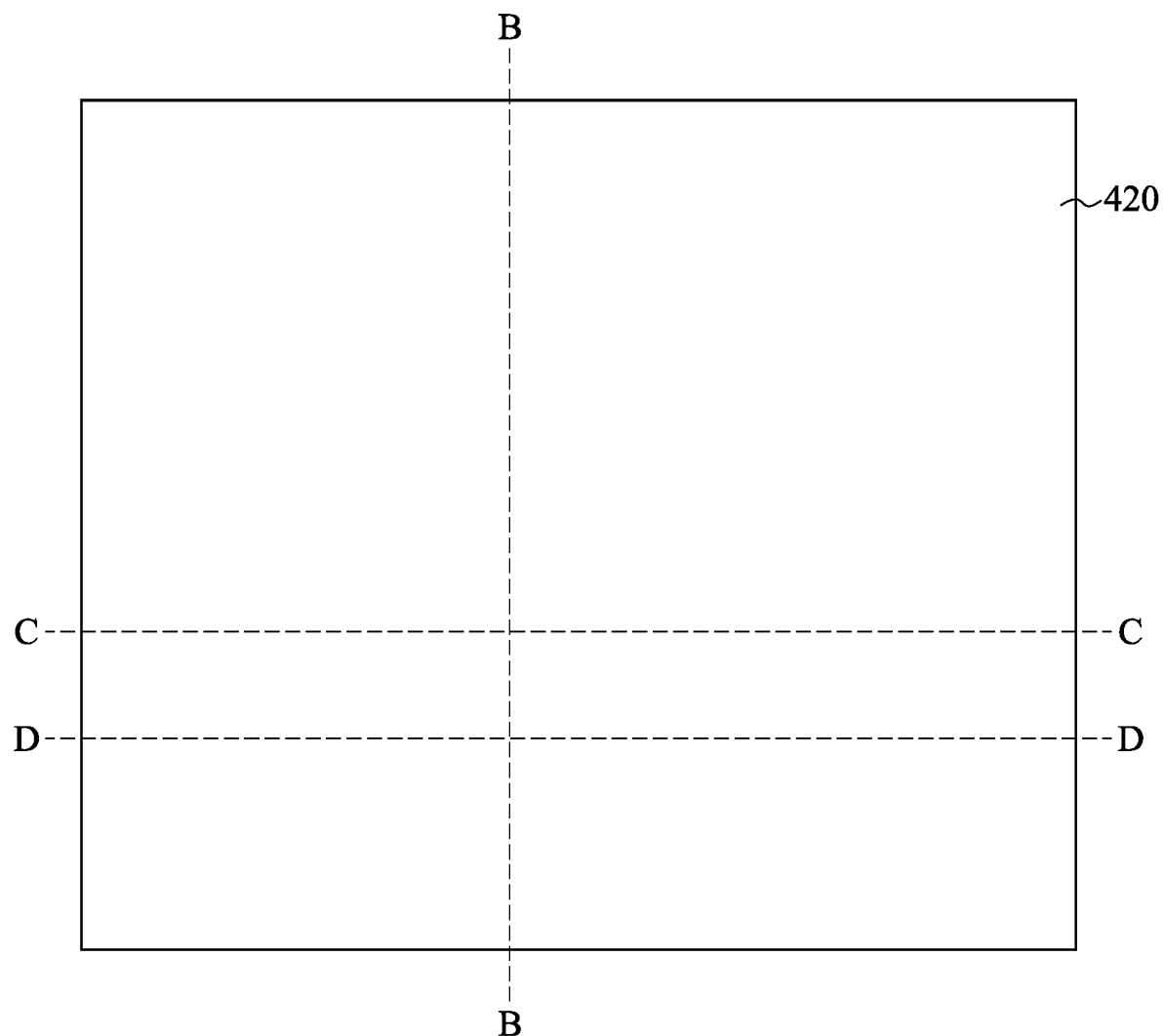
FIGS. 13A-13D illustrate a top view, a cross-sectional view along section BB, a cross-sectional view along section CC, and a cross-sectional view along section DD of the device of FIG. 13A, respectively, in a multi-stack nanowire FET device formation process in accordance with some embodiments of the instant disclosure.
Figure 13B:
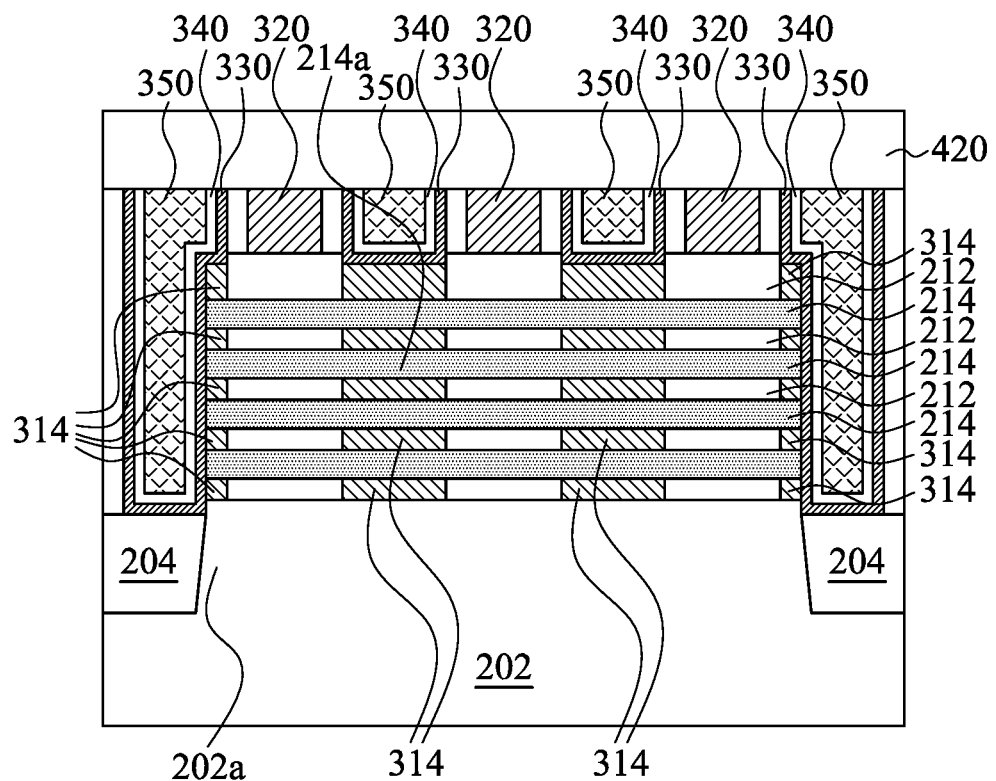
Figure 13C:
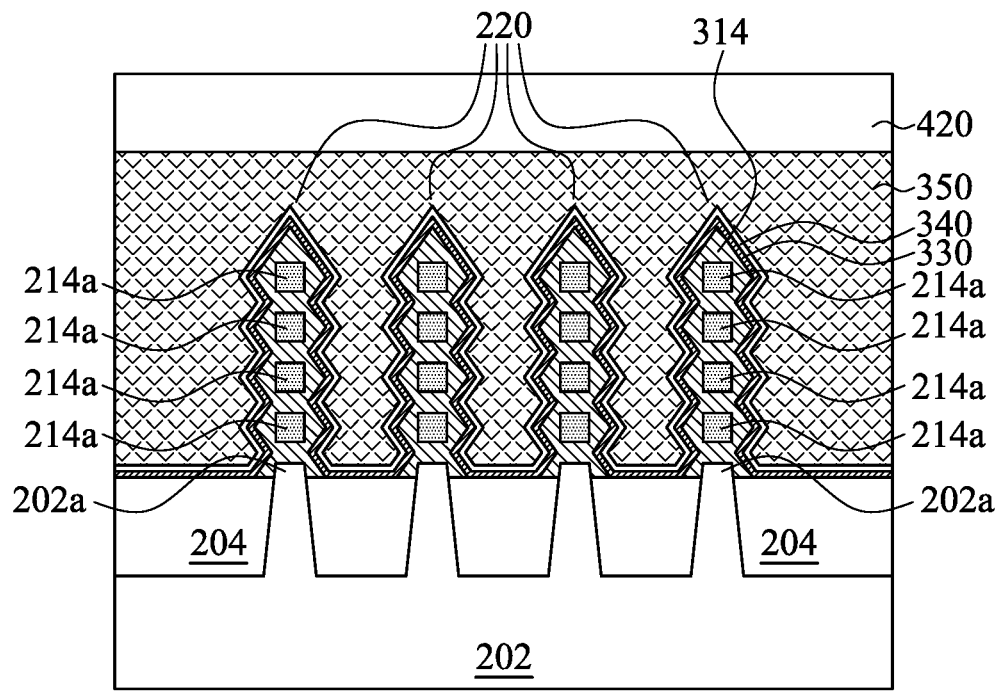
Figure 13D:
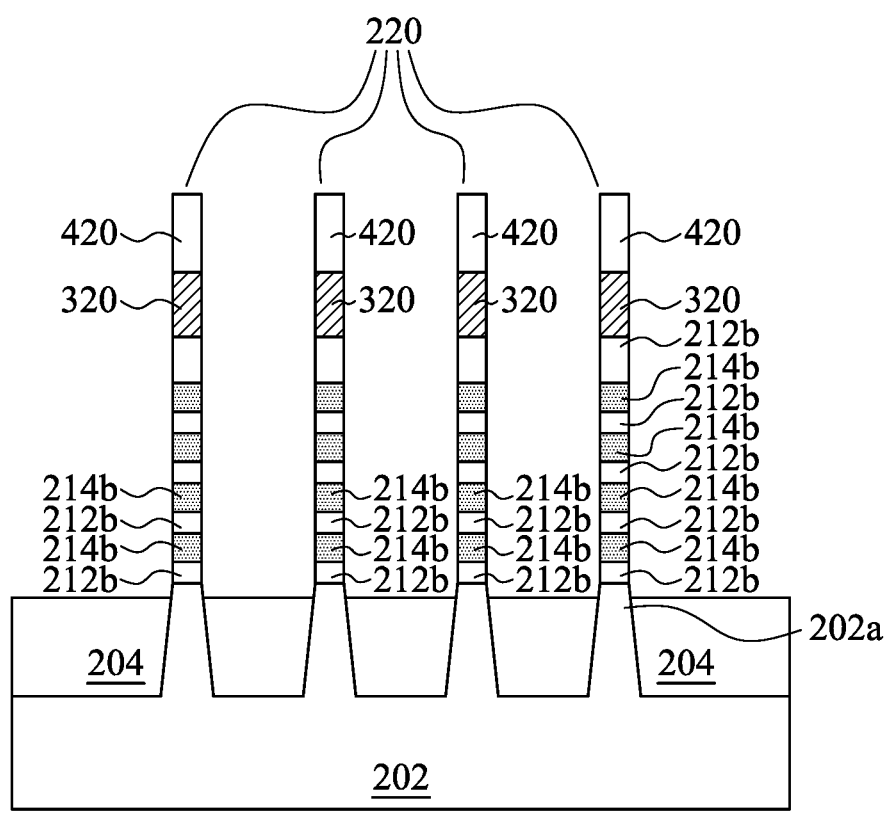

Reference is made to FIGS. 13A-13D. FIG. 13A is a top view of the structure 200. FIGS. 13B, 13C and 13D are cross-sectional views taken along section BB, CC and DD in FIG. 13A respectively. A second interlayer dielectric layer 420 is deposited on the semiconductor substrate 202. The second interlayer dielectric layer 420 is blanket deposition on the semiconductor substrate 202. As shown in FIG. 13B, the fins 220, spacers 312, first interlayer dielectric layer 320 and gate electrode 350 are all covered up by the second interlayer dielectric layer 420. The channel regions 220a (first portions 214a of the nanowires 214) are under the second interlayer dielectric layer 420 protection as shown in FIG. 13C. On top of the source and drain regions 220b of the fins 220 are the first interlayer dielectric layer 320 and the second interlayer dielectric layer 420 as shown in FIG. 13D.

Figure 14A:
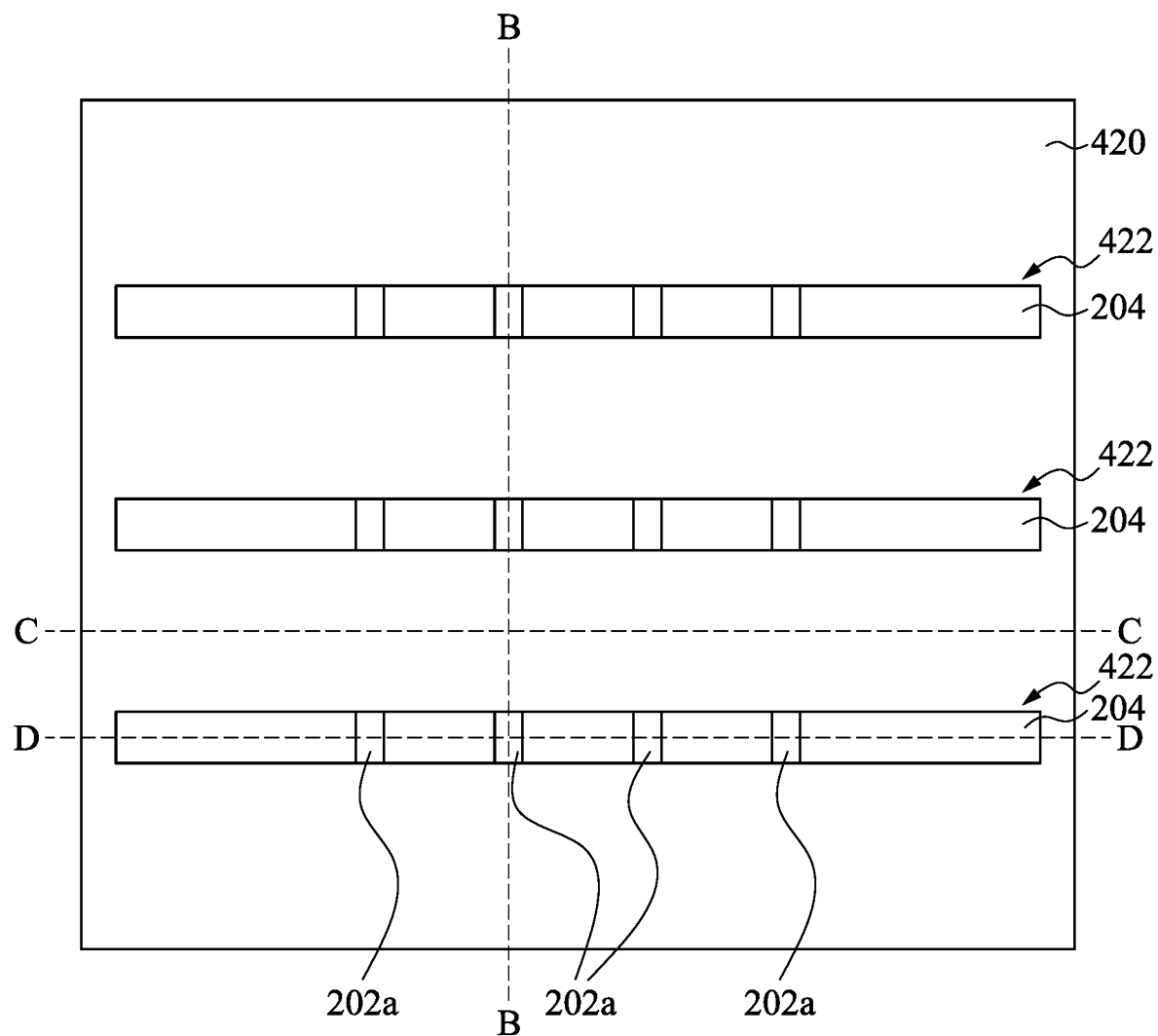
FIGS. 14A-14D illustrate a top view, a cross-sectional view along section BB, a cross-sectional view along section CC, and a cross-sectional view along section DD of the device of FIG. 14A, respectively, in a multi-stack nanowire FET device formation process in accordance with some embodiments of the instant disclosure.
Figure 14B:
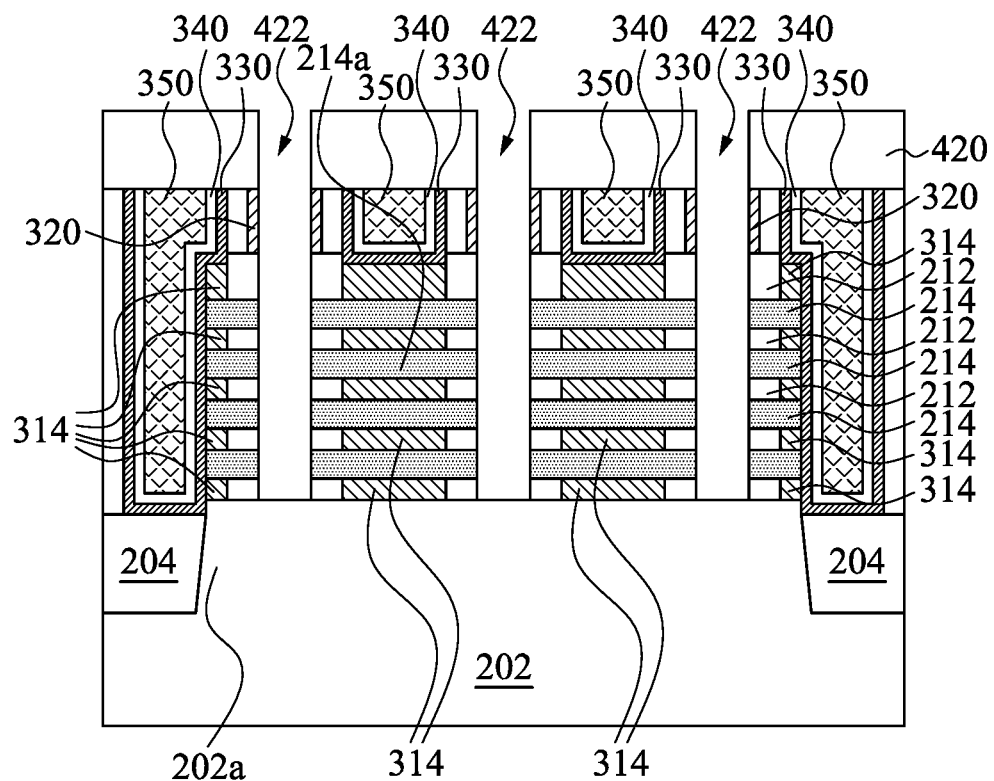
Figure 14C:
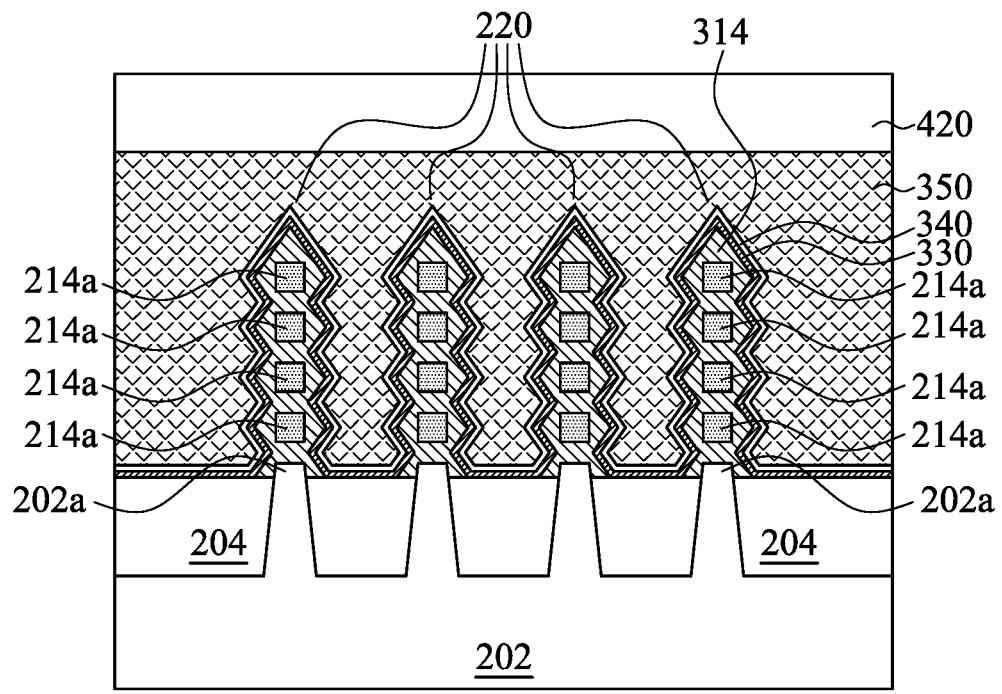
Figure 14D:
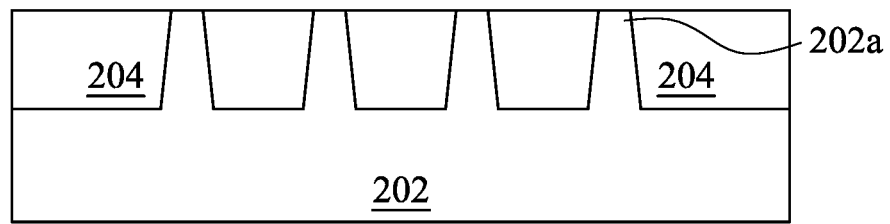

Reference is made to FIGS. 14A-14D. FIG. 14A is a top view of the structure 200. FIGS. 14B, 14C and 14D are cross-sectional views taken along section BB, CC and DD in FIG. 14A respectively. Contact openings 422 are formed in the second interlayer dielectric layer 420. The contact openings 422 are in parallel with the gate structures (i.e., perpendicular to the fins 220) and do not overlap the gate structure and channel regions 220a of the fins 220 (i.e., the first portions 214a of the nanowires 214). An etch process may be performed, and firstly portions of the second interlayer dielectric layer 420 and the first interlayer dielectric layer 320 are removed. The etching process goes further down and removes the second portions 212b of the sacrificial layer 212 and the second portions 214b of the nanowires 214. The second portions 212b and 214b of the sacrificial layer 212 and nanowire 214 respectively are removed to yield source and drain regions. Spaces in strips are formed as shown in FIG. 14A. In some embodiments, the contact openings 422 fall between the spacers 312 and are slightly spaced apart from the spacers 312 by the first interlayer dielectric layer 320 as shown in FIG. 14B. Portions of the first interlayer dielectric layer 320 remain on the fins 220. As shown in FIGS. 14A, 14B and 14D, the contact openings 422 define the source and drain regions 220b of the fins 220. The channel regions 220a of the fins 220 (i.e., first portions 214a of the nanowires 214) are under the protection of the second interlayer dielectric layer 420 as shown in FIG. 14C.

Figure 15A:
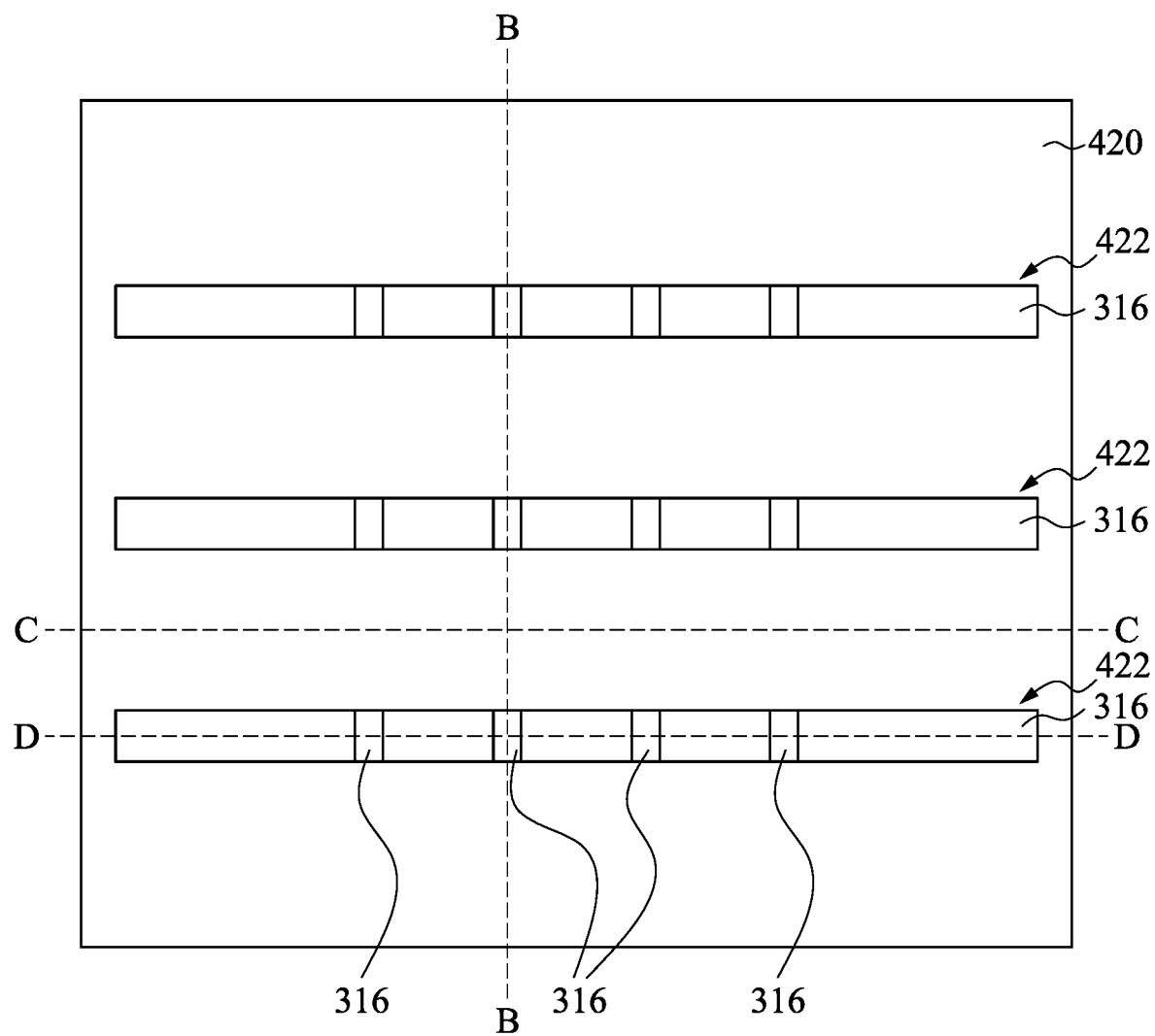
FIGS. 15A-15D illustrate a top view, a cross-sectional view along section BB, a cross-sectional view along section CC, and a cross-sectional view along section DD of the device of FIG. 15A, respectively, in a multi-stack nanowire FET device formation process in accordance with some embodiments of the instant disclosure.
Figure 15B:
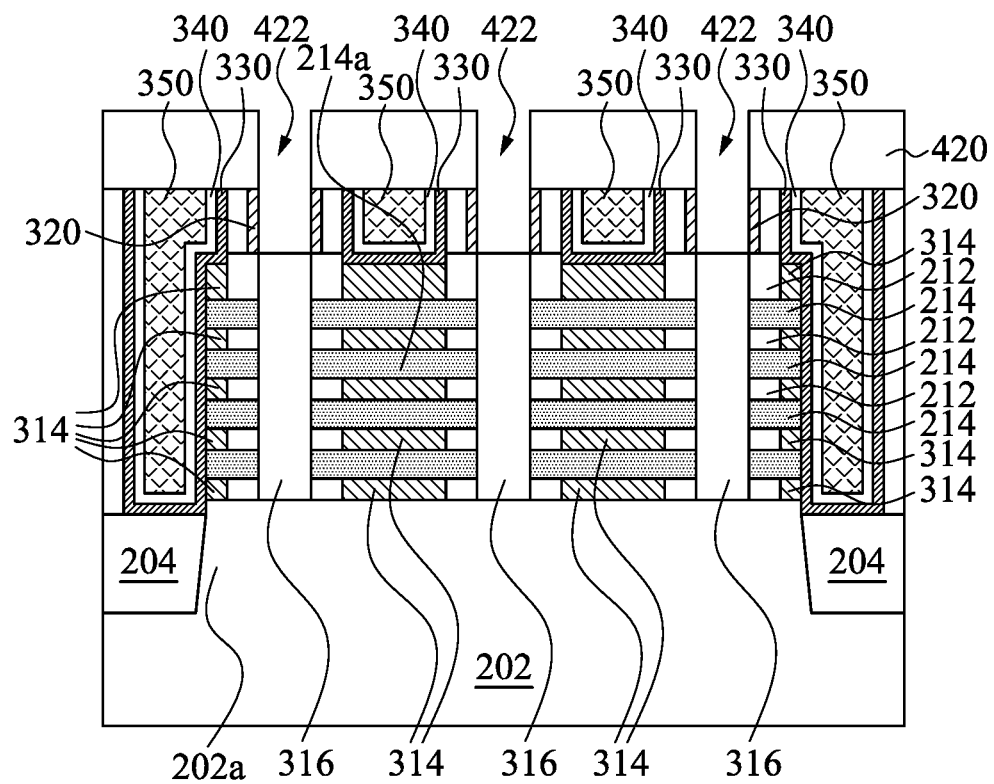
Figure 15C:
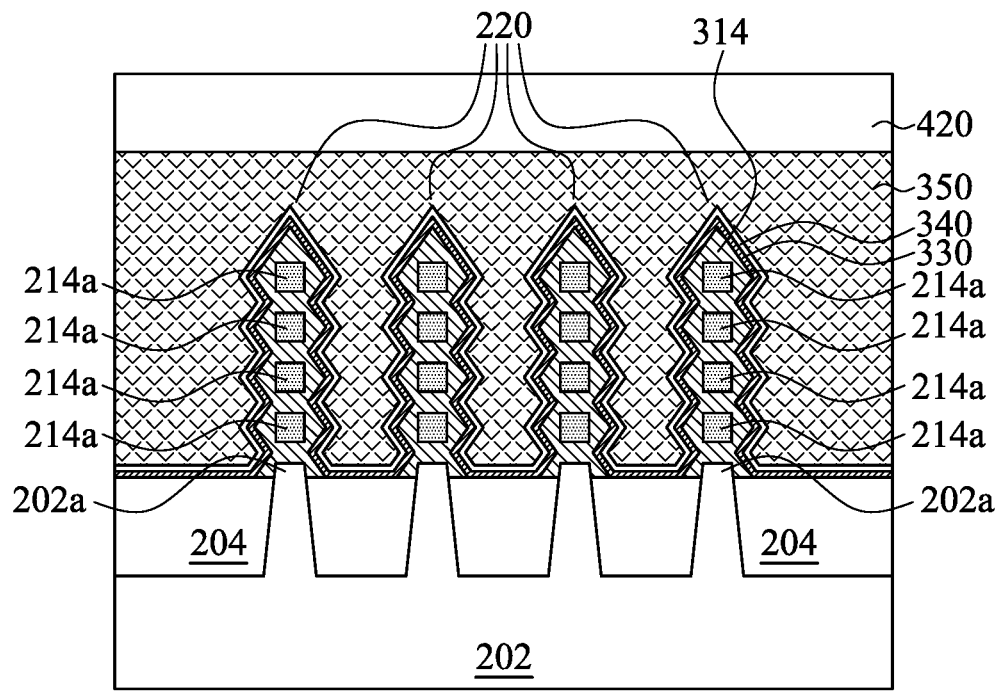
Figure 15D:
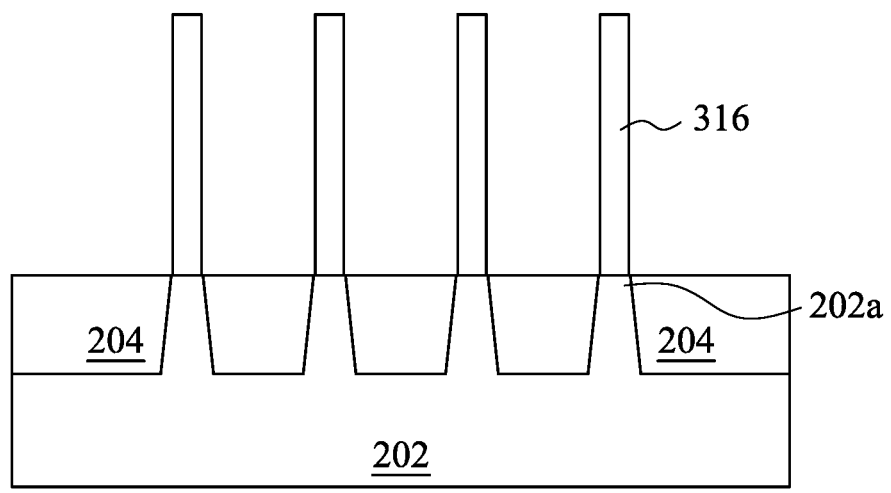

Reference is made to FIGS. 15A-15D and operation 160 in FIG. 1. FIG. 15A is a top view of the structure 200. FIGS. 15B, 15C and 15D are cross-sectional views taken along section BB, CC and DD in FIG. 15A respectively. Source and drain regions 316 are formed in the contact openings 422 by for example epitaxial growth. The source and drain regions 316 may include materials such as SiP or SiGeB and any other suitable materials.

Figure 16A:
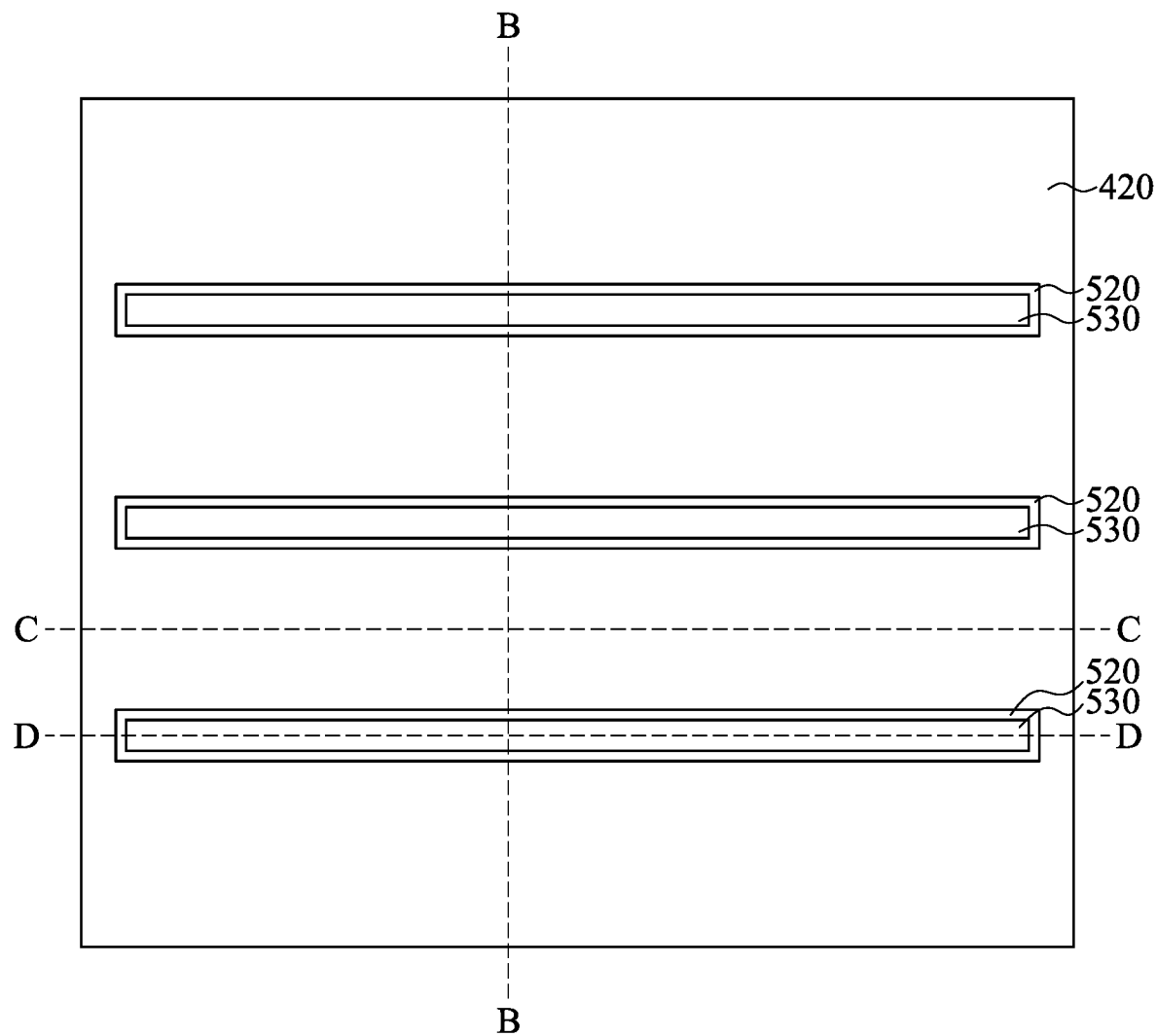
FIGS. 16A-16D illustrate a top view, a cross-sectional view along section BB, a cross-sectional view along section CC, and a cross-sectional view along section DD of the device of FIG. 16A, respectively, in a multi-stack nanowire FET device formation process in accordance with some embodiments of the instant disclosure.
Figure 16B:
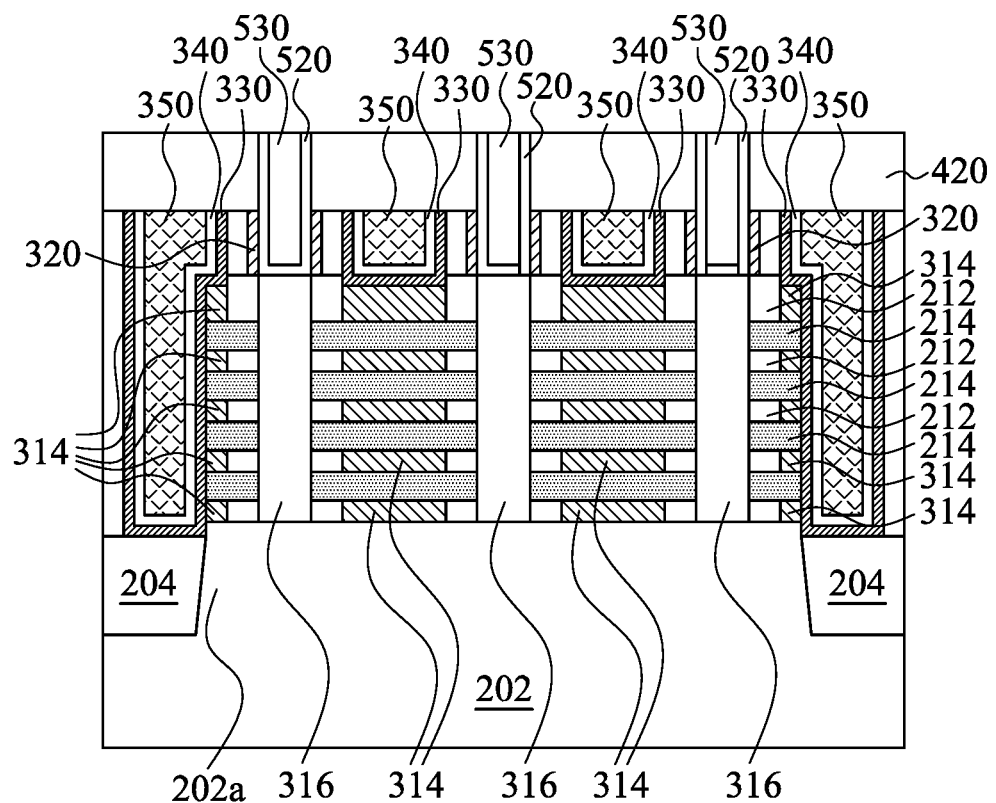
Figure 16C:
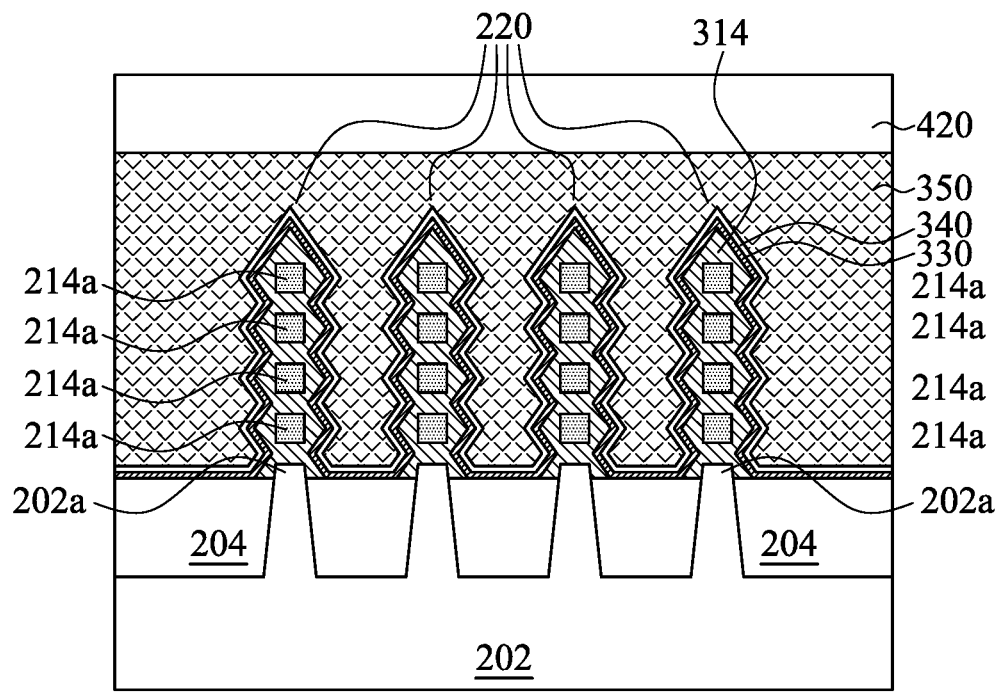
Figure 16D:
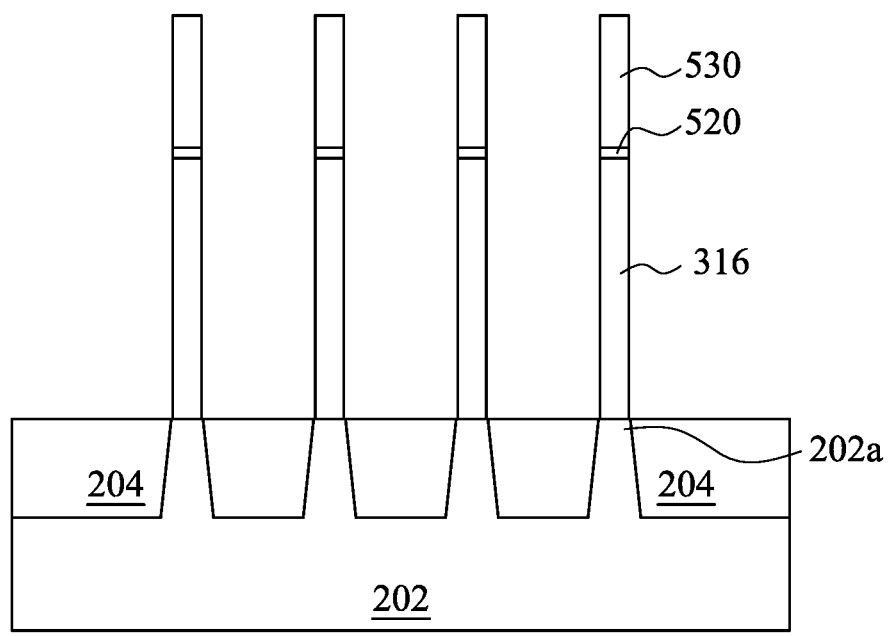

Reference is made to FIGS. 16A-16D. FIG. 16A is a top view of the structure 200. FIGS. 16B, 16C and 16D are cross-sectional views taken along section BB, CC and DD in FIG. 16A respectively. A work function metal layer 520 and a metal layer 530 are formed on the source and drain regions 316. The work function metal layer 520 is deposited in the contact openings 422 and formed on a top surface of the source and drain regions 316. Subsequently, the metal layer 530 is formed on the work function metal layer 520 and fills in the contact openings 422 as shown in FIGS. 16A and 16B. The channel regions 220a remains the same under the protection of the second interlayer dielectric layer 420 as shown in FIG. 16C.

Figure 17A:
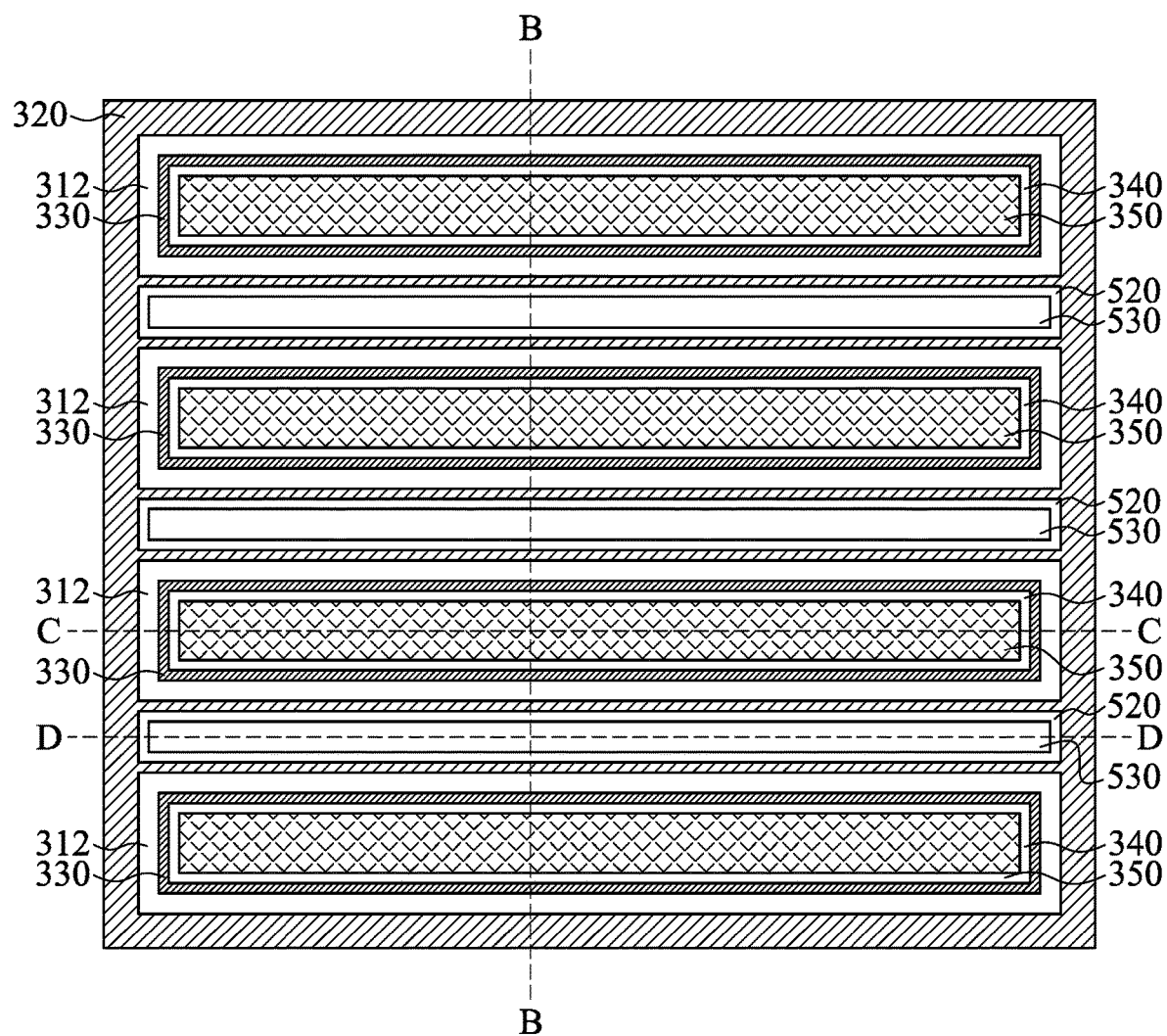
FIGS. 17A-17D illustrate a top view, a cross-sectional view along section BB, a cross-sectional view along section CC, and a cross-sectional view along section DD of the device of FIG. 16A, respectively, in a multi-stack nanowire FET device formation process in accordance with some embodiments of the instant disclosure.
Figure 17B:
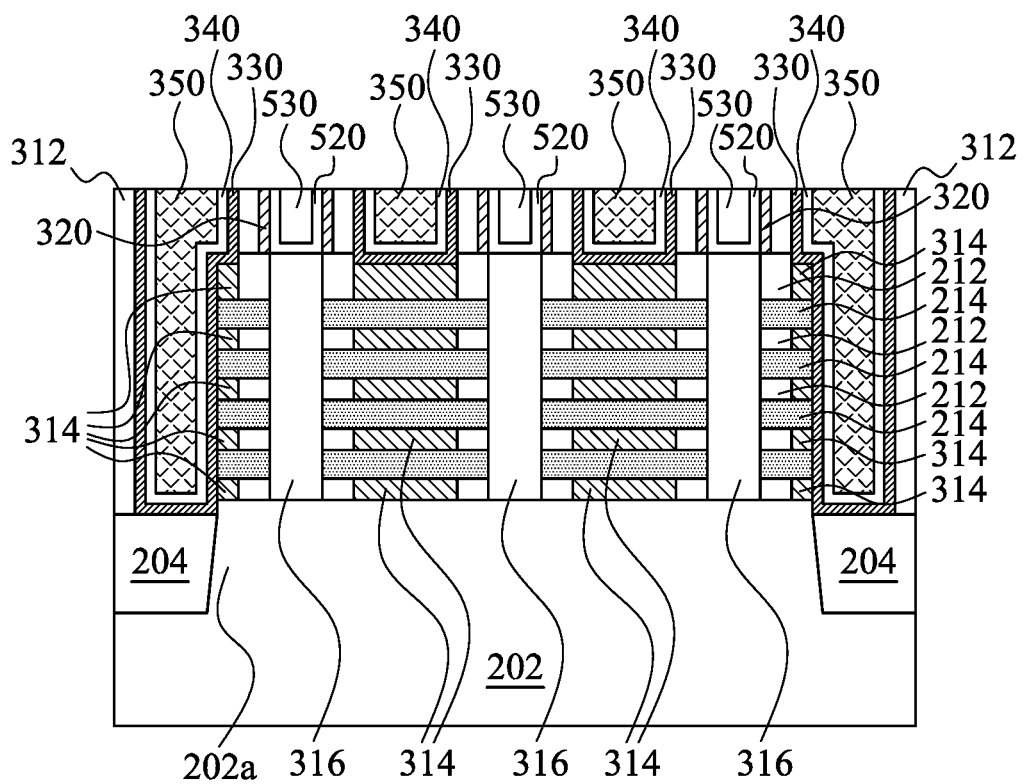
Figure 17C:
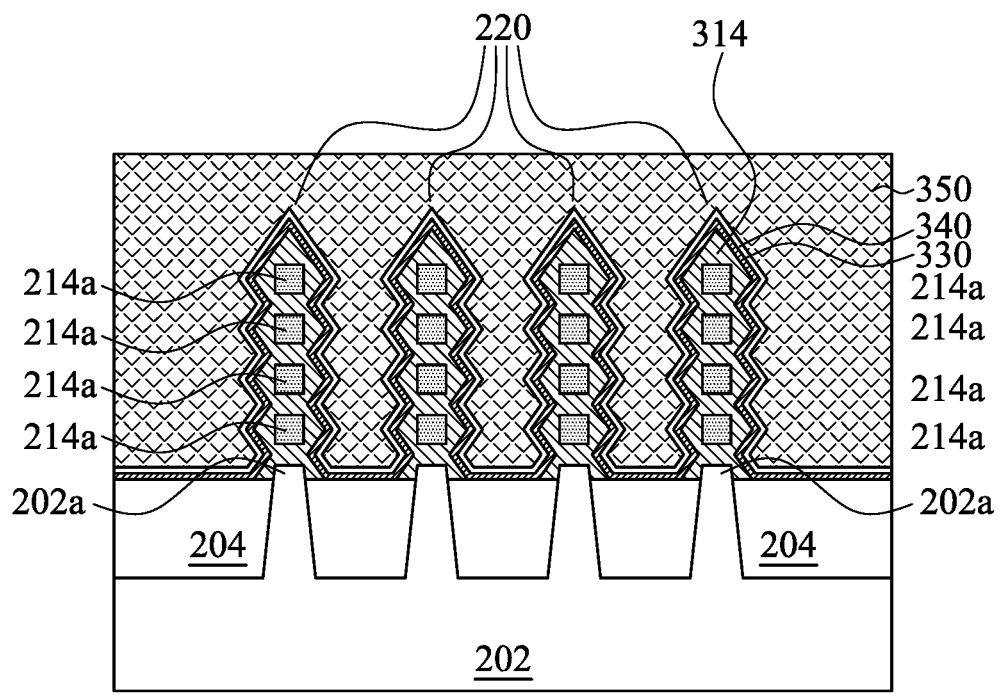
Figure 17D:
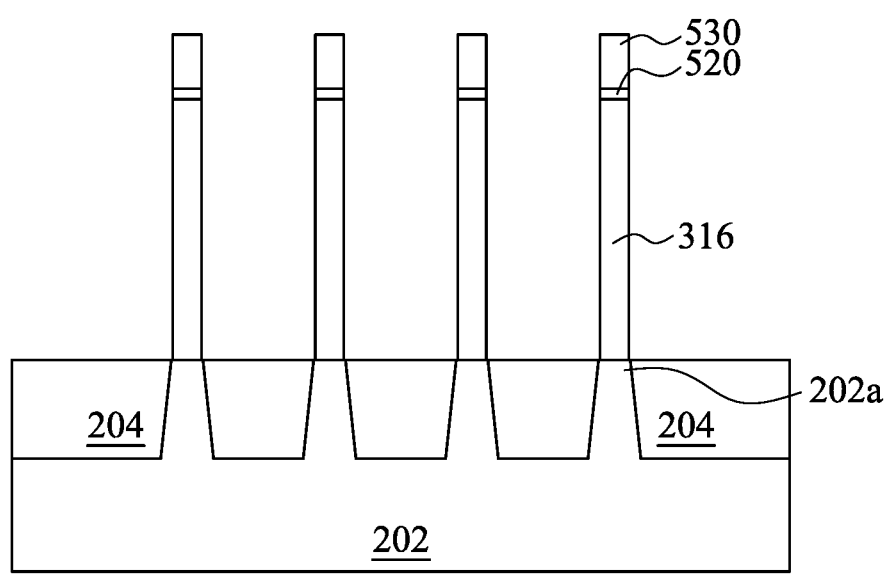

Reference is made to FIGS. 17A-17D. FIG. 17A is a top view of the structure 200. FIGS. 17B, 17C and 17D are cross-sectional views taken along section BB, CC and DD in FIG. 17A respectively. The second interlayer dielectric layer 420 is removed by polishing. The underlying gate structures are then resurfaced. Three rows of source and drain regions spans across the second portions 214b of the nanowires 214, and channel regions (first portions 214a of the nanowires 214) interpose in between the source and drain regions. The first portions 214a of the nanowire 214 are wrapped by the epitaxial layer 314 in a collective zig-zag contour. The interface between the epitaxial layer 314 and the work function metal layer 340 and gate electrode 350 is then maximized in the <111> plane orientation. Desirable ohmic resistance can therefore be achieved. In some embodiments, the electron mobility is about three times higher than conventional channel regions (for example, rectangular fin).

Figure 18:
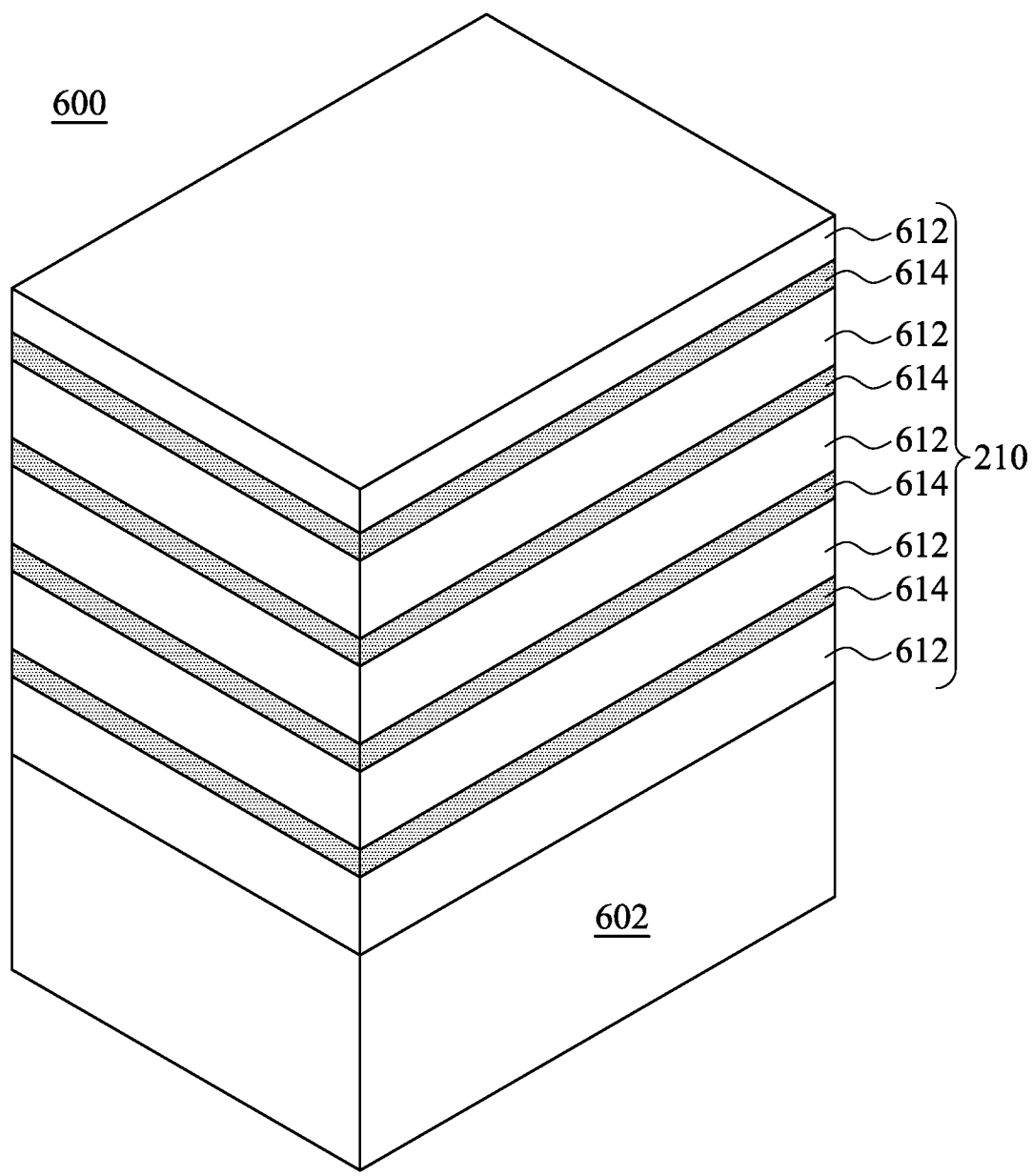
FIG. 18 is a schematic diagram illustrating a portion of a semiconductor substrate at a stage in a multi-stack nanowire FET device formation process in accordance with some embodiments of the instant disclosure.

Reference is made to FIG. 18 and operation 110 of method 100 in FIG. 1. FIG. 18 is a schematic diagram of a structure 600. The structure 600 includes a semiconductor substrate 602 and a multi-layer stack 610. The multi-layer stack 610 includes sacrificial layers 612 and nanowires 614. The sacrificial layers 612 and the nanowires 614 are stacked alternatively. For example, a sacrificial layer 612 is interposed in between every two nanowires 614. The nanowires 614 may use the same material as the semiconductor substrate 602. The number of layers (sacrificial layer 612 and nanowire 614) in the multi-layer stack 610 determines the number of nanowires in a fin after patterning. FIG. 18 shows a multi-layer stack 610 having five sacrificial layers 612 and four nanowires 614. In this case, four nanowires are formed later, and the instant disclosure is not limited thereto. The difference between the multi-layer stack 610 shown in FIG.

18 and the multi-layer stack 210 shown in FIG. 2 arises from the thickness of the sacrificial layers 612. The thickness of the sacrificial layers 612 determines the pitch between the nanowires, and the thickness of the sacrificial layers 612 is much larger than that of the sacrificial layers 212. The thickness of the sacrificial layers 612 may be at least twice larger than the thickness of the nanowires 614. Different configuration of the nanowires 614 can be created due to the thickness of the sacrificial layers 612. The formation of the channel region nanowires 614 will be elaborated hereinafter.

Figure 19A:
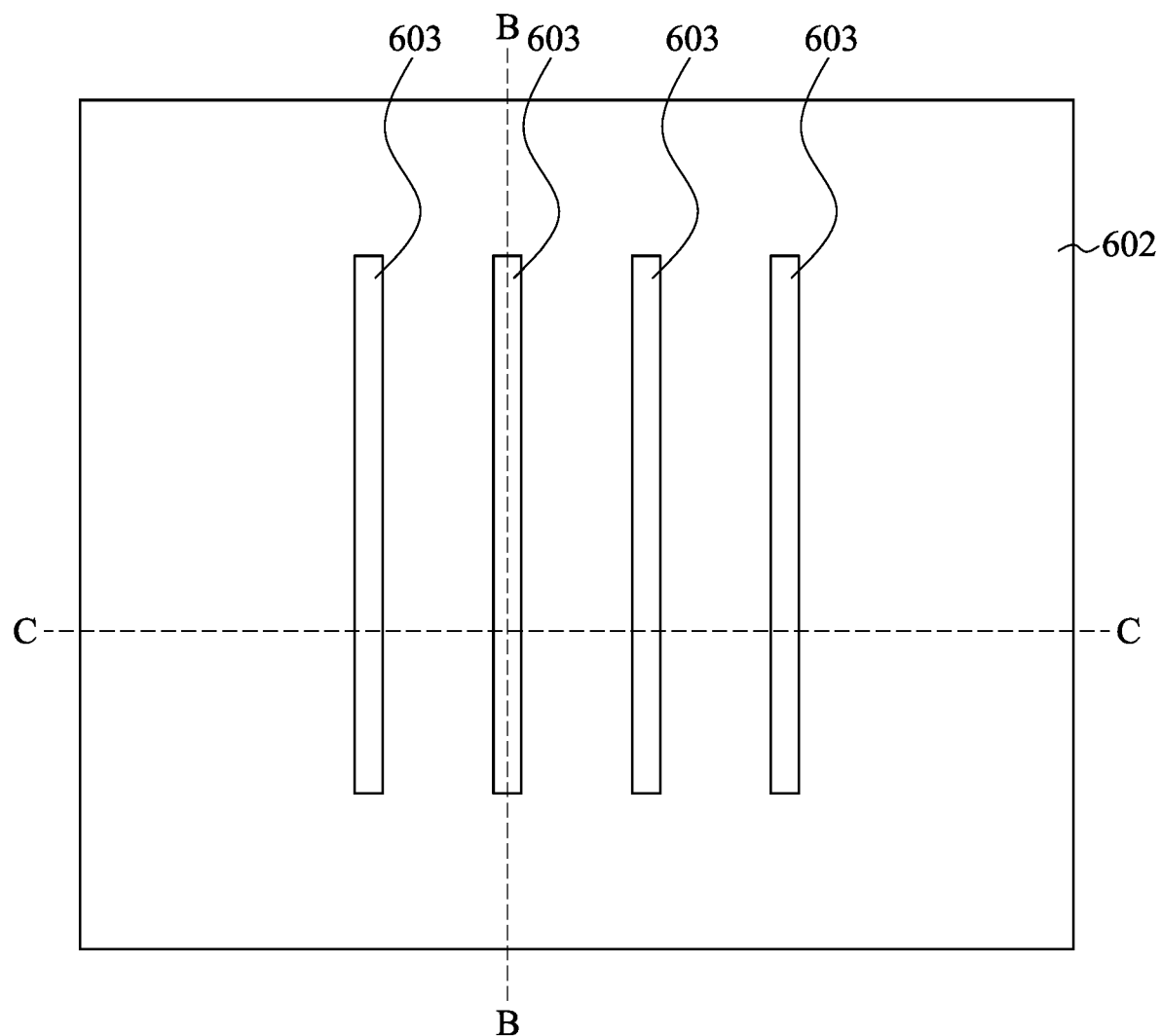
FIGS. 19A-19C illustrate a top view, a cross-sectional view along section BB, and a cross-sectional view along section C-C of the device of FIG. 18A, respectively, in a multi-stack nanowire FET device formation process in accordance with some embodiments of the instant disclosure.
Figure 19B:
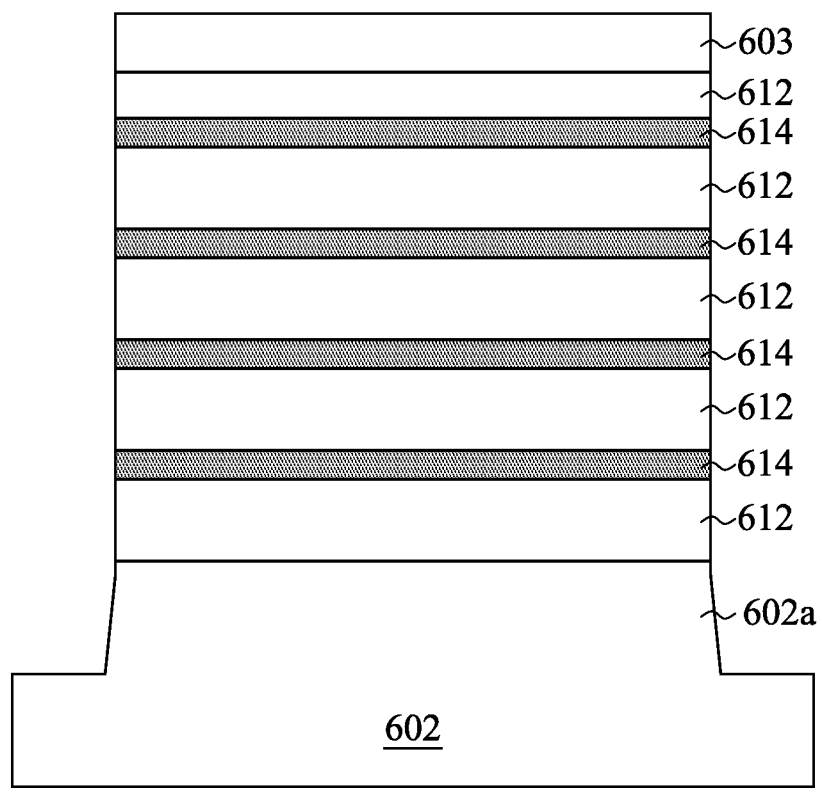
Figure 19C:
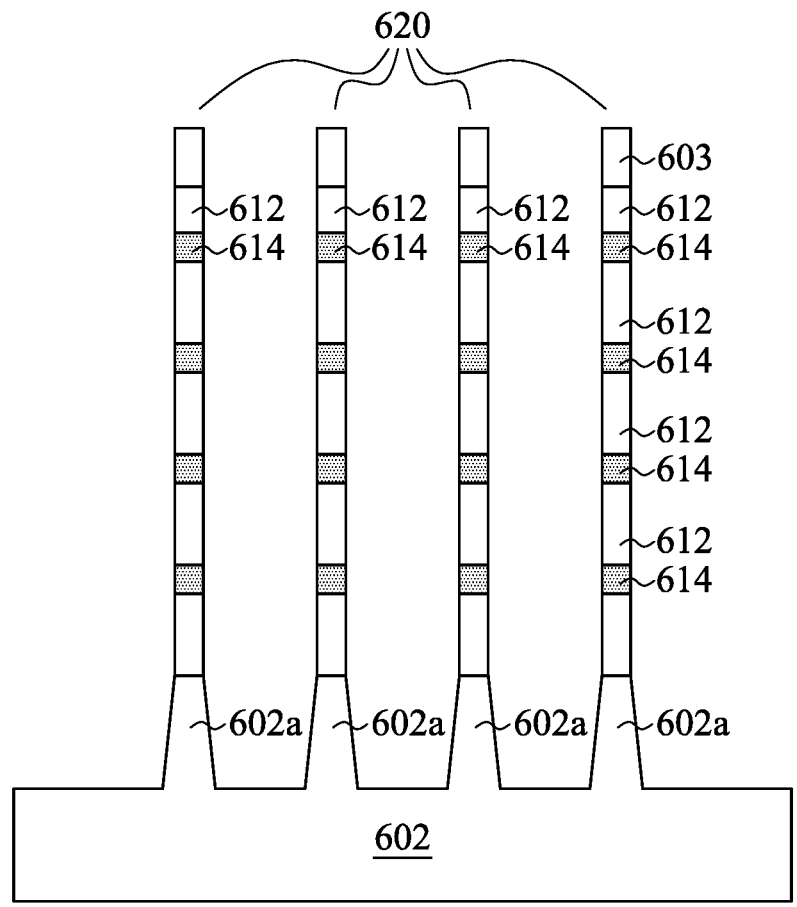

Reference is made to FIGS. 19A-19C and operation 120 of method 100 in FIG. 1. FIG. 19A is a top view of the structure 600. FIGS. 19B and 19C are cross-sectional views taken along section BB and CC in FIG. 19A respectively. The multi-layer stack 610 is patterned to form fins 620. A hard mask 603 is formed over a portion of the top sacrificial layer 612 resulting in fins 620. When the multi-layer stack 610 is patterned, a portion of the underlying semiconductor substrate 602 is also removed. As shown in FIG. 19C, the fins 620 include protruded portions 602a of the semiconductor substrate 602.

Figure 20A:
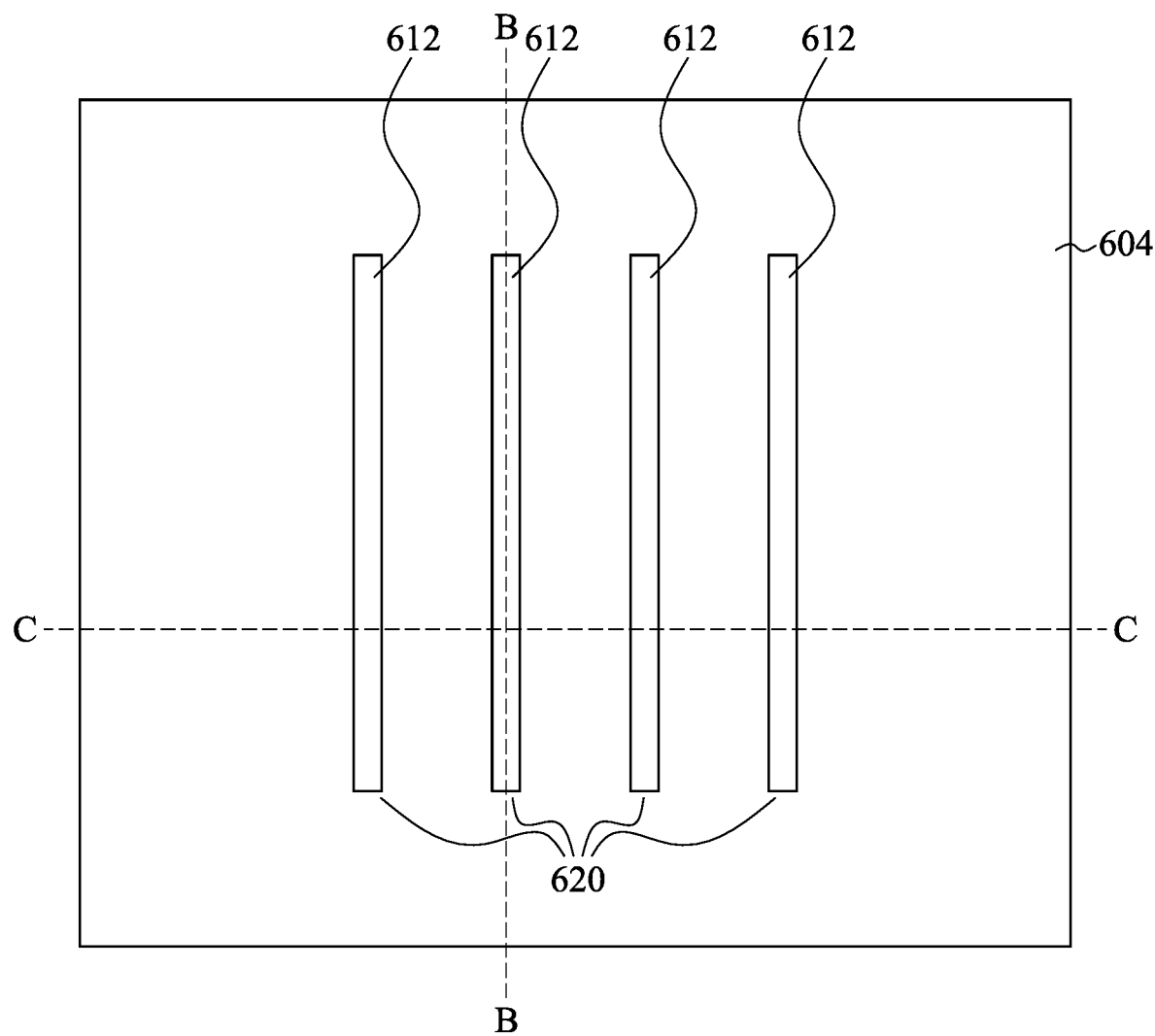
FIGS. 20A-20C illustrate a top view, a cross-sectional view along section BB, and a cross-sectional view along section C-C of the device of FIG. 19A, respectively, in a multi-stack nanowire FET device formation process in accordance with some embodiments of the instant disclosure.
Figure 20B:
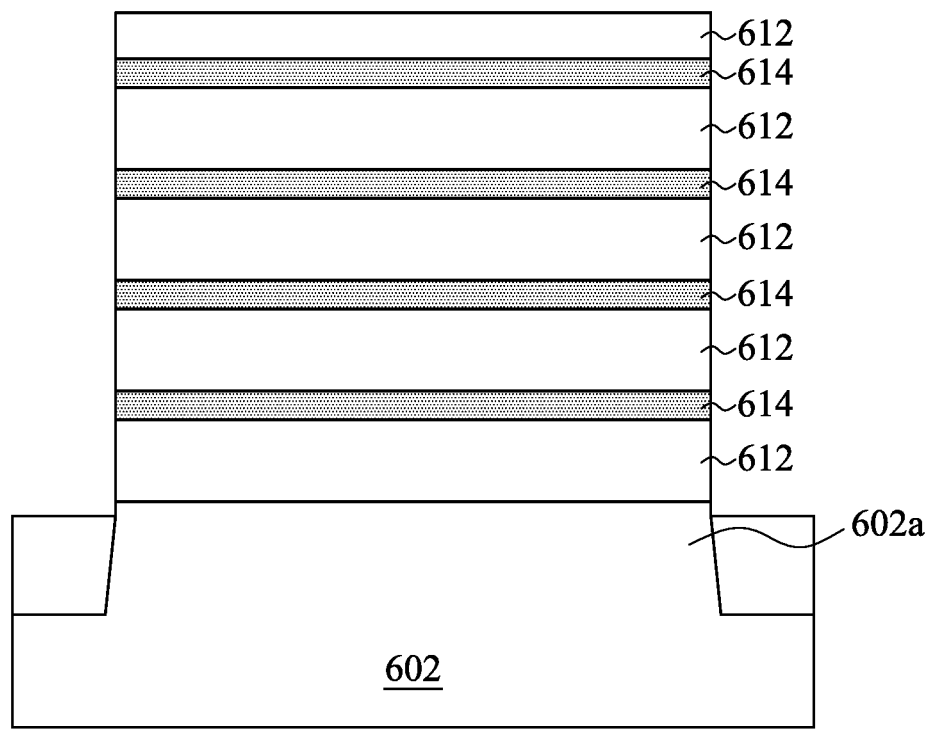
Figure 20C:
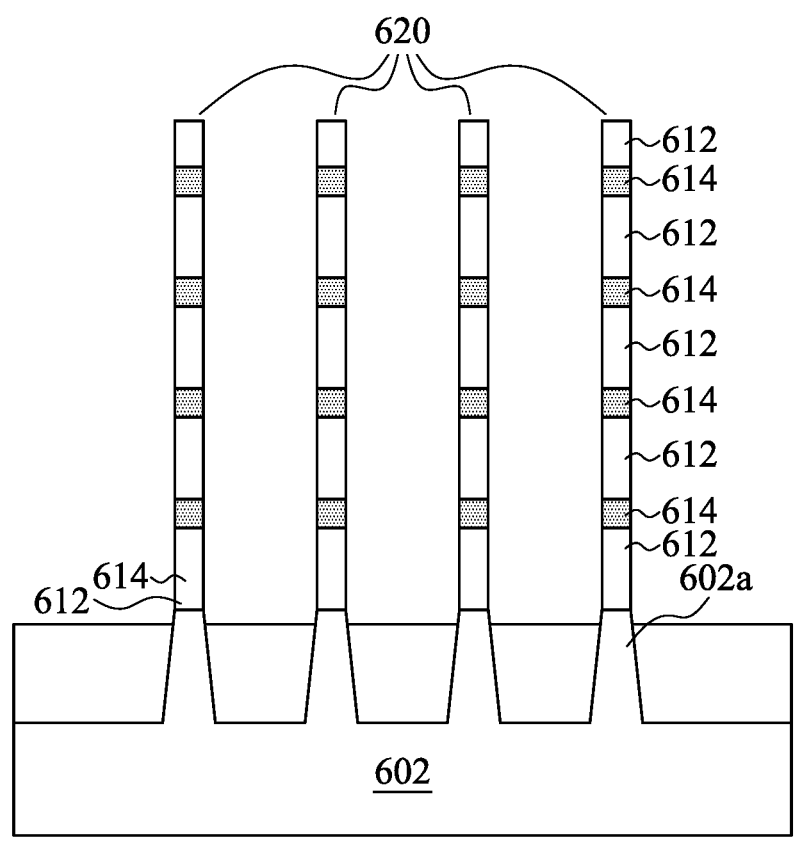

Reference is made to FIGS. 20A-20C. FIG. 20A is a top view of the structure 600. FIGS. 20B and 20C are cross-sectional views taken along section BB and CC in FIG. 20A respectively. The hard mask 603 is removed from the top sacrificial layer 612, and isolation structures 604 are formed. After the removal of the hard mask 603, an oxide is deposited to form isolation structures 604 in the spaces between the fins 620. An anisotropic etch is used to recess the oxide into the semiconductor substrate 602 at the base of the fins 620. The fins 620 are completely exposed above the isolation structures 604. A top portion of the protruded portion 602a of the semiconductor substrate 602 is not covered by the isolation structures 604. As shown in FIG. 20C, from the top surface of the isolation structures 604, a total of five sacrificial layers 612 and four nanowires 614 are exposed. The sacrificial layer 612 now caps the fins 620.

Figure 21A:
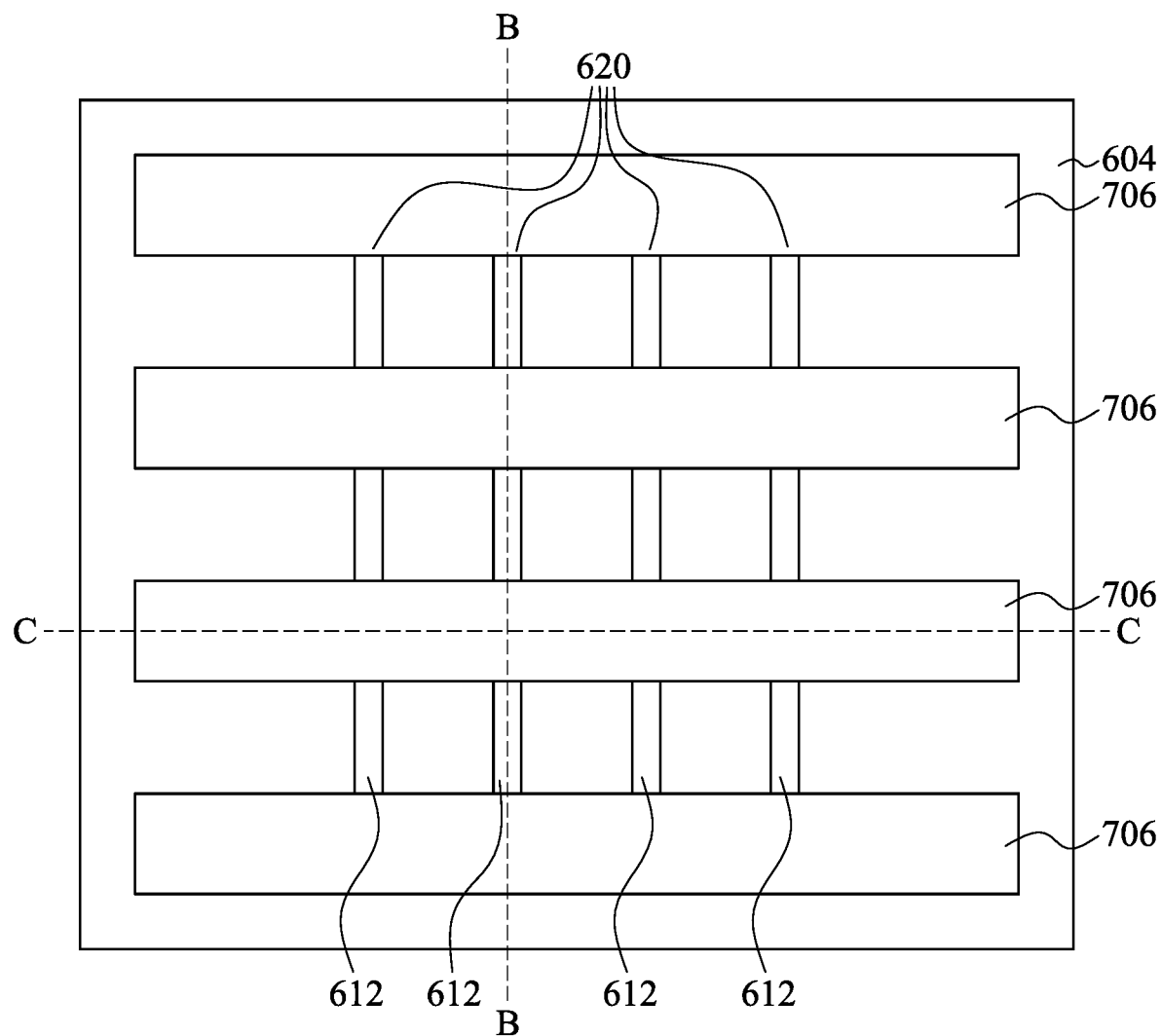
FIGS. 21A-21C illustrate a top view, a cross-sectional view along section BB, and a cross-sectional view along section C-C of the device of FIG. 20A, respectively, in a multi-stack nanowire FET device formation process in accordance with some embodiments of the instant disclosure.
Figure 21B:
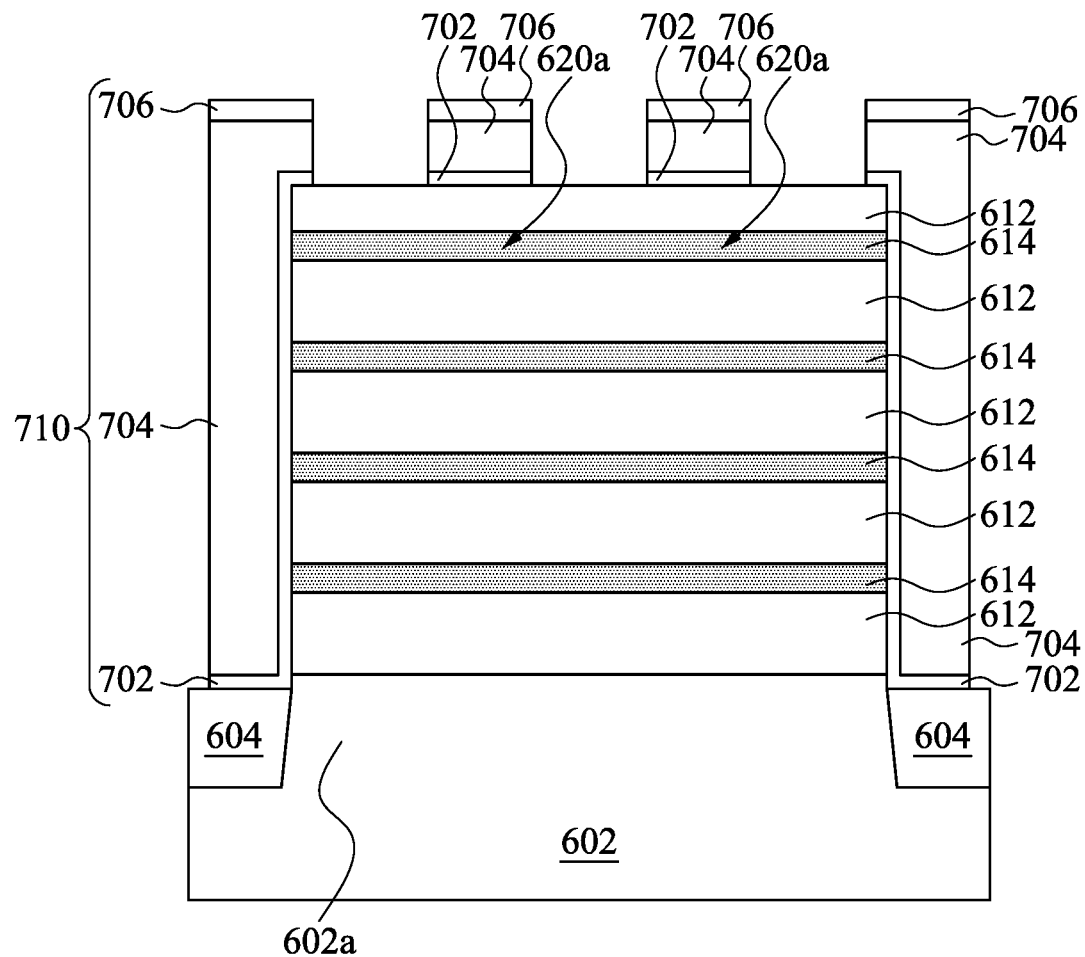
Figure 21C:
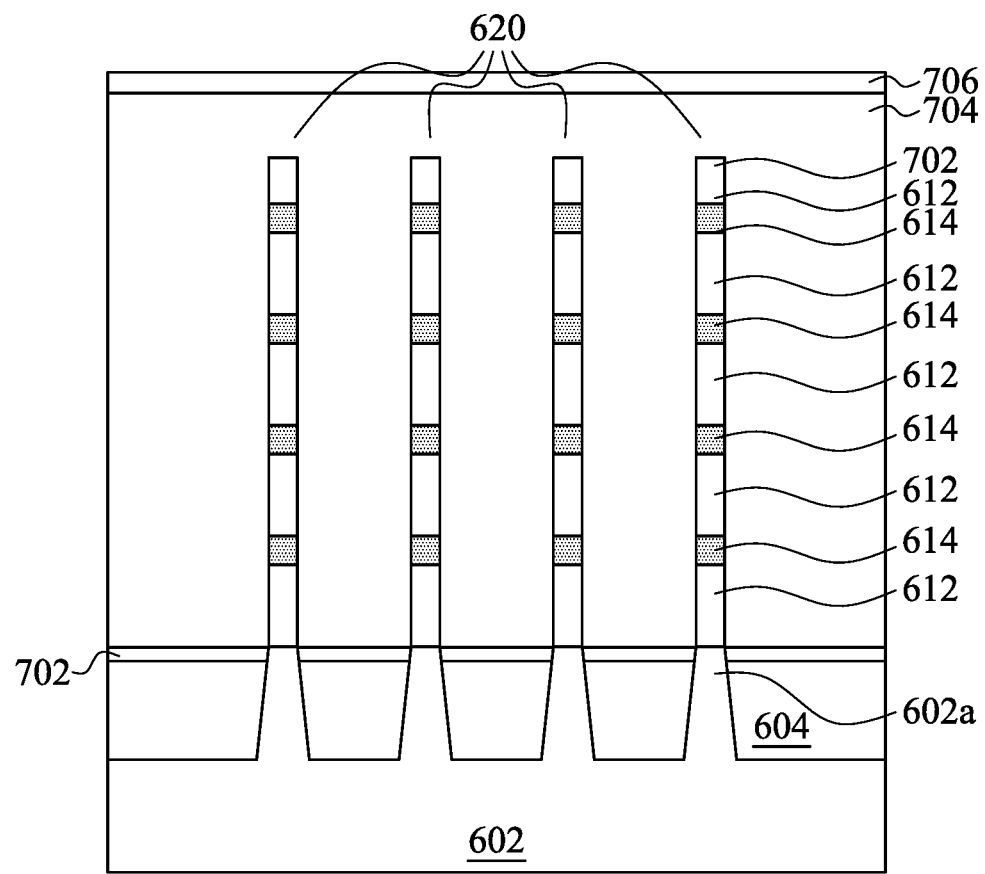

Reference is made to FIGS. 21A-21C. FIG. 21A is a top view of the structure 600. FIGS. 21B and 21C are cross-sectional views taken along section BB and CC in FIG. 21A respectively. Dummy gates 710 are formed over channel regions 620a of the fins 620. The dummy gates 710 may include a dielectric layer 702, a polysilicon layer 704, and an oxide or nitride hard mask 706, and other materials may also be used. In some embodiments, the dummy gates 710 are deposited as a blanket layer and then patterned. The dummy gates 710 define the channel regions 620a of the fins 620. As shown in FIG. 21A, the dummy gates 710 at either ends of the fins 620 anchor the fins 620, and therefore the anchoring dummy gates 710 have a portion over the fins 620 and the remaining portion touches down to the isolation structures 604.

Figure 22A:
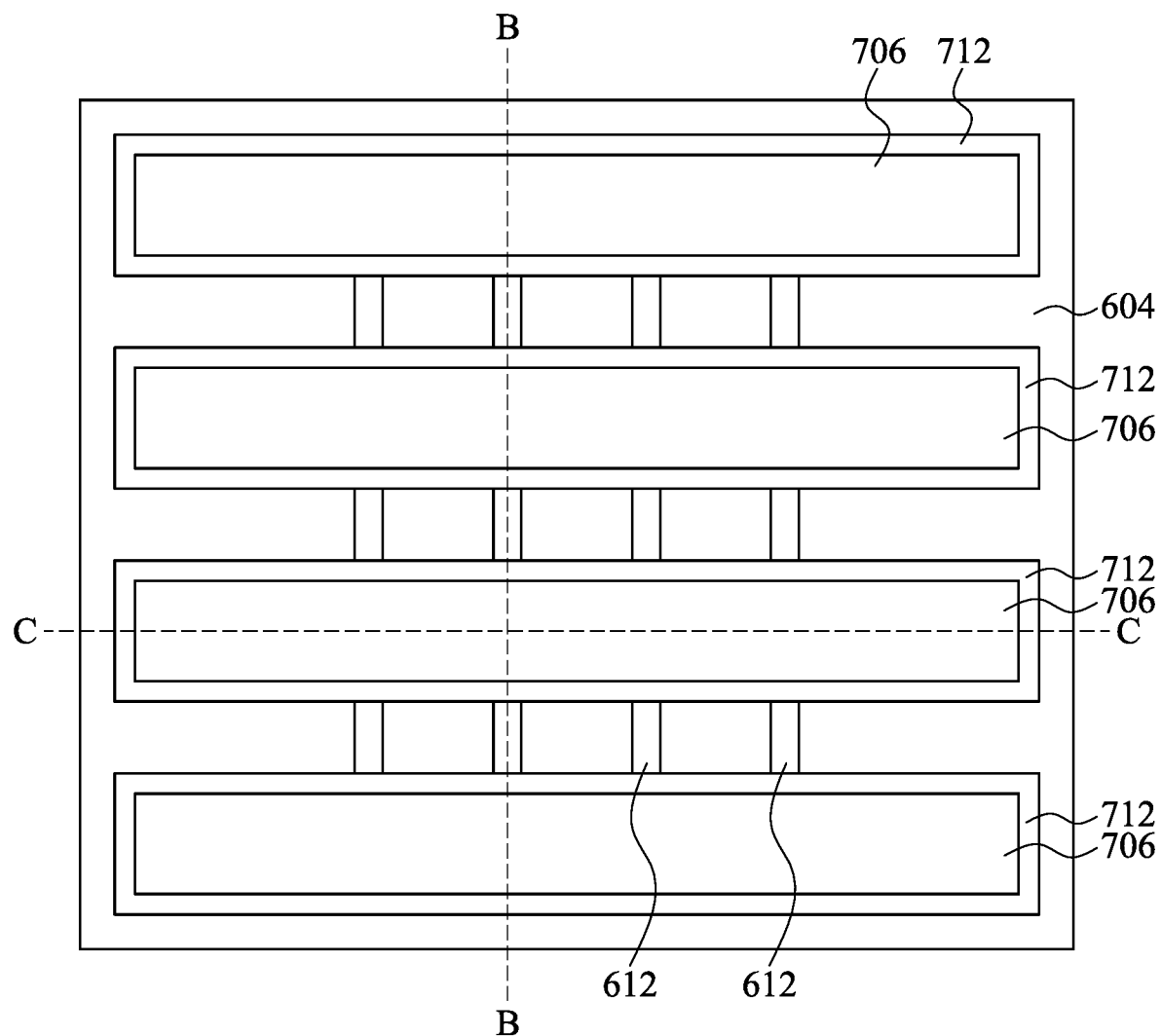
FIGS. 22A-22C illustrate a top view, a cross-sectional view along section BB, and a cross-sectional view along section C-C of the device of FIG. 21A, respectively, in a multi-stack nanowire FET device formation process in accordance with some embodiments of the instant disclosure.
Figure 22B:
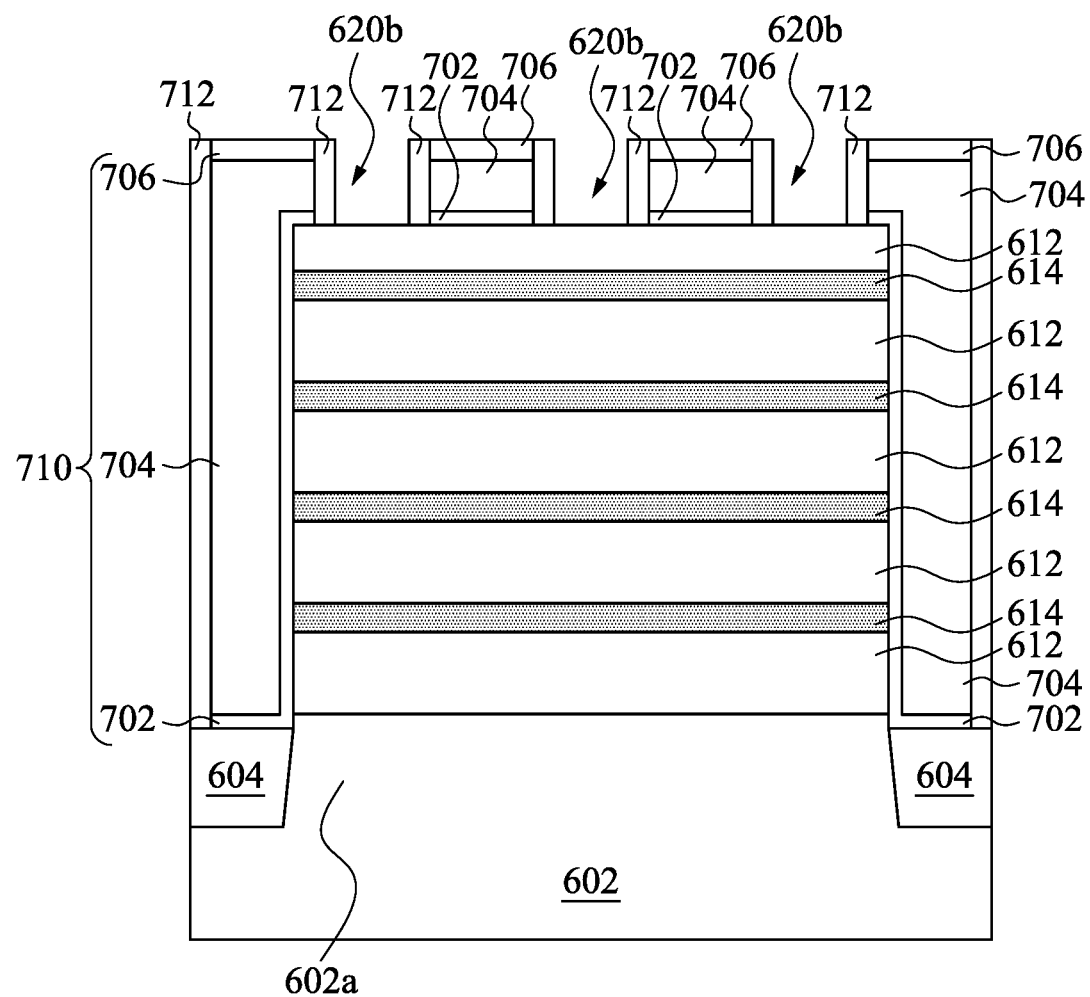
Figure 22C:
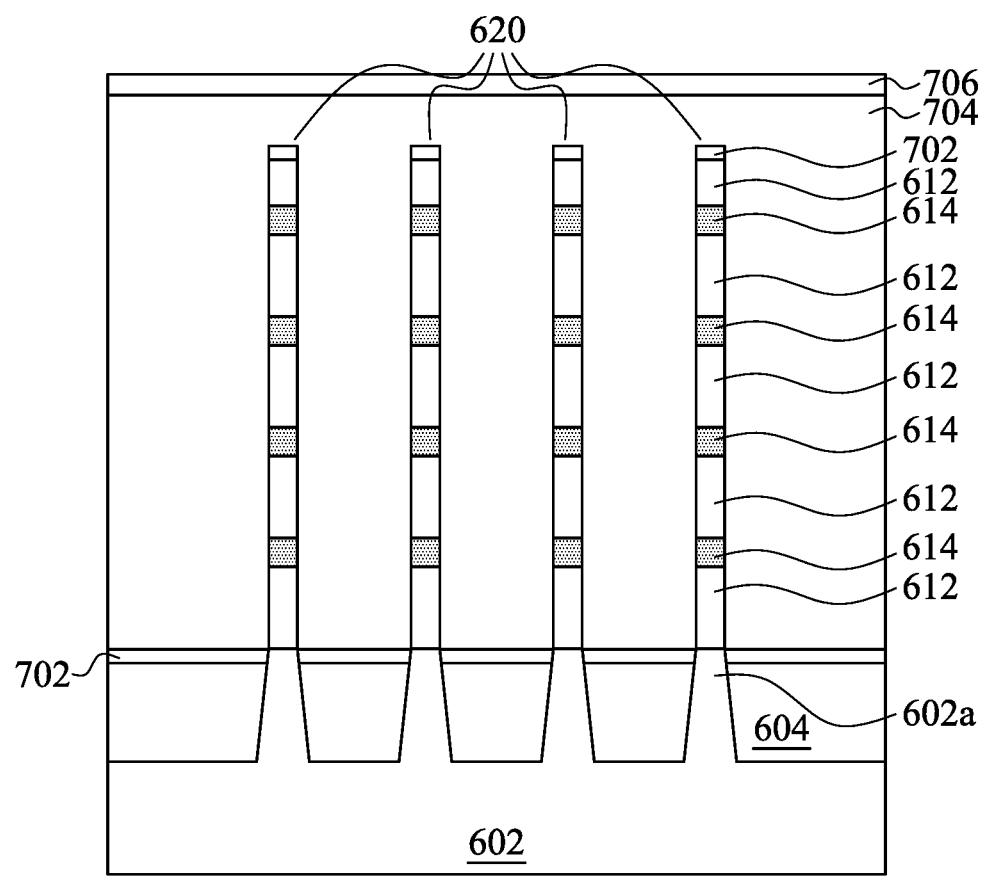

Reference is made to FIGS. 22A-22C. FIG. 22A is a top view of the structure 600. FIGS. 22B and 22C are cross-sectional views taken along section BB and CC in FIG. 22A respectively. After dummy gates 710 deposition, spacers 712 are formed on both sides of the dummy gates 710. The spacers 712 are formed by depositing an insulation layer (such as oxide or nitride) and then anisotropically etching from the surface. The etching process removes spacer layer from fin side walls. Spacers 712 are formed on the sides of the dummy gates 710, and spaces are left between the spacers 712 as shown in FIG. 22B. The spaces left between the spacers 712 define the source and drain regions 620b on the fins 620.

Still referring to FIGS. 22A-22C, the source and drain regions 620b of fins 620, which are between the spaces left between the spacers 712, are doped. The source and drain regions 620b of the fins 620 are doped by, for example, epi or plasma doping. N-type doping is used for the NFET devices in the fins 620, and p-type doping is used for the PFET devices in the fins 620. As shown in FIGS. 22A and 22B, the source and drain regions 620b of fins 620 are not covered by the dummy gates 710, and they are converted into the source and drain regions after doping. As shown in FIG. 22B, the dummy gates 710 are used as a mask where the channel regions 620a are located. For the sake of clarity, spacers 712 are not shown in FIG. 22C and the following cross-sectional views along section CC.

Figure 23A:
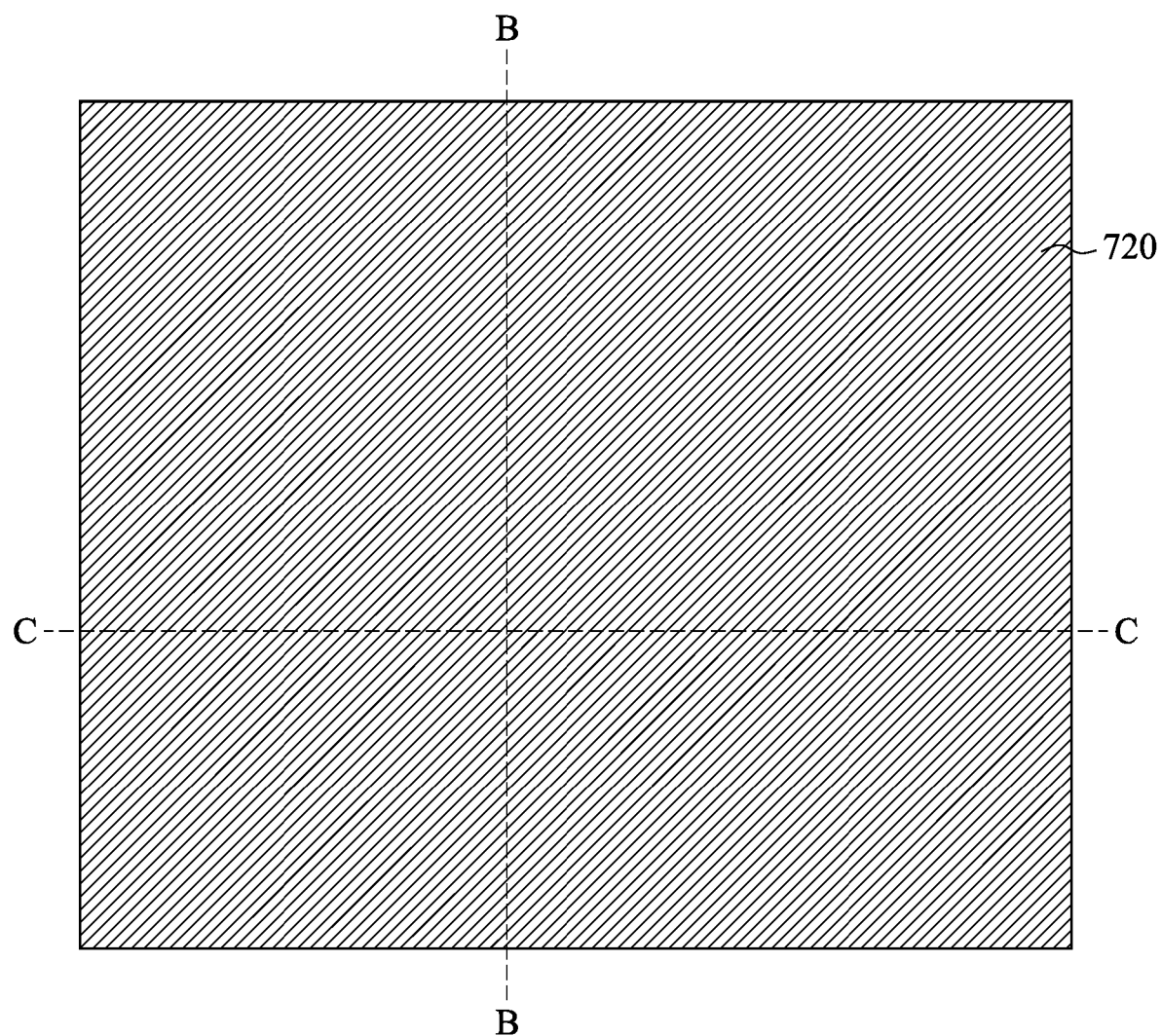
FIGS. 23A-23C illustrate a top view, a cross-sectional view along section BB, and a cross-sectional view along section C-C of the device of FIG. 22A, respectively, in a multi-stack nanowire FET device formation process in accordance with some embodiments of the instant disclosure.
Figure 23B:
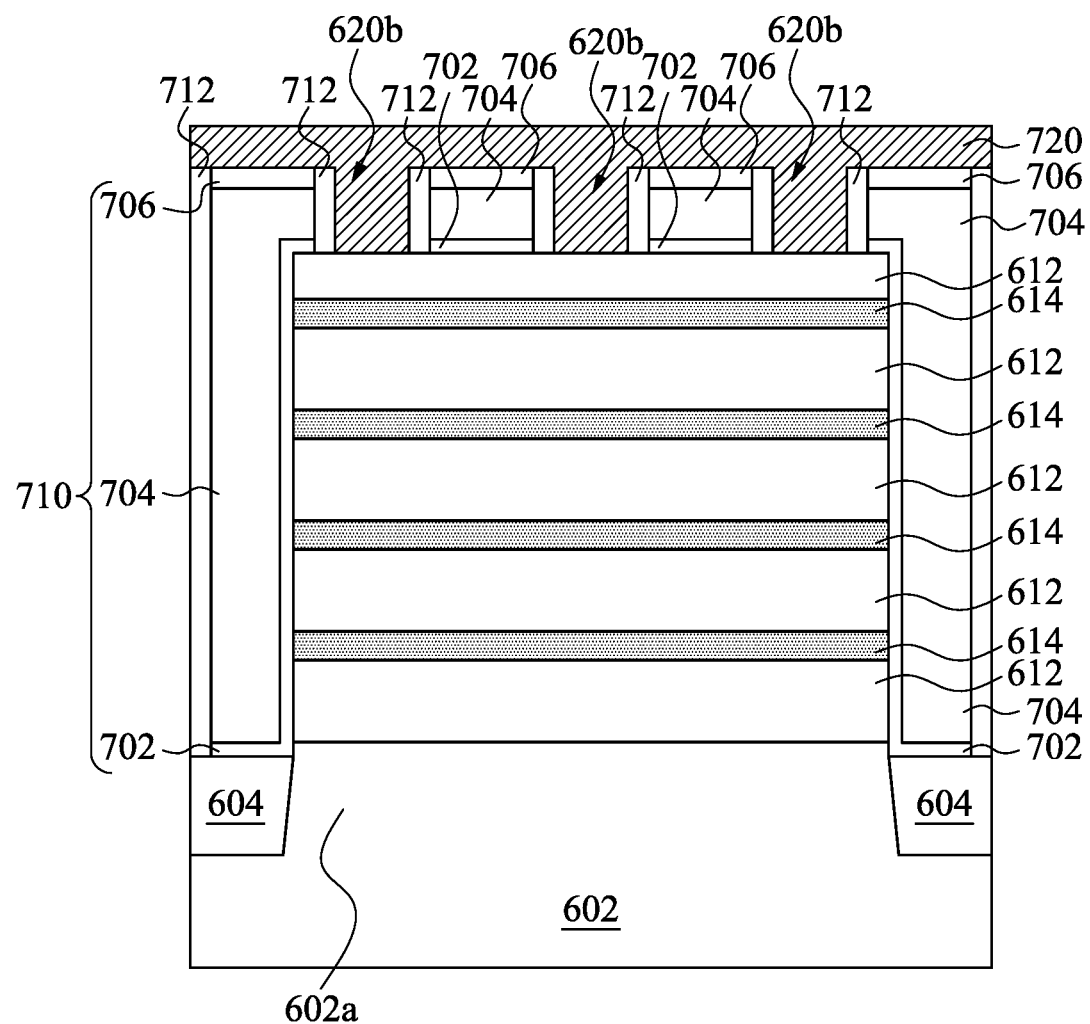
Figure 23C:
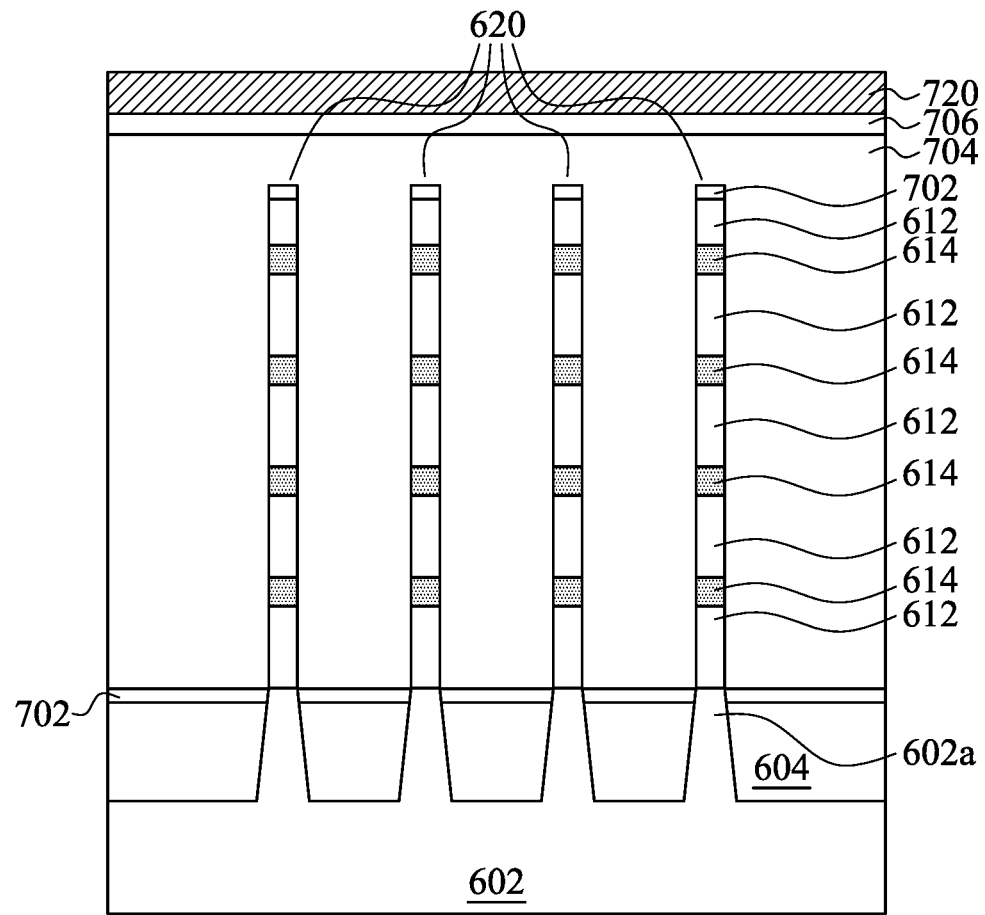

Reference is made to FIGS. 23A-23C. FIG. 23A is a top view of the structure 600. FIGS. 23B and 23C are cross-sectional views taken along section BB and CC in FIG. 23A respectively. A first interlayer dielectric layer 720 is deposited on the semiconductor substrate 602. The first interlayer dielectric layer 720 is blanket deposited on the semiconductor substrate 602 and fills in the spaces left between the spacers 712 on the fin side walls. The source and drain regions 620b of the fins 620 are then covered by the first interlayer dielectric layer 720. As shown in FIG. 23A, the first interlayer dielectric layer 720 covers up the spacers 712 and the dummy gates 710.

Figure 24A:
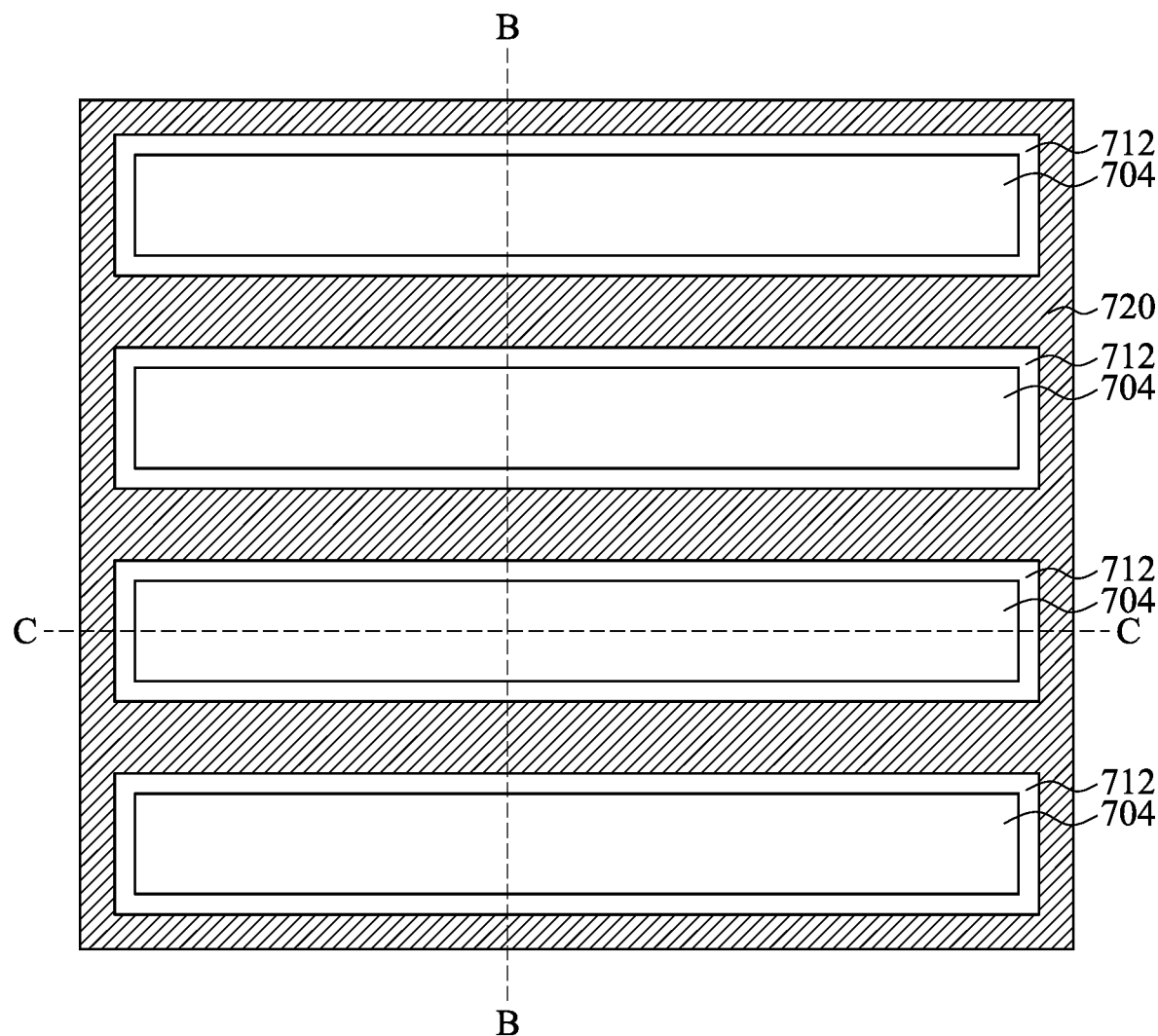
FIGS. 24A-24C illustrate a top view, a cross-sectional view along section BB, and a cross-sectional view along section C-C of the device of FIG. 23A, respectively, in a multi-stack nanowire FET device formation process in accordance with some embodiments of the instant disclosure.
Figure 24B:
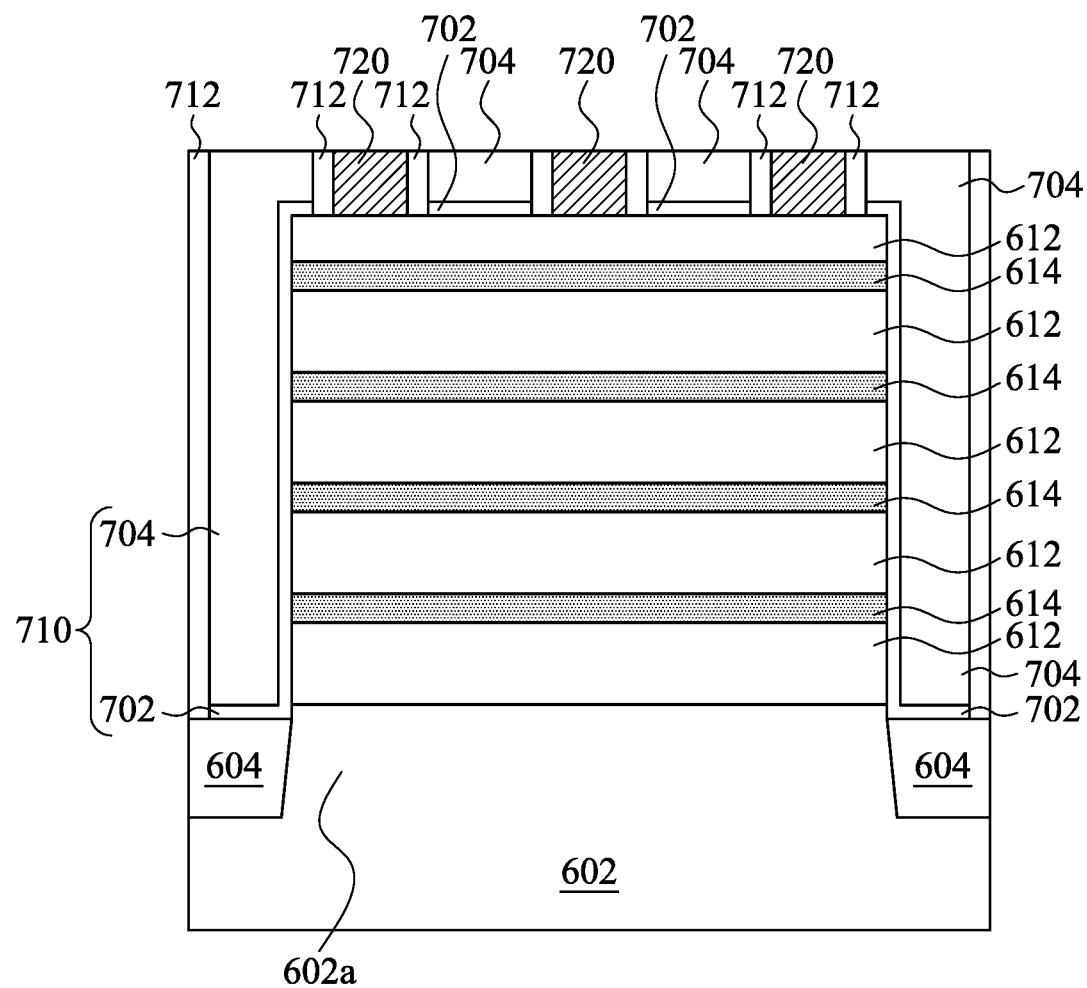
Figure 24C:
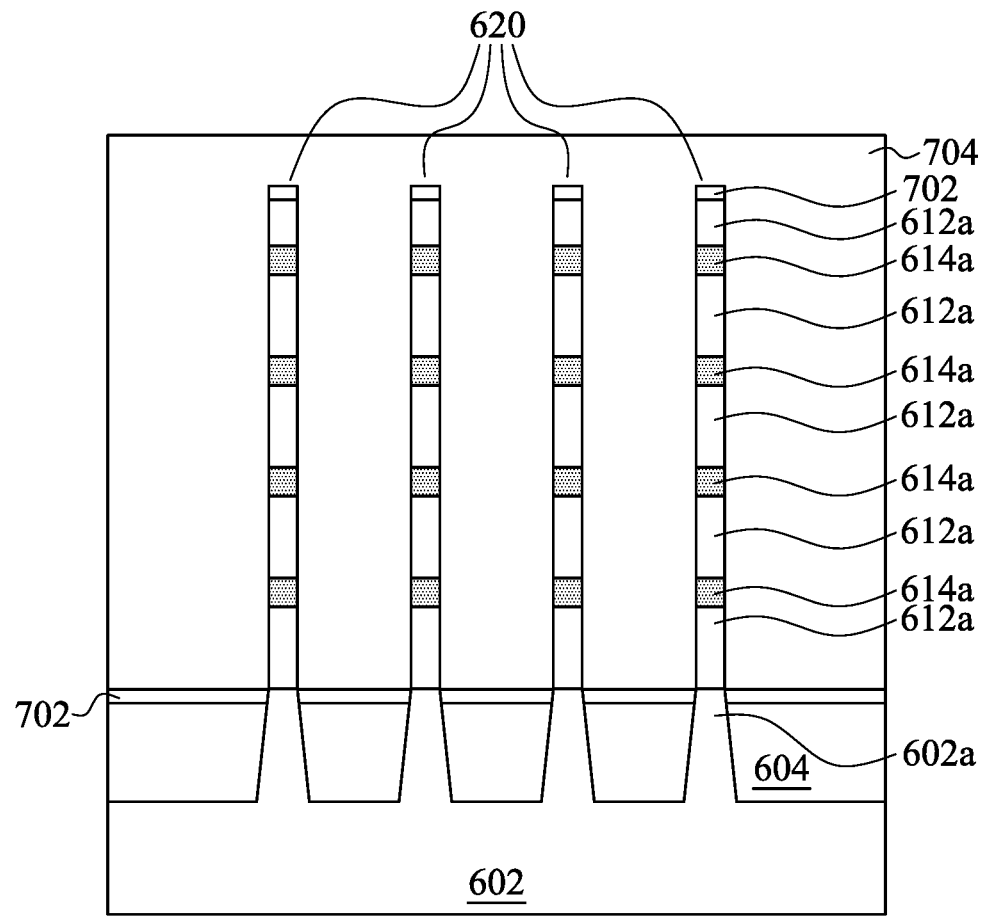

Reference is made to FIGS. 24A-24C. FIG. 24A is a top view of the structure 600. FIGS. 24B and 24C are cross-sectional views taken along section BB and CC in FIG. 24A respectively. A planarization process is performed to the semiconductor substrate 602. The planarization process may be chemical mechanical polishing or any other suitable process. Portions of the first interlayer dielectric layer 720 are removed. The first interlayer dielectric layer 720 between the spacers 712 on the fin side walls remains. As shown in FIG. 24B, in the planarization process, the hard masks 706 of the dummy gates 710 and portions of the spacers 712 are removed. On top of the source and drain regions 620b of the fins 620, a layer of the first interlayer dielectric layer 720 remains. As shown in FIG. 24C, the channel regions 620a are covered by the dielectric layer 702 and the polysilicon layer 704.

Figure 25A:
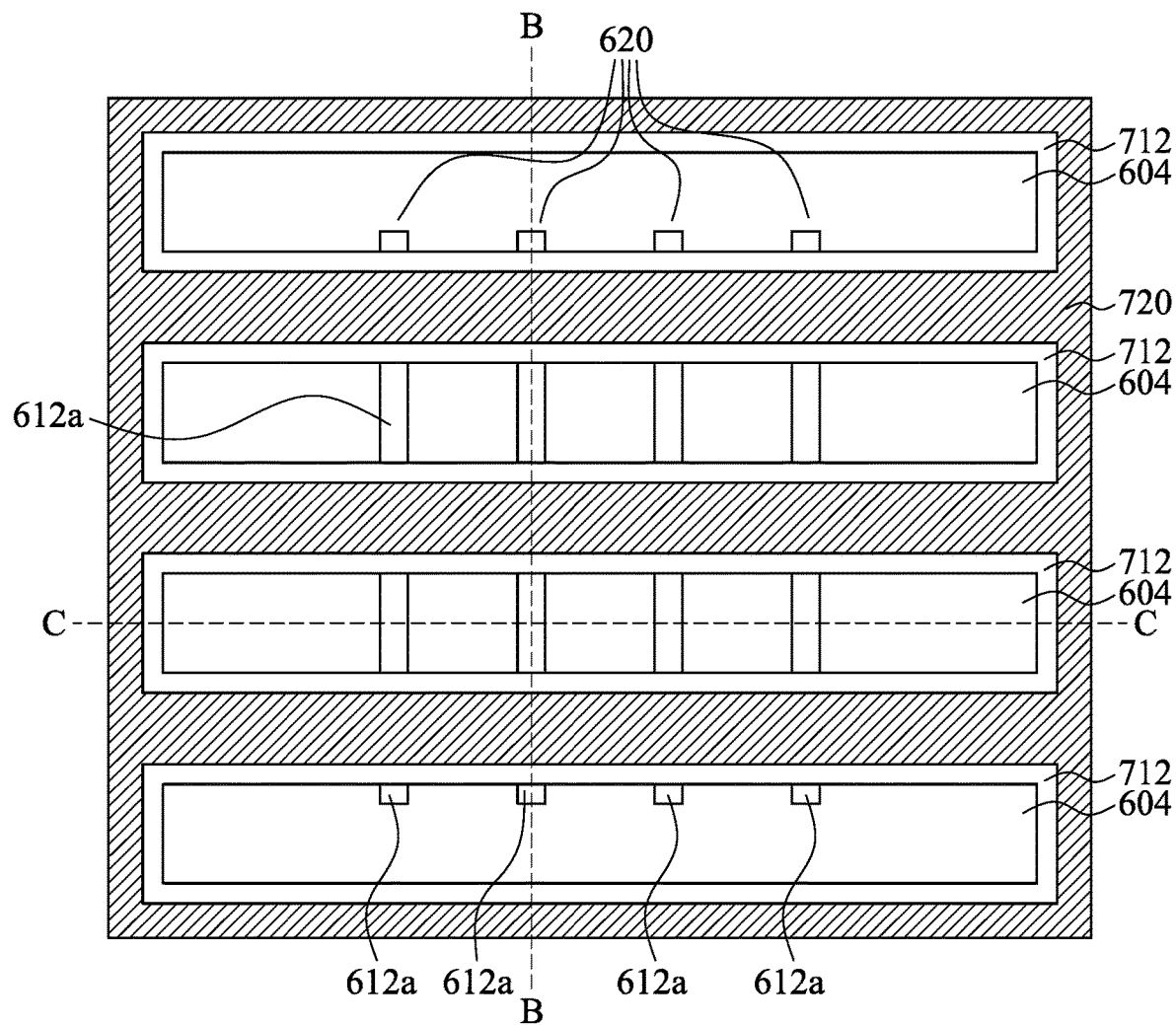
FIGS. 25A-25C illustrate a top view, a cross-sectional view along section BB, and a cross-sectional view along section C-C of the device of FIG. 24A, respectively, in a multi-stack nanowire FET device formation process in accordance with some embodiments of the instant disclosure.
Figure 25B:
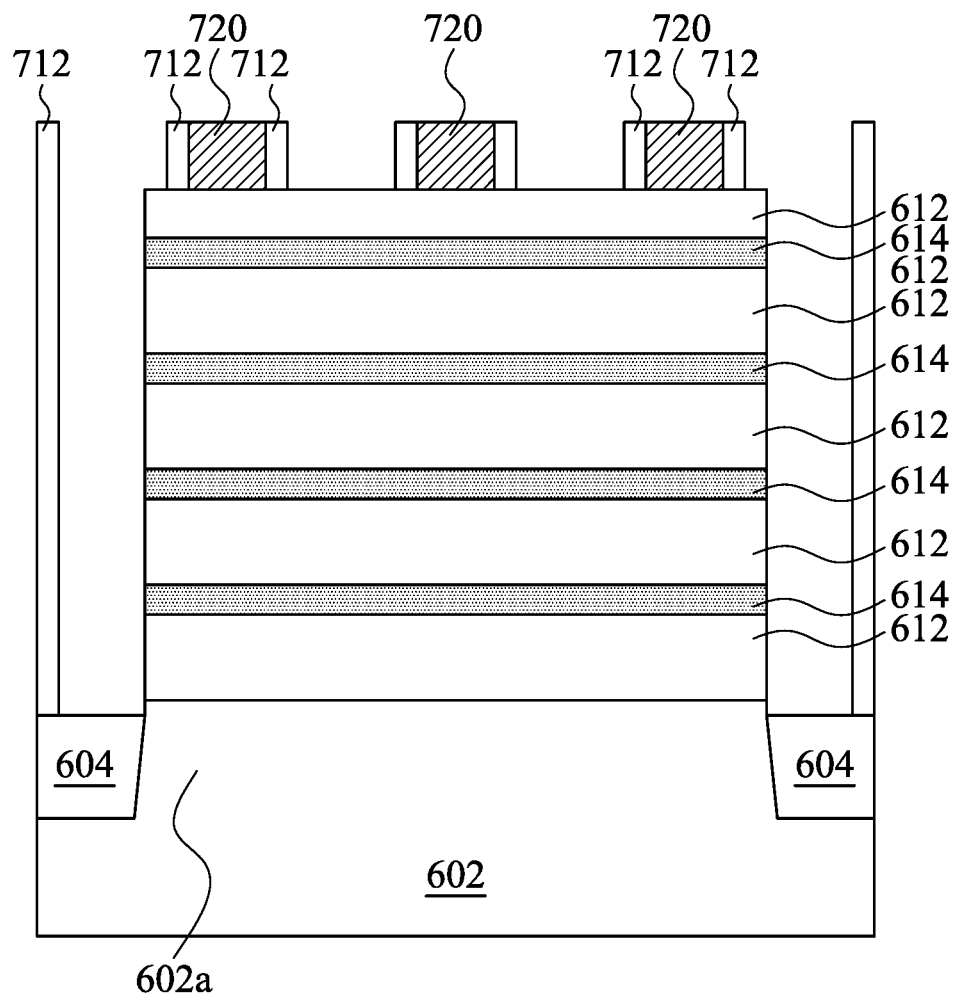
Figure 25C:
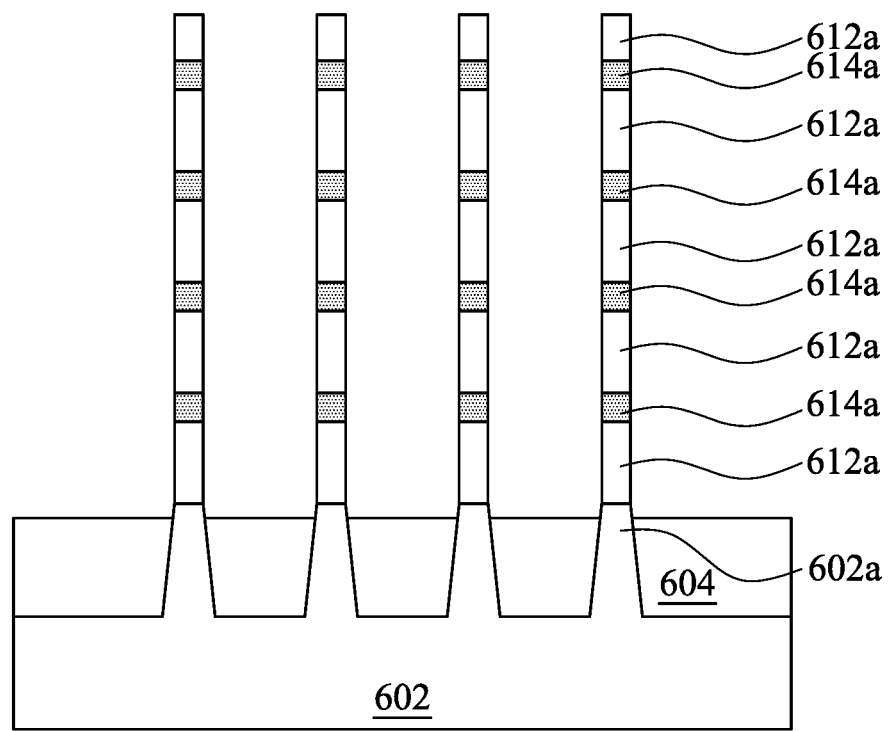

Reference is made to FIGS. 25A-25C. FIG. 25A is a top view of the structure 600. FIGS. 25B and 25C are cross-sectional views taken along section BB and CC in FIG. 25A respectively. After planarization, the dummy gates 710 are removed, but the spacers 712 remain. The polysilicon layer 704 and the dielectric layer 702 are removed by any suitable process, leaving spaces between the spacers 712. The channel regions 620a of the fins 620 are then exposed, while the source and drain regions 620b of the fins 620 are still under the coverage of the first interlayer dielectric layer 720.

Figure 26A:
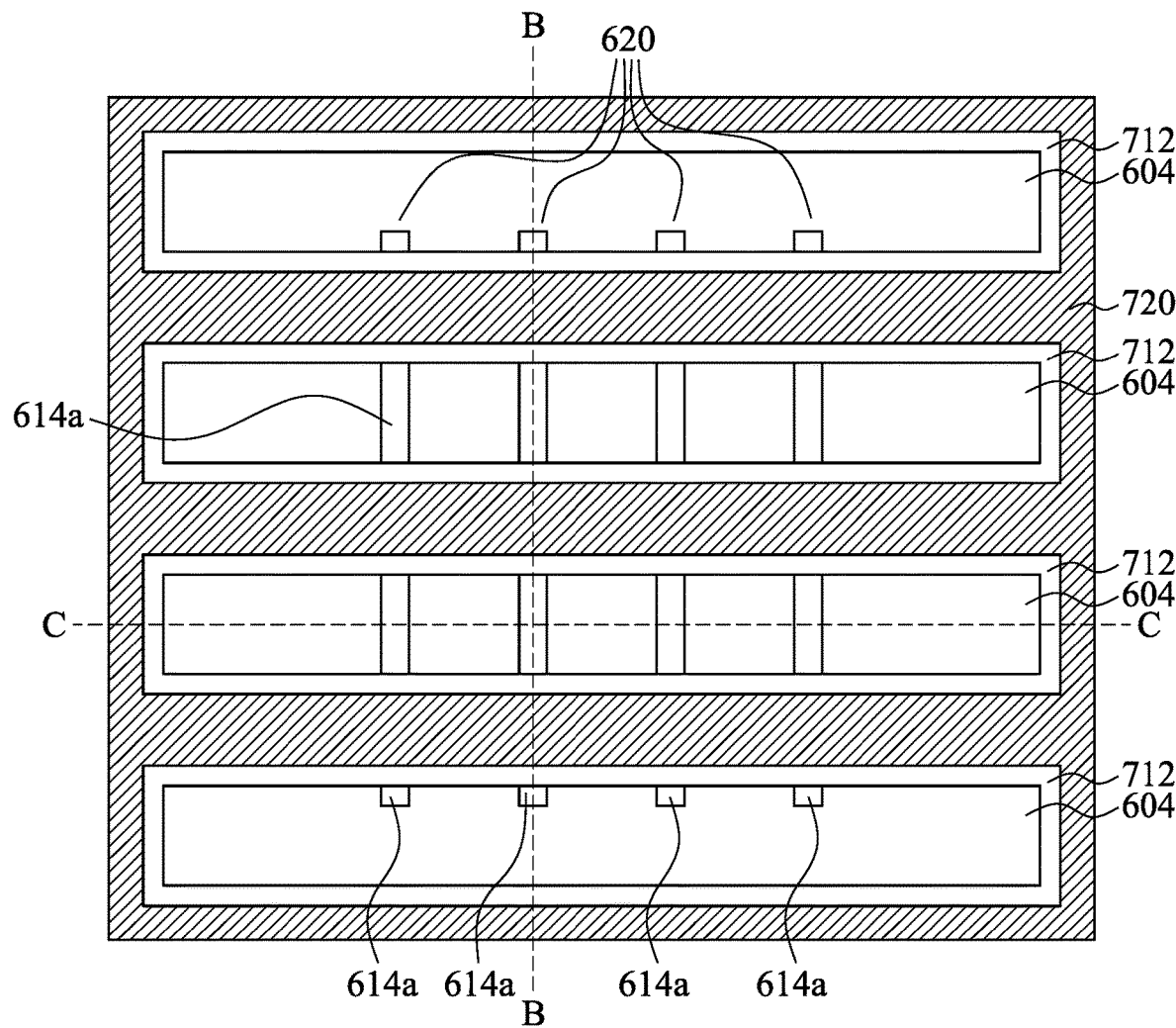
FIGS. 26A-26C illustrate a top view, a cross-sectional view along section BB, and a cross-sectional view along section C-C of the device of FIG. 25A, respectively, in a multi-stack nanowire FET device formation process in accordance with some embodiments of the instant disclosure.
Figure 26B:
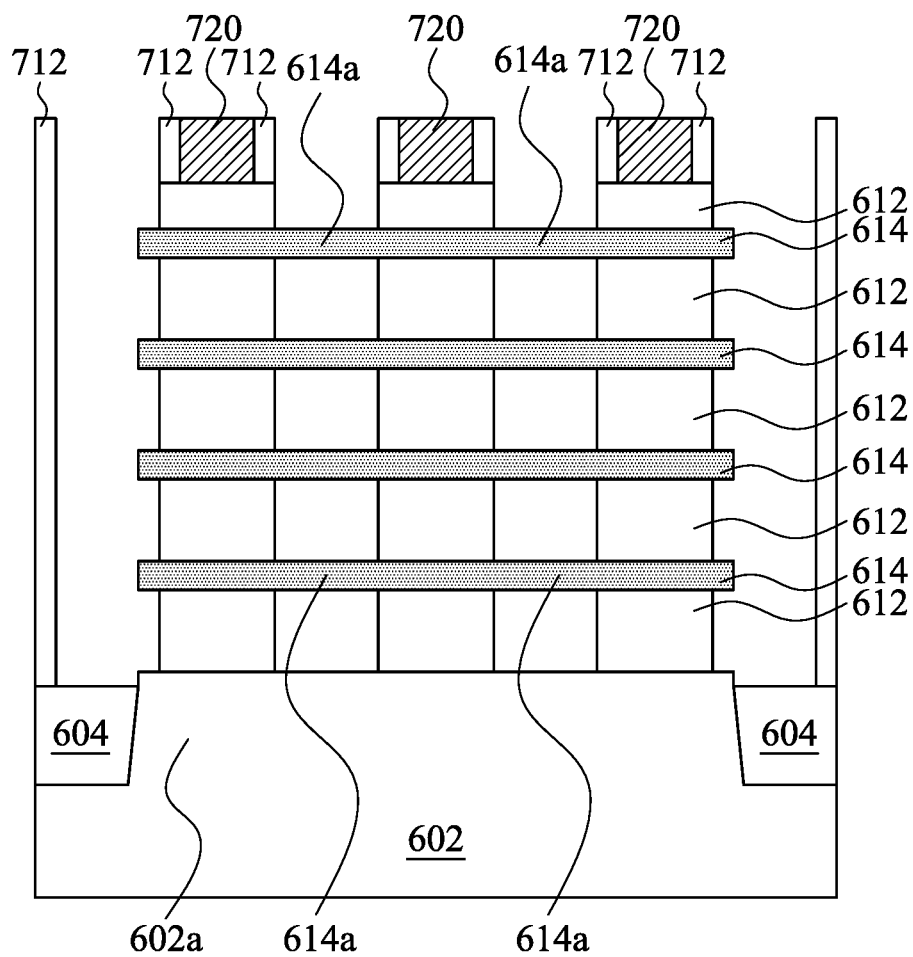
Figure 26C:
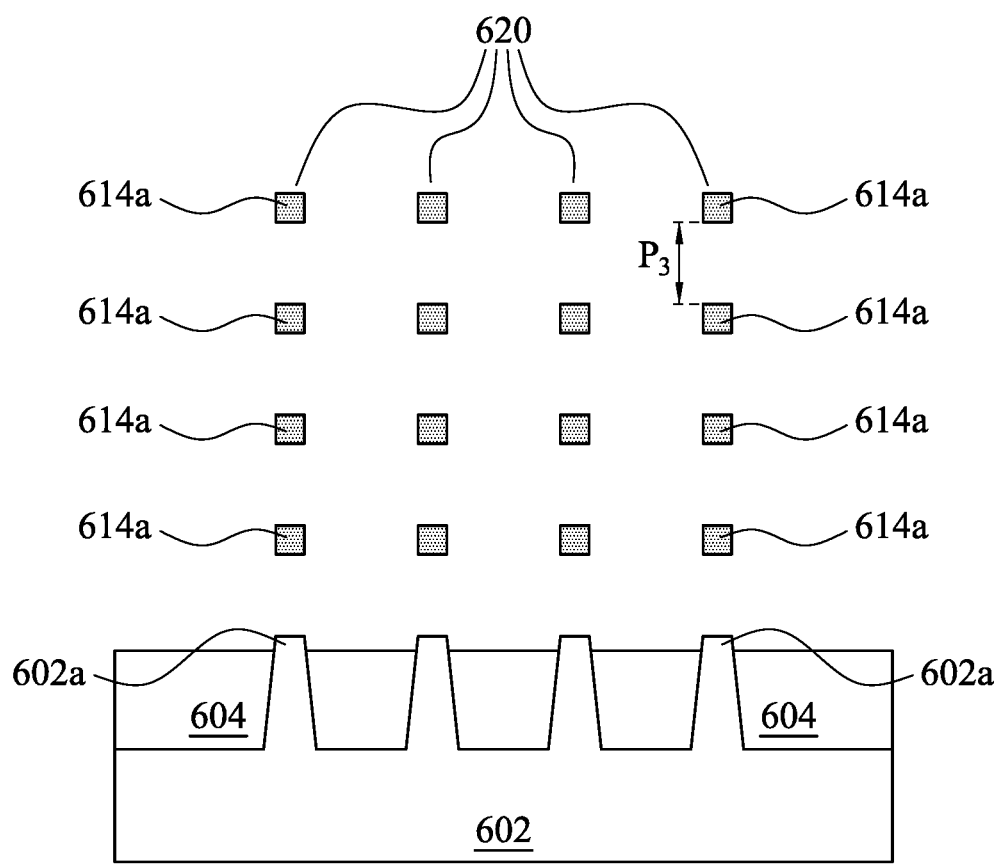

Reference is made to FIGS. 26A-26C and operation 130 of method 100 in FIG. 1. FIG. 26A is a top view of the structure 600. FIGS. 26B and 26C are cross-sectional views taken along section BB and CC in FIG. 26A respectively. After removal of the dummy gates 710, first portions 612a of the sacrificial layers 612 are removed. The first portions 612a of the sacrificial layer correspond to the channel regions 620a of the fins 620. As shown in FIG. 26A, the first portion 612a of the top sacrificial layer 612 is removed, leaving the underlying nanowire 614 exposed. The sacrificial layers 612 between the nanowires 614 are also removed. Attention is invited to FIG. 26B. The sacrificial layers 612 under the coverage of the first interlayer dielectric layer 720 remain in place. On the other hand, the second portions 612b of the sacrificial layer 612, which are under the spacers 712 and first interlayer dielectric layers 720 remains. The first portions 614a of the nanowires 614 are released from the fins 620 and spaced apart from each other. The first portions 614a of the nanowires 614 are not flanked by the sacrificial layer 612 anymore.

Attention is invited to FIG. 26C. After the removal of the first portions 612a of the sacrificial layers 612, spaces are left between the nanowires 614. As previously discussed, the pitch $P_3$ between the nanowires 614 are determined by the thickness of the sacrificial layer 612. The pitch $P_3$ between the nanowires 614 is larger than the pitch $P_1$ between the nanowires 214 shown in FIG. 10C. For example, the sacrificial layer 612 may have a thickness of 22 nm, after the removal of the first portions 612a of the sacrificial layers 612, the pitch $P_3$ is measured of 22 nm. The pitch $P_3$ results in a different configuration of the nanowires 614 at the channel regions 620a especially after the growth of the epitaxial layer 714.

Figure 27A:
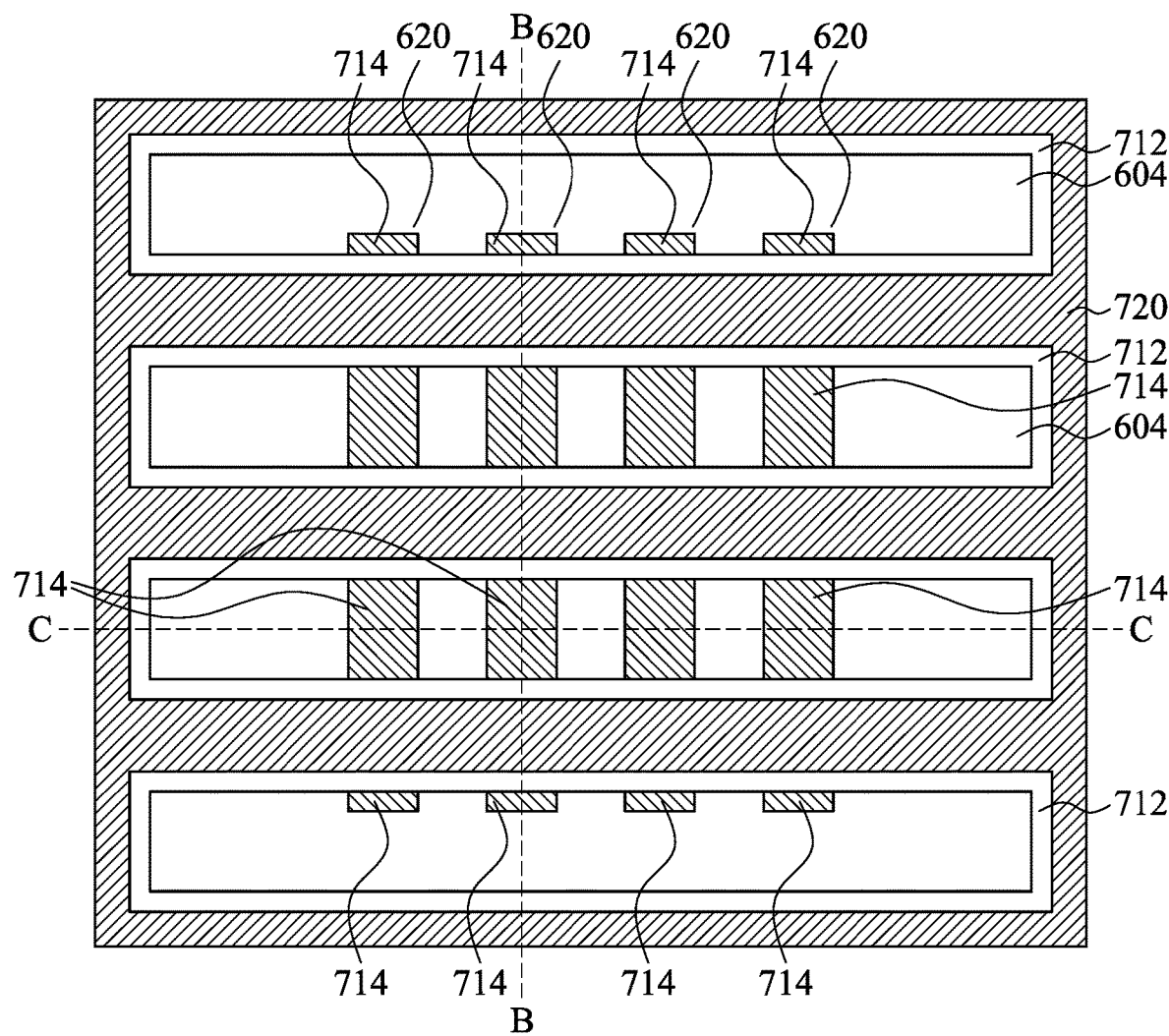
FIGS. 27A-27C illustrate a top view, a cross-sectional view along section BB, and a cross-sectional view along section C-C of the device of FIG. 26A, respectively, in a multi-stack nanowire FET device formation process in accordance with some embodiments of the instant disclosure.
Figure 27B:
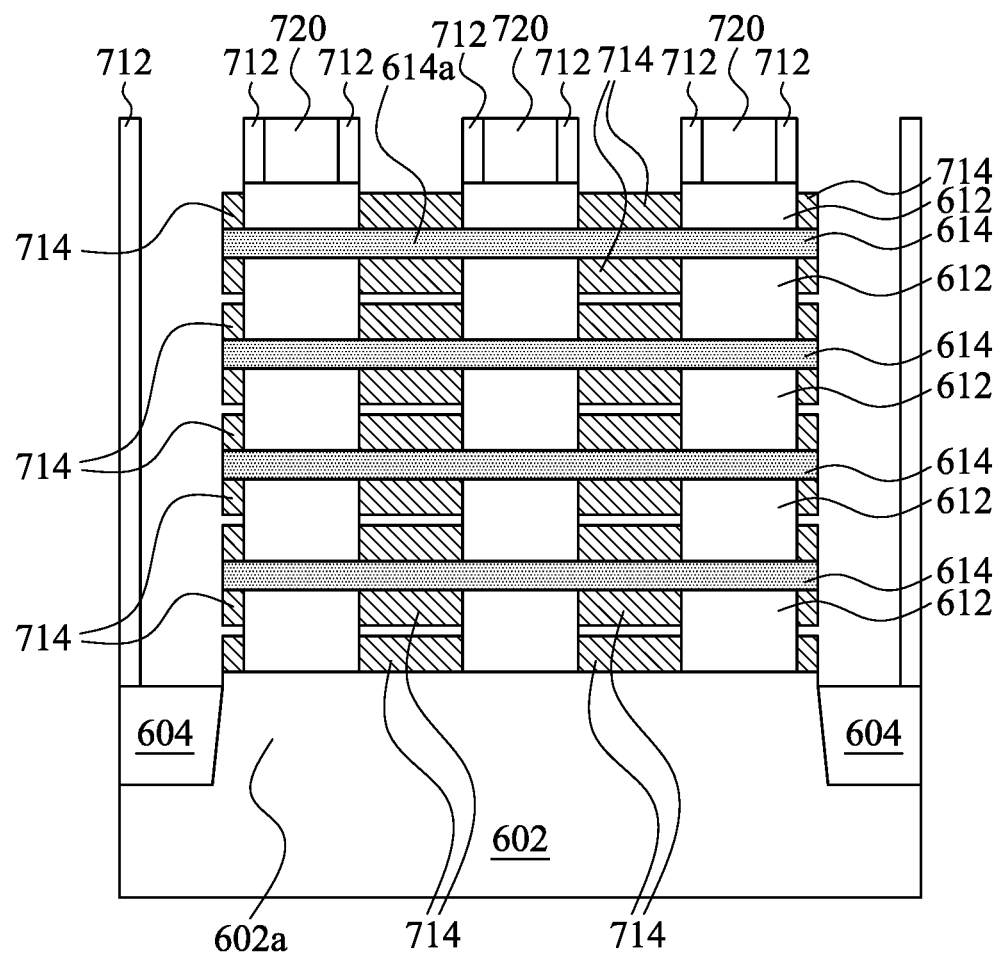
Figure 27C:
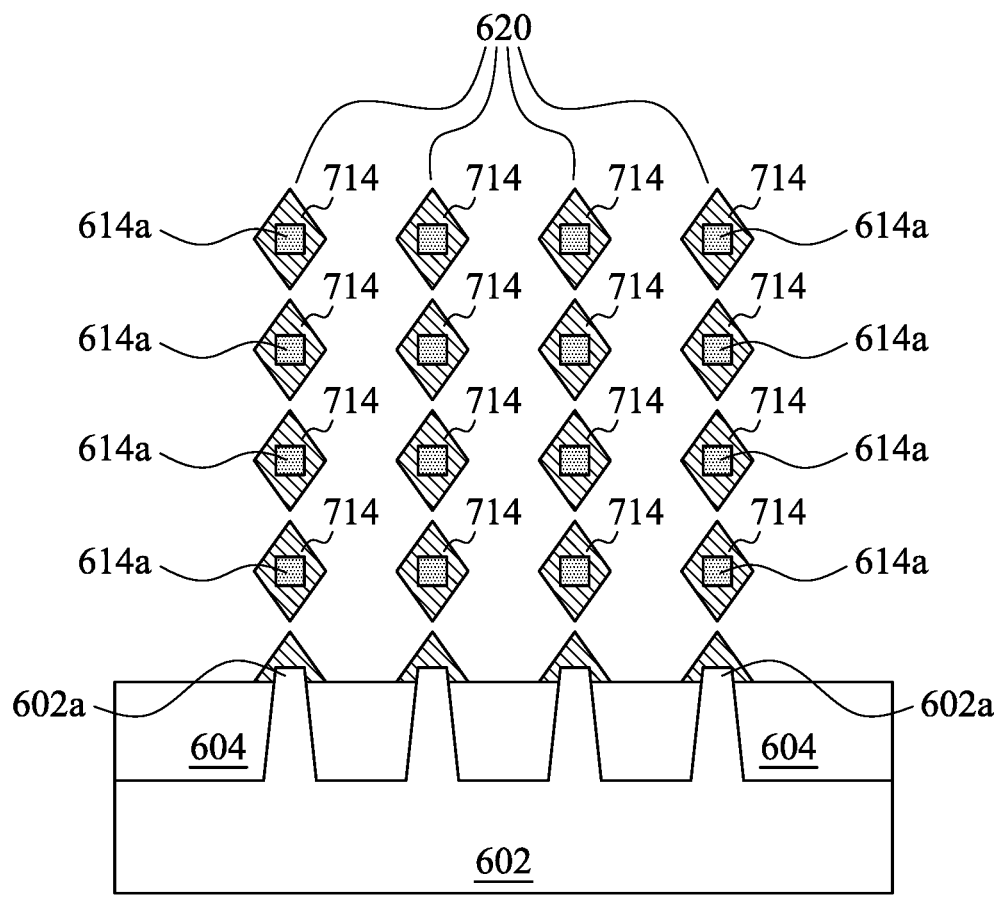

Reference is made to FIGS. 27A-27C and operation 140 of FIG. 1. FIG. 27A is a top view of the structure 600. FIGS. 27B and 27C are cross-sectional views taken along section BB and CC in FIG. 27A respectively. An epitaxial layer 714 is formed on the first portions 614a of the nanowires 614. The epitaxial layer 714 is epitaxially grown on the first portions 614a of the nanowires 614. As shown in FIG. 27C the nanowires 614 provide <100> and <110> sidewalk for the epitaxial growth. The epitaxial layer 714 expands toward the <111> plane. The <111> plane shows higher electron mobility in comparison with the <110> and <100> plane. Unlike conventional rounded or square nanowire, the epitaxial layer-wrapped nanowires 614 has zigzag contour projecting in <111> plane direction.

In addition to the <111> plane projection of the nanowires 614, the pitch $P_3$ between the nanowires 614 is larger than pitch $P_1$, and therefore the epitaxial layer 714 does not merge during the epitaxial growth as shown in FIG. 27C. Each of the first portions 614a of the nanowires 614 is wrapped around by the epitaxial layer 714 and remains physically independent from each other. The epitaxial layer 714 protrudes from the nanowire 614 in <111> plane but does not make contact with the neighbouring epitaxial layer 714. The first portions 614a of the nanowire 614 remain separated from each other even after the growth of the epitaxial layer 714. Unlike the epitaxial layer 314 shown in FIG. 11C, the epitaxial layer 714 are discrete, and the nanowires 614 are transformed into a series of diamond shape elements shown in FIG. 27C.

Figure 28A:
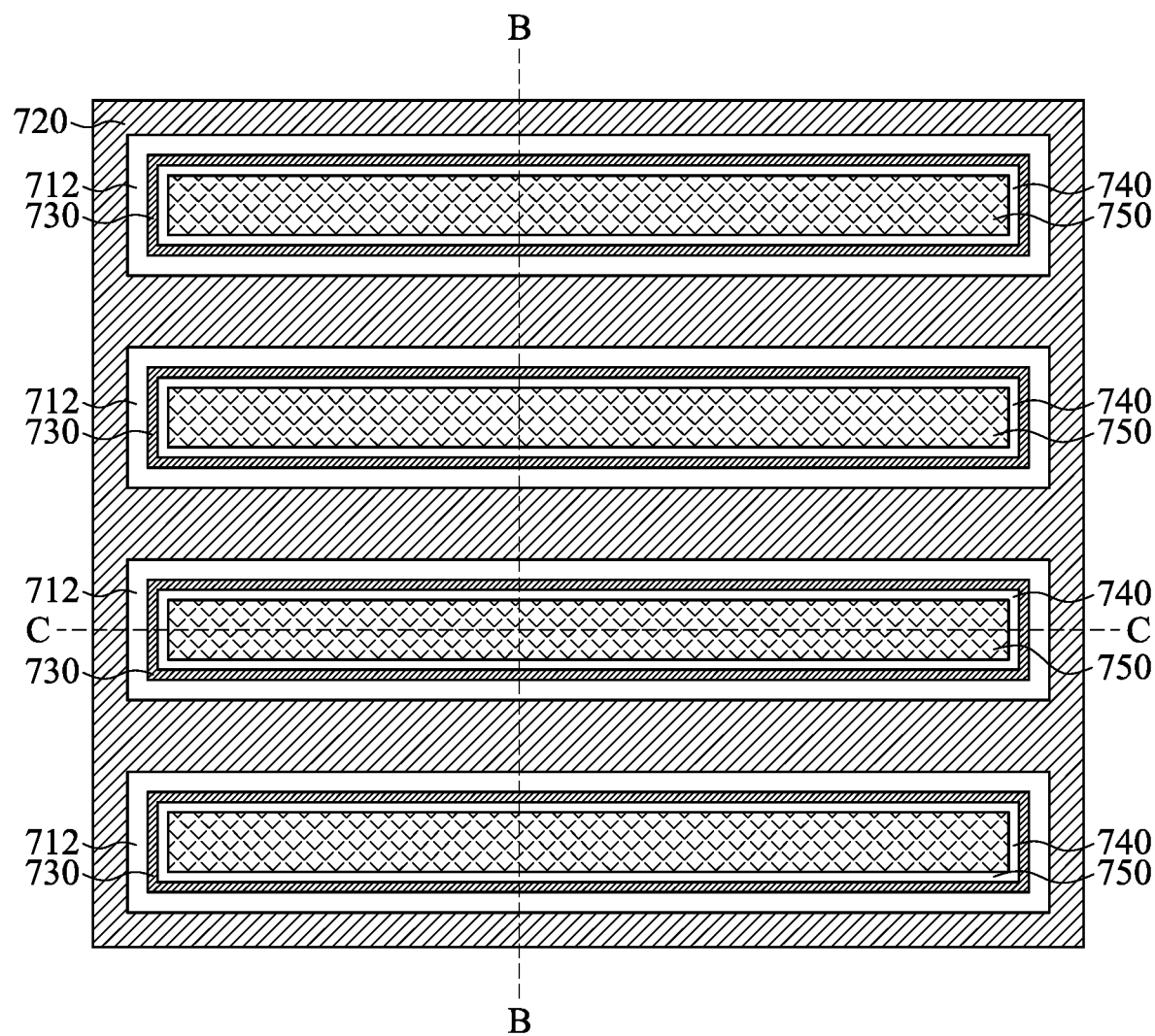
FIGS. 28A-28C illustrate a top view, a cross-sectional view along section BB, and a cross-sectional view along section C-C of the device of FIG. 27A, respectively, in a multi-stack nanowire FET device formation process in accordance with some embodiments of the instant disclosure.
Figure 28B:
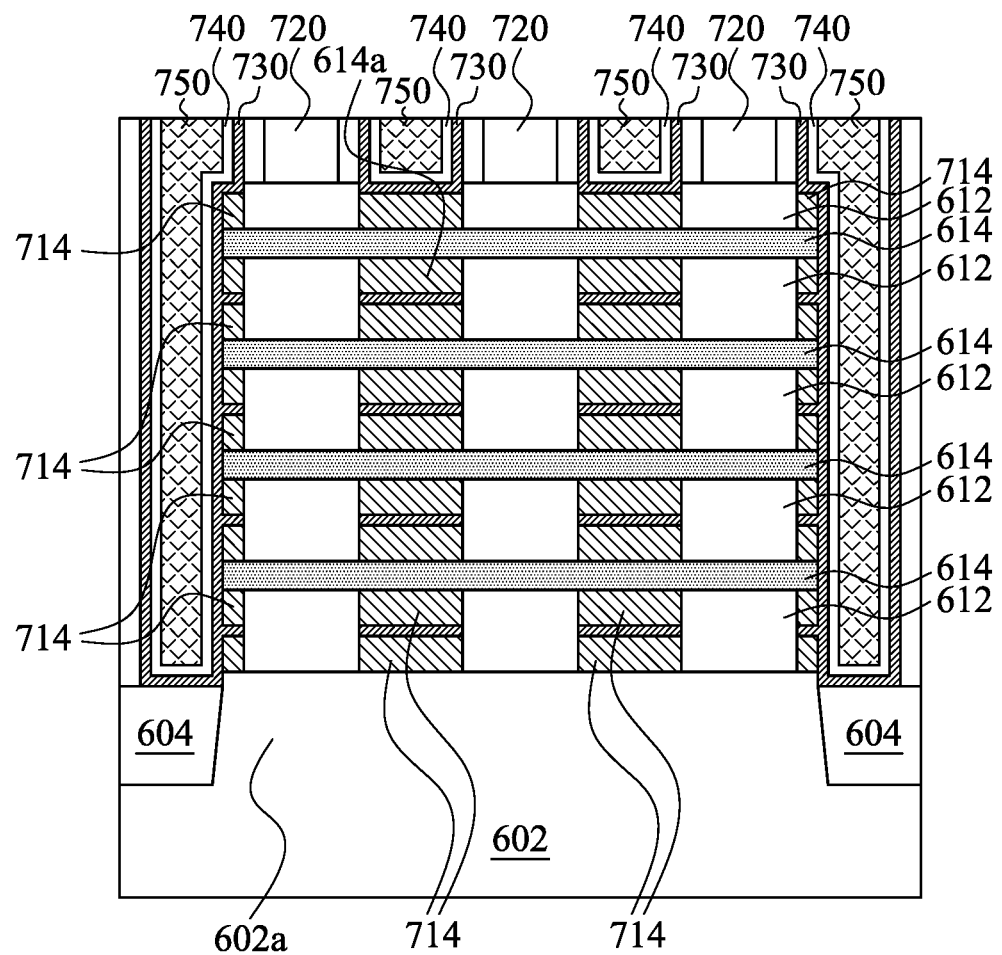
Figure 28C:
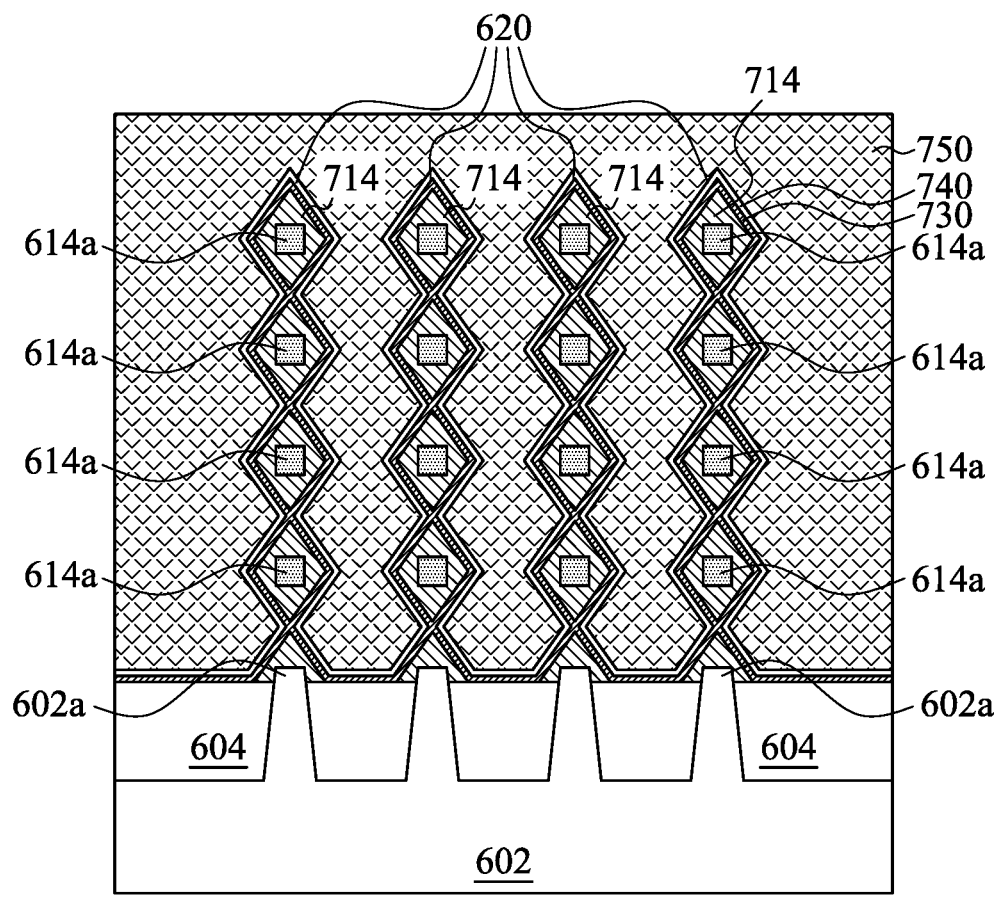

Reference is made to FIGS. 28A-28C and operation 150 of method 100 in FIG. 1. FIG. 28A is a top view of the structure 600. FIGS. 28B and 28C are cross-sectional views taken along section BB and CC in FIG. 28A respectively. A high-k gate dielectric layer 730 is formed on the epitaxial layer 714. The high-k gate dielectric layer 730 is a thin layer formed on the exposed surfaces including the sidewalls of the spacers 712 and first portions 614a of the nanowires 614. As shown in FIG. 28C, the high-k gate dielectric layer 730 wraps around the individual diamond shaped epitaxial layer 714. The first portions 614a of the nanowires 614 are then bundled together by the high-k gate dielectric layer 730. That is, the diamond shape epitaxial layer 714 along with nanowires 614 is translated into the high-dielectric layer 730, and furthermore the high-k gate dielectric layer 730 fills up the gaps between the discrete epitaxial layers 714. The surface of the isolation structures 604 and the protruded portions 602a of the semiconductor substrate 602 are also covered by the high-k gate dielectric layer 730.

Reference is still made to FIGS. 28A-28C and operation 150 of method 100 in FIG. 1. A work function metal layer 740 and a gate electrode 750 are formed. As shown in FIG. 28B, the work function metal layer 740 crawls along the surface of the high-k gate dielectric layer 730. The work function metal layer 740 does not wrap around the epitaxial layer 714 as the high-k gate dielectric layer 730 because the high-k gate dielectric layer 730 provides an overcoat of the nanowires 614. Subsequently, as shown in FIG. 28C, the gate electrode 750 fills up the spaces surrounding the nanowires 614, thereby completely sealing around the first portions 614a of the nanowires 614. The gate electrode 750 replaces the dummy gates 710.

Figure 29A:
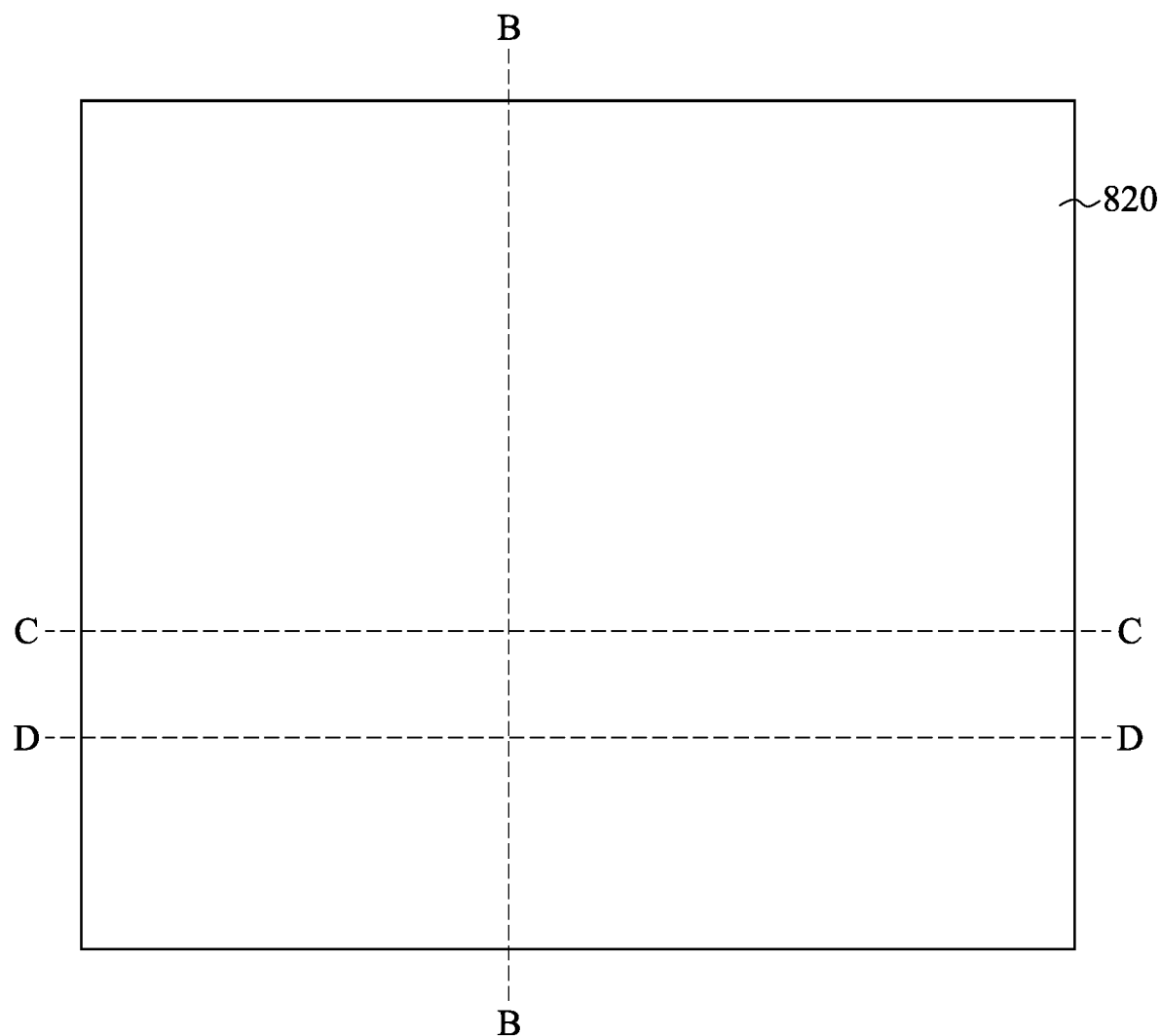
FIGS. 29A-29D illustrate a top view, a cross-sectional view along section BB, a cross-sectional view along section CC, and a cross-sectional view along section DD of the device of FIG. 28A, respectively, in a multi-stack nanowire FET device formation process in accordance with some embodiments of the instant disclosure.
Figure 29B:
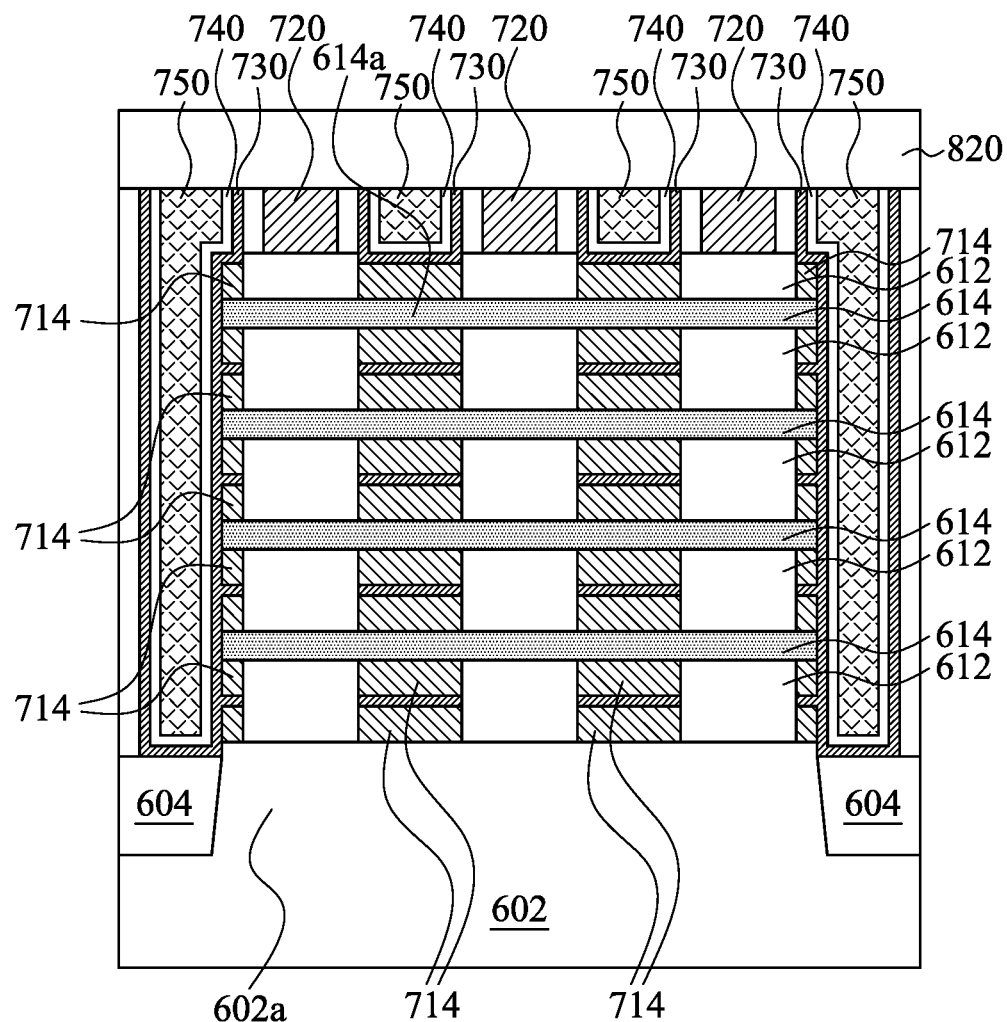
Figure 29C:
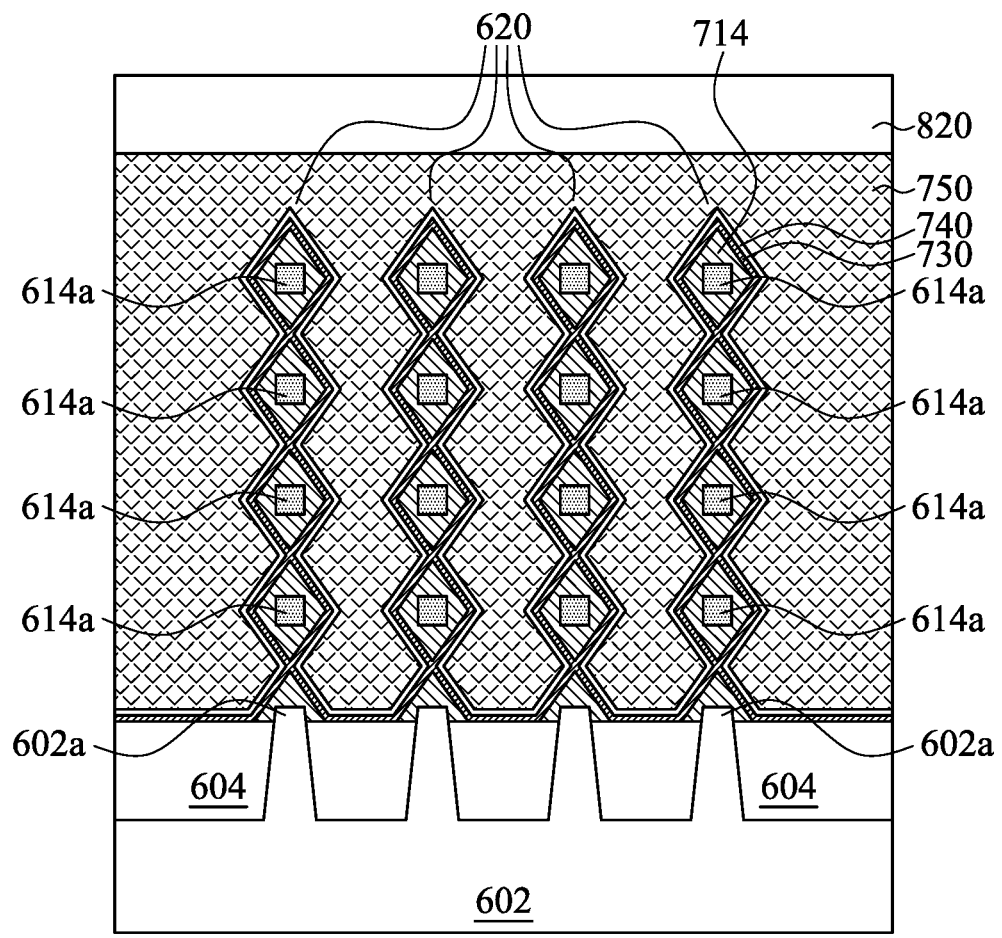
Figure 29D:
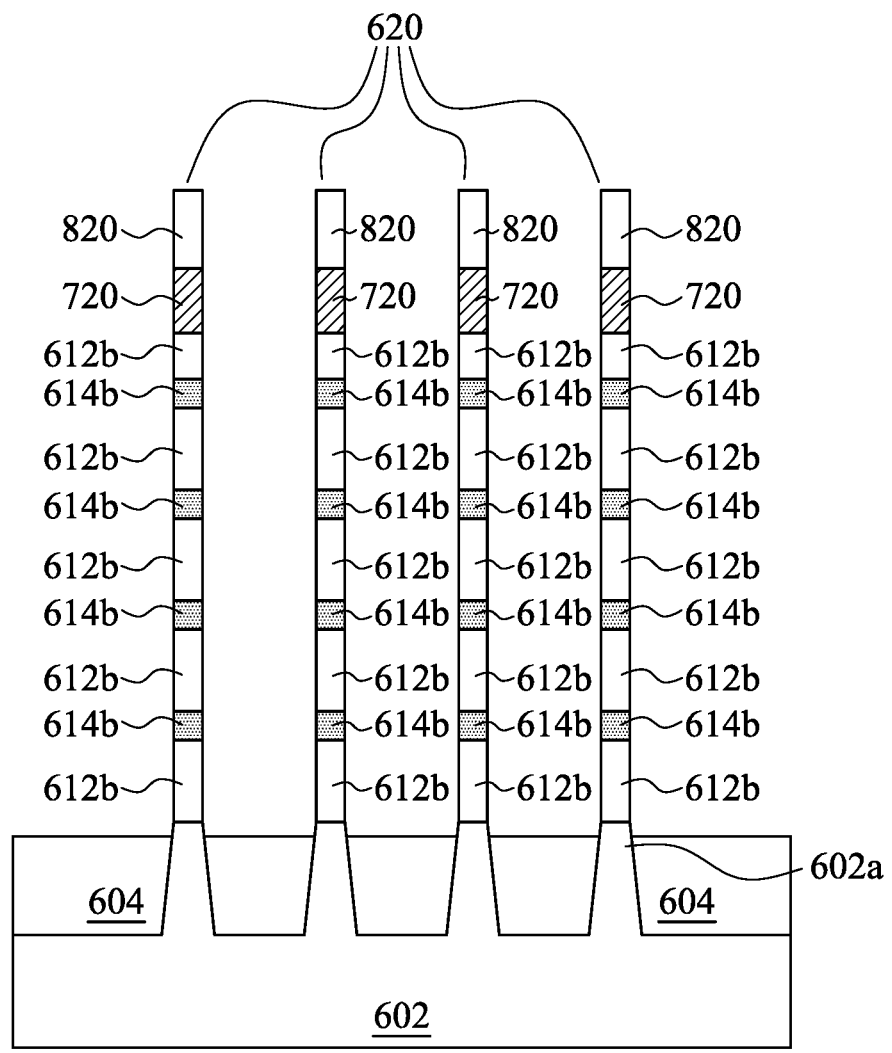

Reference is made to FIGS. 29A-29D. FIG. 29A is a top view of the structure 600. FIGS. 29B, 29C and 29D are cross-sectional views taken along section BB, CC and DD in FIG. 29A respectively. A second interlayer dielectric layer 820 is deposited on the semiconductor substrate 602. The second interlayer dielectric layer 820 is blanket deposition on the semiconductor substrate 602. As shown in FIG. 29B, the fins 620, spacers 712, first interlayer dielectric layer 720 and gate electrode 750 are all covered up by the second interlayer dielectric layer 820. The channel regions 620a (first portions 614a of the nanowires 614) are under the second interlayer dielectric layer 820 protection as shown in FIG. 29C. On top of the source and drain regions 620b of the fins 620 are the first interlayer dielectric layer 720 and the second interlayer dielectric layer 820 as shown in FIG. 29D.

Figure 30A:
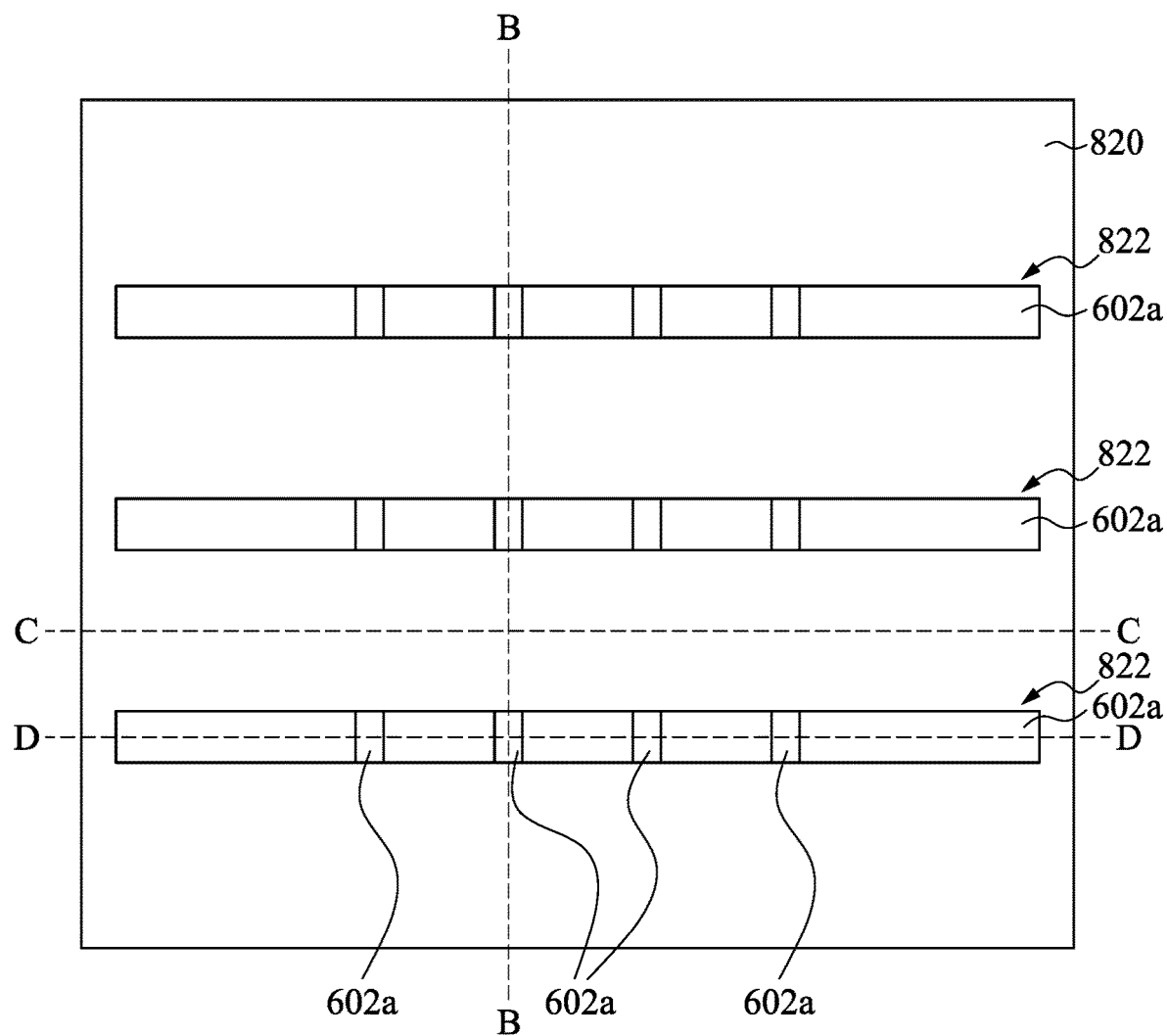
FIGS. 30A-30D illustrate a top view, a cross-sectional view along section BB, a cross-sectional view along section CC, and a cross-sectional view along section DD of the device of FIG. 29A, respectively, in a multi-stack nanowire FET device formation process in accordance with some embodiments of the instant disclosure.
Figure 30B:
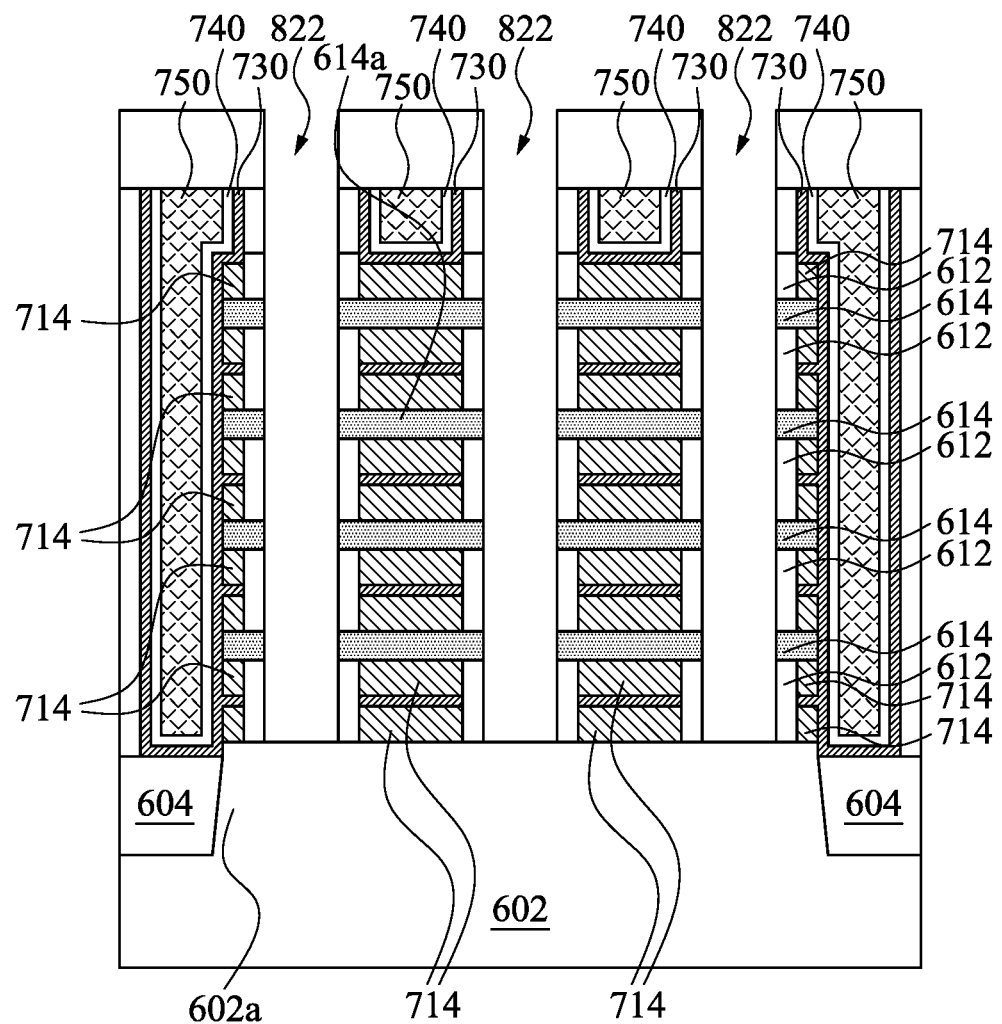
Figure 30C:
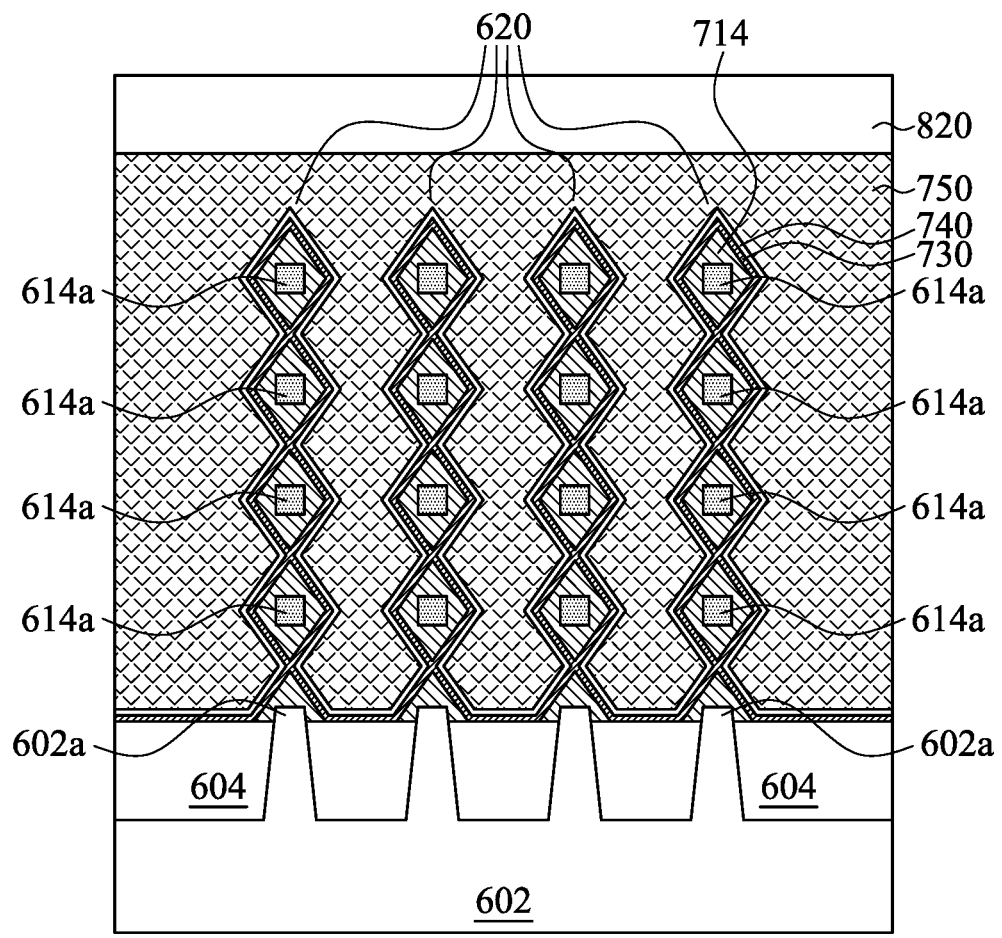
Figure 30D:
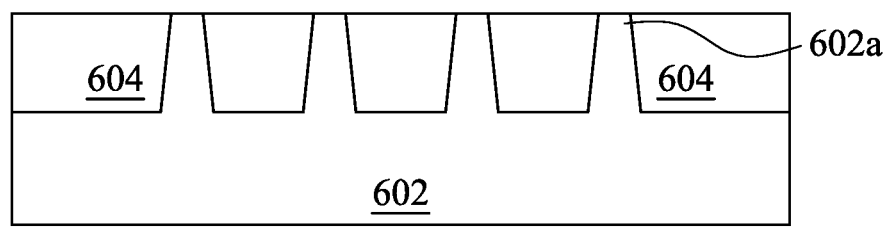

Reference is made to FIGS. 30A-30D. FIG. 30A is a top view of the structure 600. FIGS. 30B, 30C and 30D are cross-sectional views taken along section BB, CC and DD in FIG. 30A respectively. Contact openings 822 are formed in the second interlayer dielectric layer 820. The contact openings 822 are in parallel with the gate structures (i.e., perpendicular to the fins 620) and do not overlap the gate structure and channel regions 620a of the fins 620 (i.e., the first portions 614a of the nanowires 614). An etch process may be performed, and portions of the second interlayer dielectric layer 820 and the first interlayer dielectric layer 720 are removed and then the second portions 612b of the sacrificial layers 612 and the second portions 614b of the nanowires 614 are removed, leaving spaces in strip as shown in FIG. 30A. In some embodiments, the openings 822 fall between the spacers 712 and are slightly spaced apart from the spacers 712 by the first interlayer dielectric layer 720 as shown in FIG. 30B. Portions of the first interlayer dielectric layer 720 remain on the fins 620. As shown in FIGS. 30A, 30B and 30D, the contact openings 822 define the source and drain regions of the fins 620. The channel regions 620a of the fins 620 (i.e., first portions 614a of the nanowires 614) are under the protection of the second interlayer dielectric layer 820 as shown in FIG. 30C.

Figure 31A:
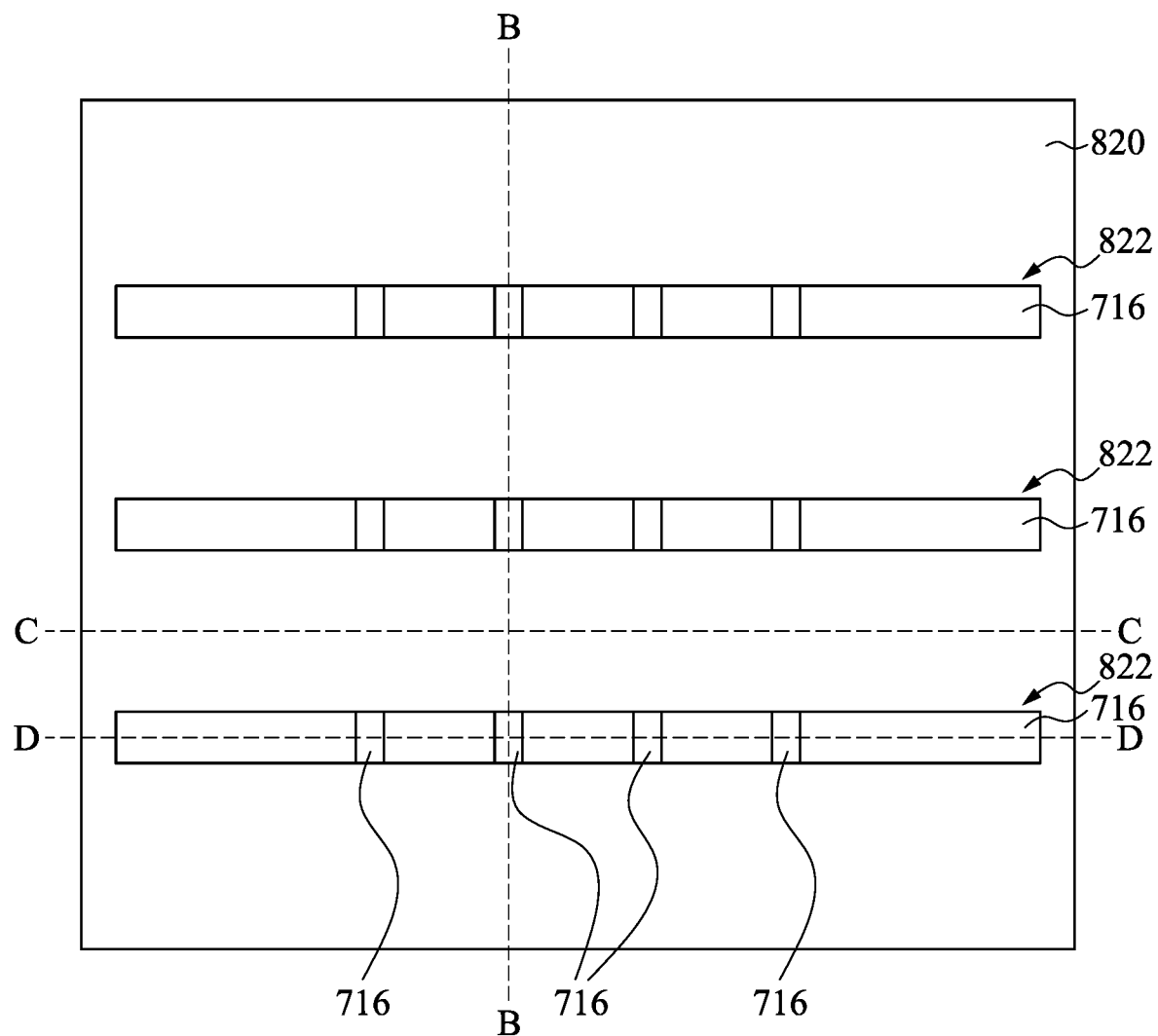
FIGS. 31A-31D illustrate a top view, a cross-sectional view along section BB, a cross-sectional view along section CC, and a cross-sectional view along section DD of the device of FIG. 30A, respectively, in a multi-stack nanowire FET device formation process in accordance with some embodiments of the instant disclosure.
Figure 31B:
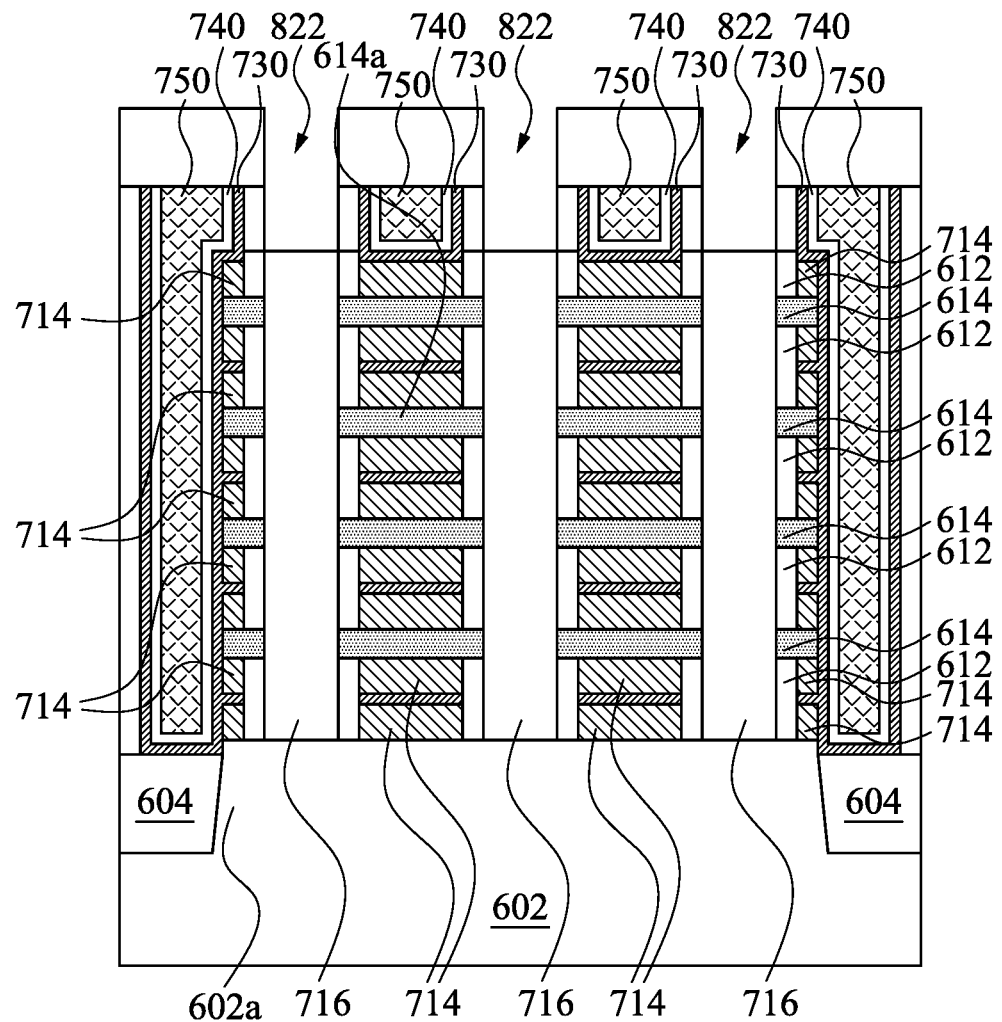
Figure 31C:
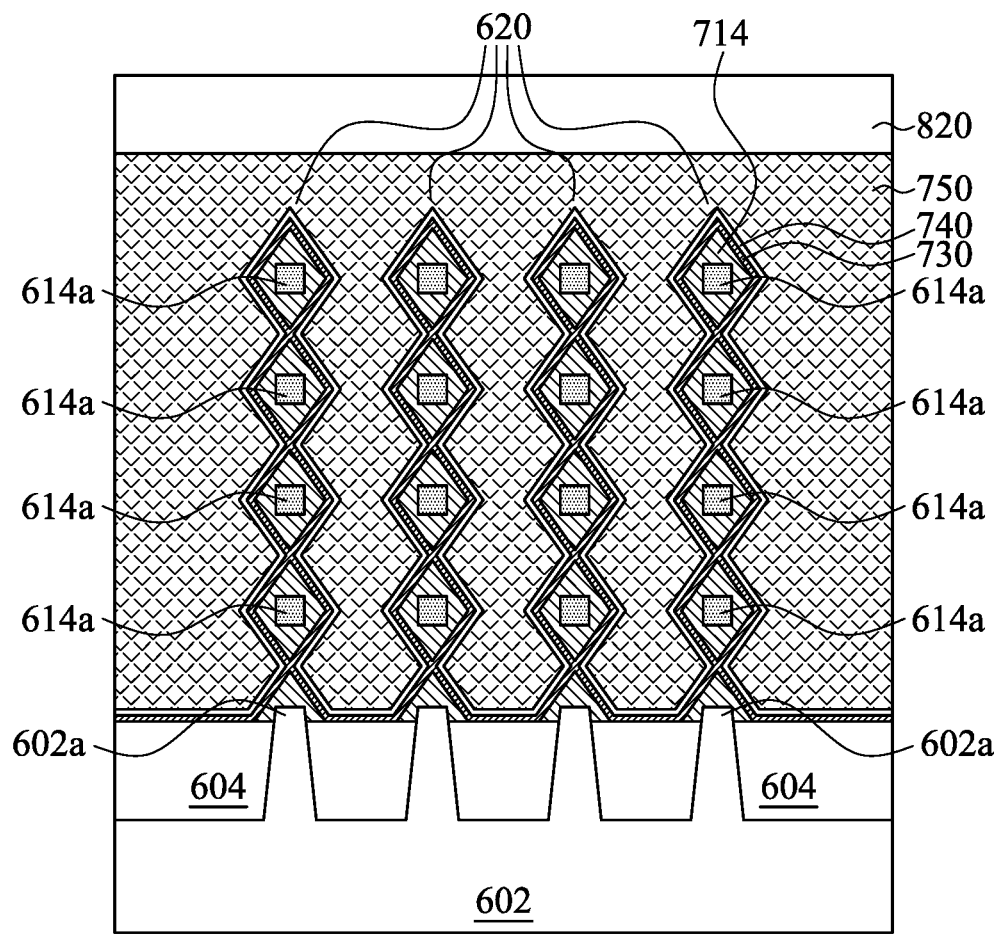
Figure 31D:
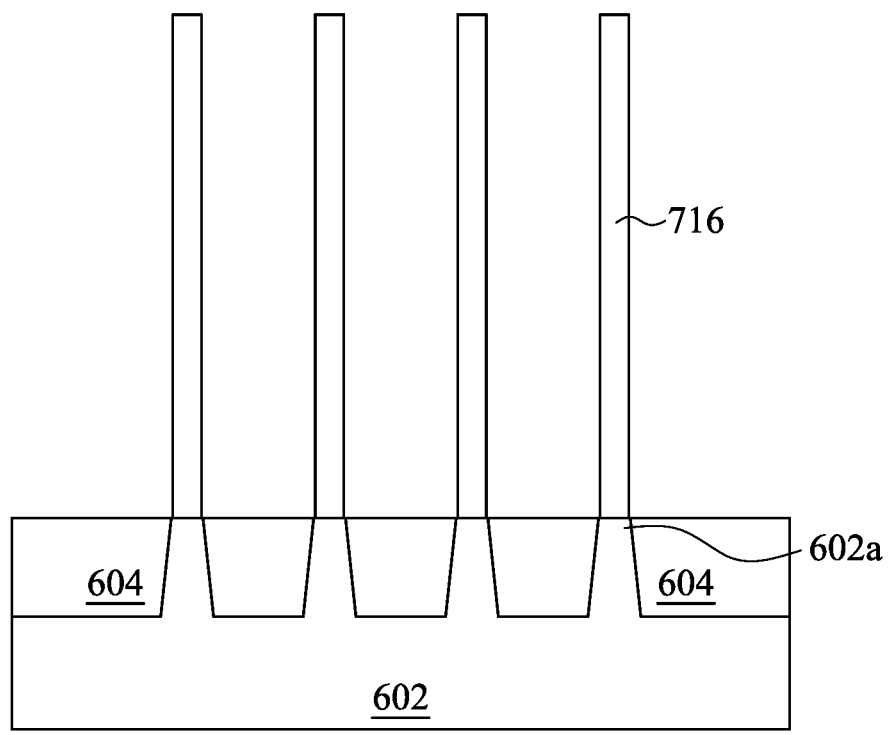

Reference is made to FIGS. 31A-31D and operation 160 in FIG. 1. FIG. 31A is a top view of the structure 600. FIGS. 31B, 31C and 31D are cross-sectional views taken along section BB, CC and DD in FIG. 31A respectively. Source and drain regions 716 are formed in the contact openings 822 by for example epitaxial growth. The source and drain regions 716 may include materials such as SiP or SiGeB and any other suitable materials.

Figure 32A:
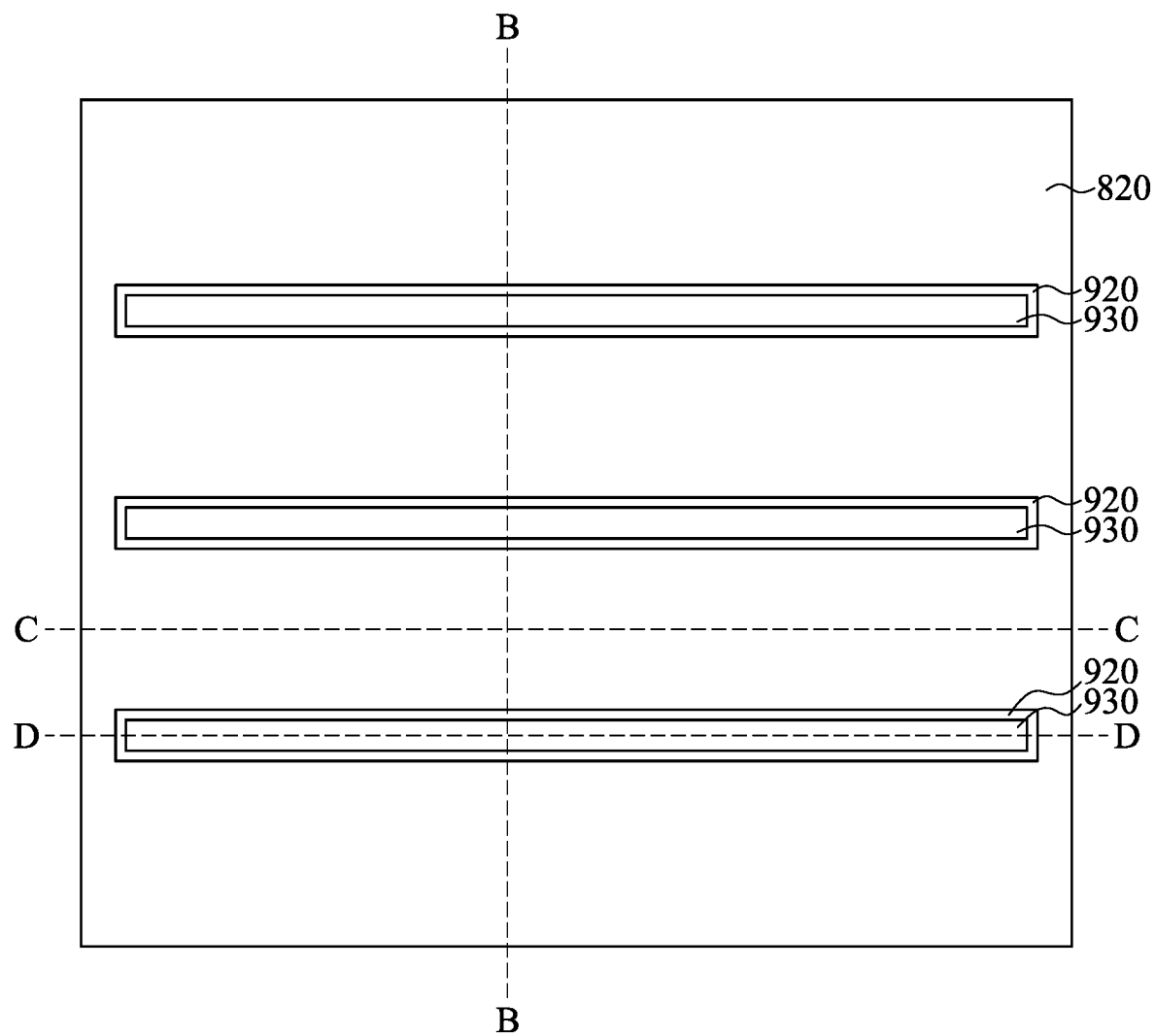
FIGS. 32A-32D illustrate a top view, a cross-sectional view along section BB, a cross-sectional view along section CC, and a cross-sectional view along section DD of the device of FIG. 31A, respectively, in a multi-stack nanowire FET device formation process in accordance with some embodiments of the instant disclosure.
Figure 32B:
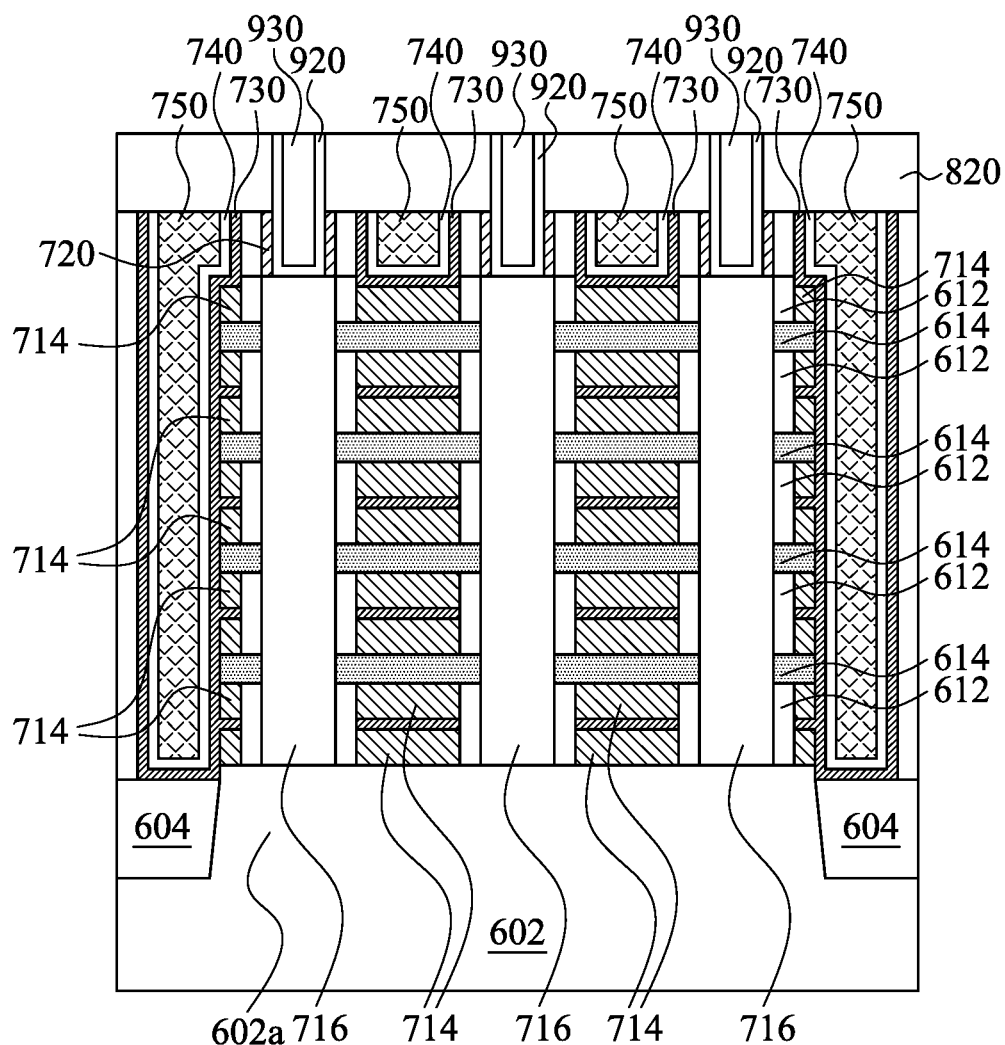
Figure 32C:
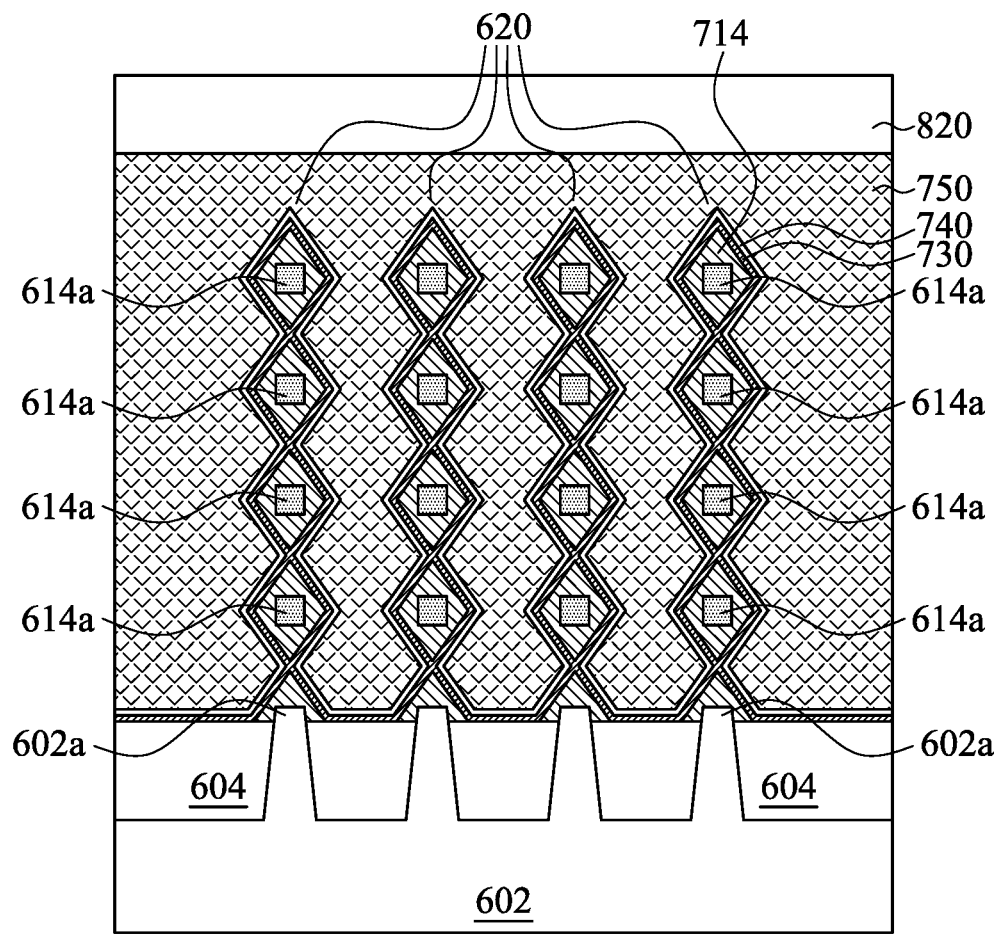
Figure 32D:
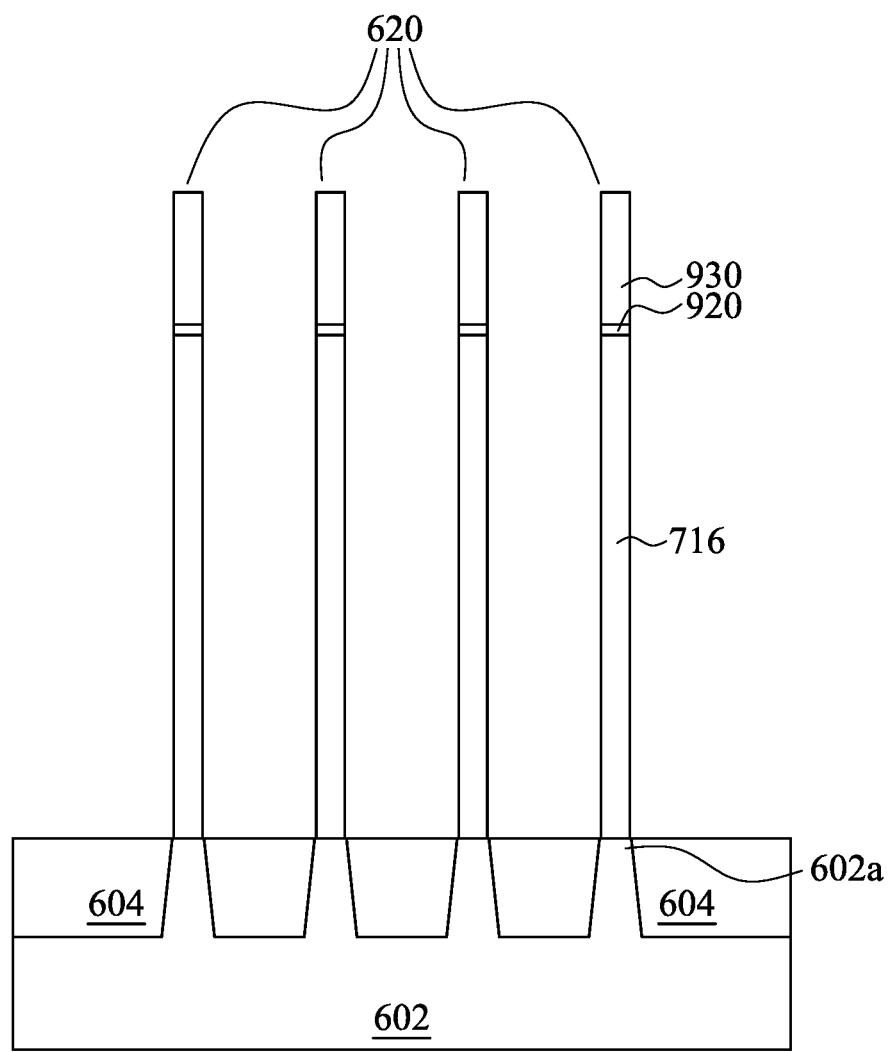

Reference is made to FIGS. 32A-32D. FIG. 32A is a top view of the structure 600. FIGS. 32B, 32C and 32D are cross-sectional views taken along section BB, CC and DD in FIG. 32A respectively. A work function metal layer 920 and a metal layer 930 are formed on the source and drain regions 716. The work function metal layer 930 is deposited in the contact openings 822 and formed on a top surface of the source and drain regions 716. Subsequently, the metal layer 940 is formed on the work function metal layer 930 and fills in the contact openings 822 as shown in FIGS. 32A and 32B.

The channel regions 620a remains the same under the protection of the second interlayer dielectric layer 820 as shown in FIG. 32C.

Figure 33A:
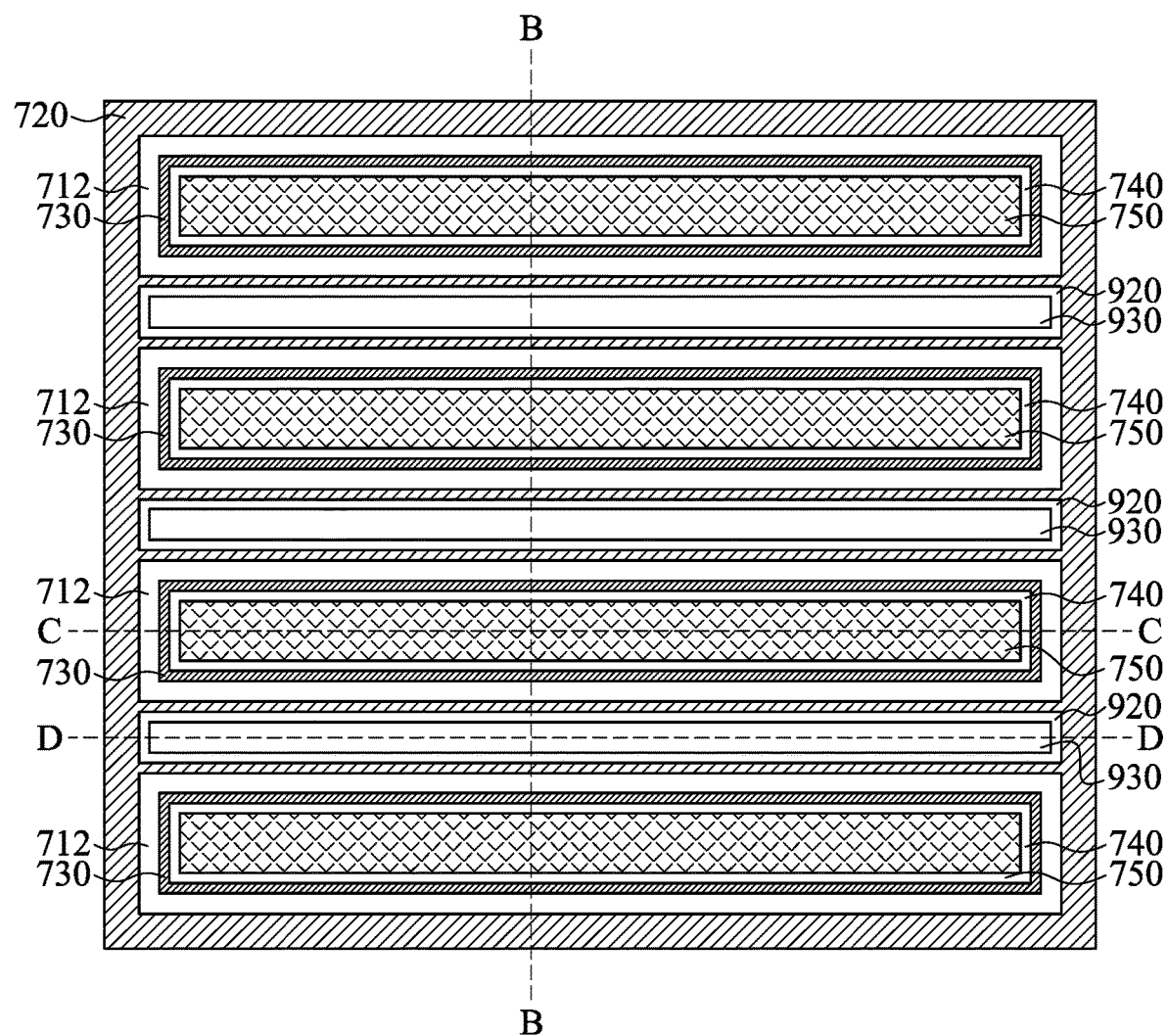
FIGS. 33A-33D illustrate a top view, a cross-sectional view along section BB, a cross-sectional view along section CC, and a cross-sectional view along section DD of the device of FIG. 31A, respectively, in a multi-stack nanowire FET device formation process in accordance with some embodiments of the instant disclosure.
Figure 33B:
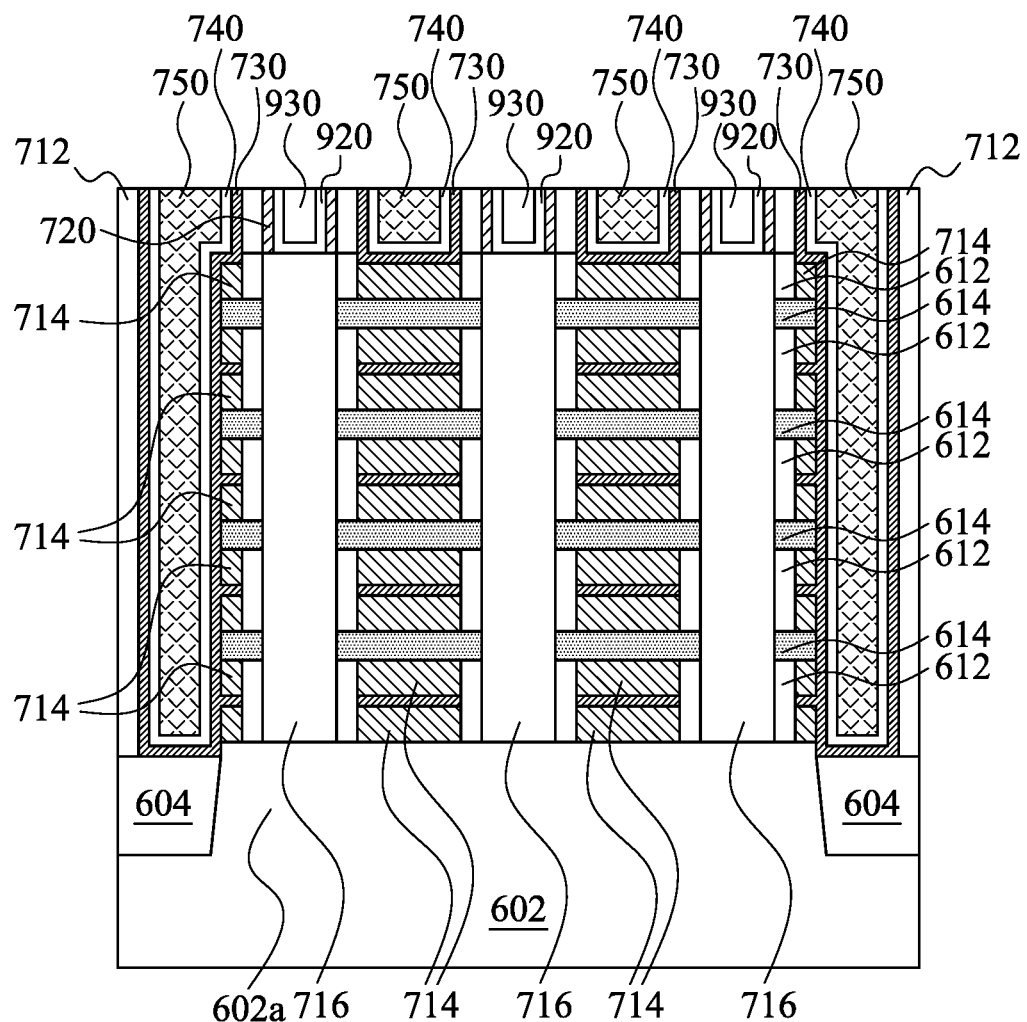
Figure 33C:
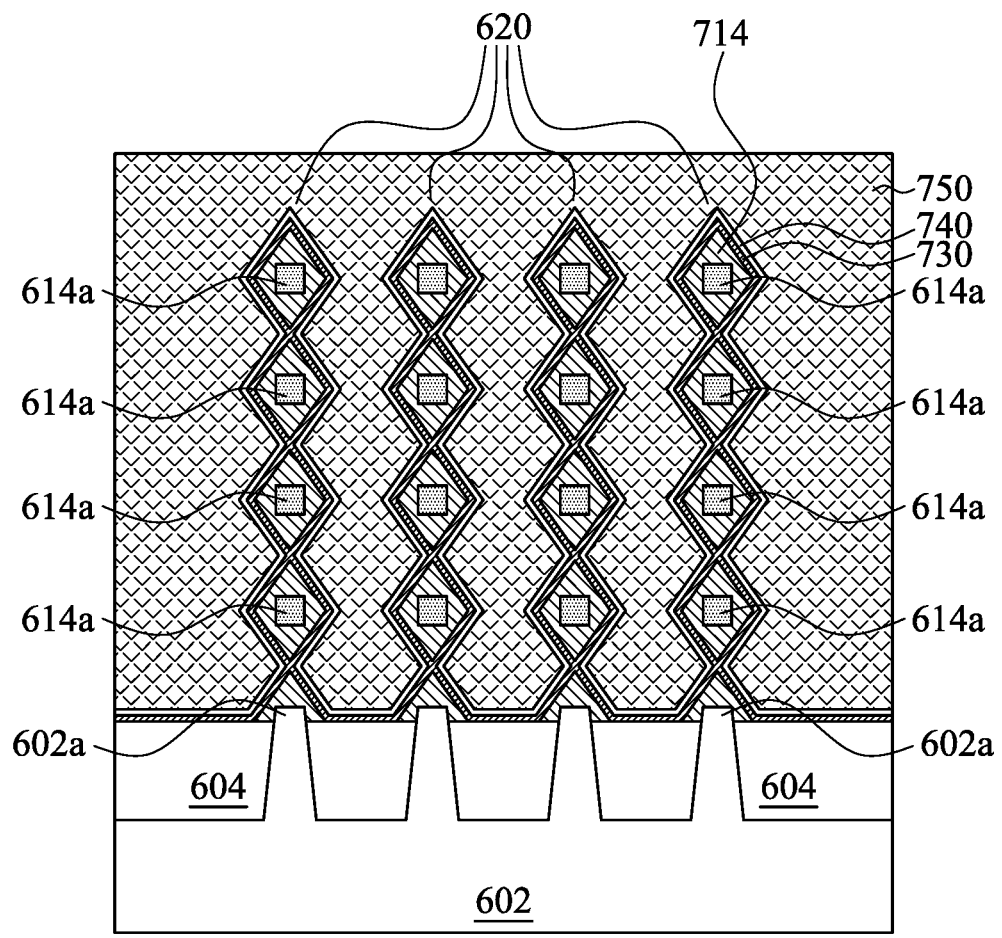
Figure 33D:
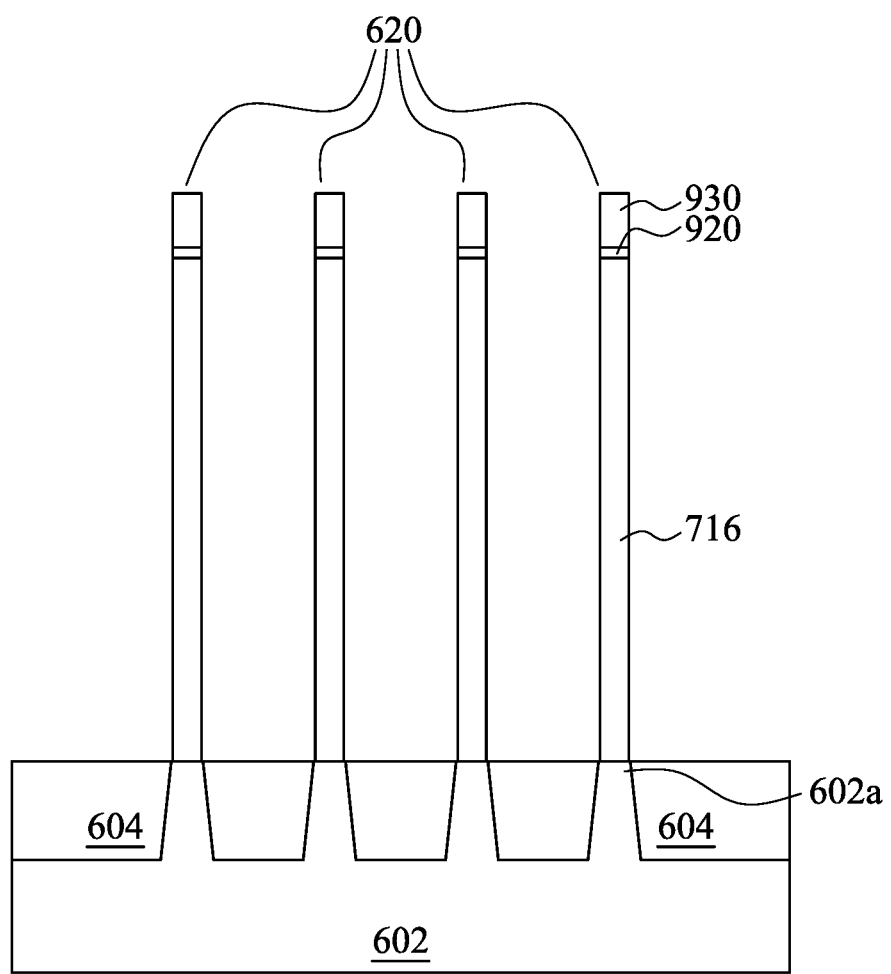

Reference is made to FIGS. 33A-33D. FIG. 33A is a top view of the structure 600. FIGS. 33B, 33C and 33D are cross-sectional views taken along section BB, CC and DD in FIG. 33A respectively. The second interlayer dielectric layer 820 is removed by polishing. The underlying gate structures are then resurfaced. The interface between the epitaxial layer 714 and the work function metal layer 920 and metal layer 930 is then maximized in the <111> plane orientation. Desirable ohmic resistance can therefore be achieved.

Figure 34C:
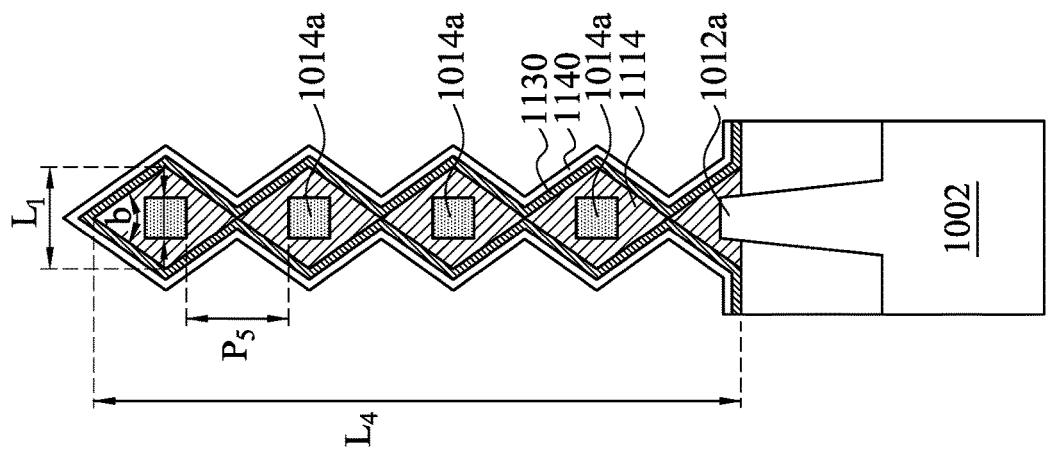
FIG. 34C illustrates an embodiment of a multi-stack nanowire in accordance with some embodiments of the instant disclosure.
Figure 34B:
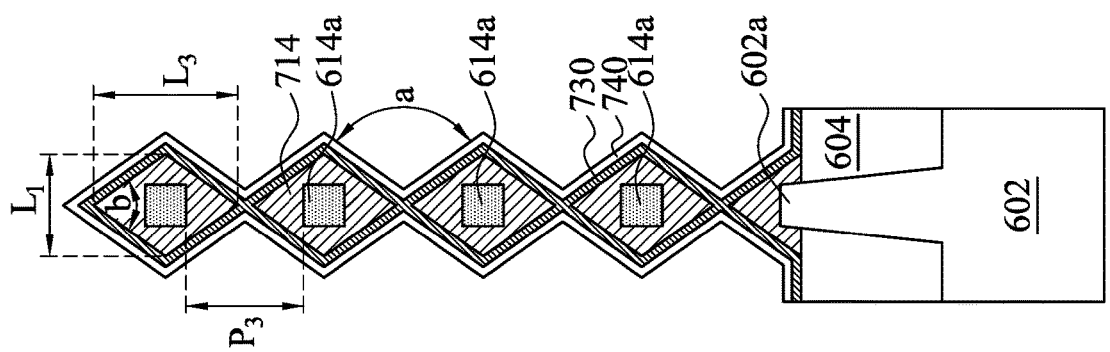
FIG. 34B illustrates an enlarged view of a portion in FIG. 33C.
Figure 34A:
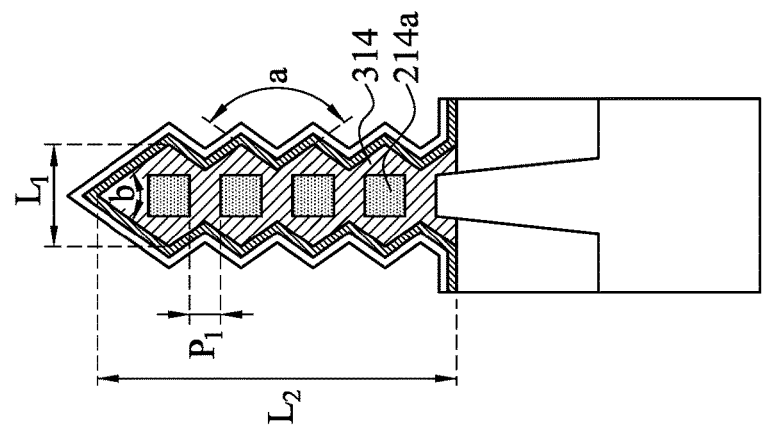
FIG. 34A illustrates an enlarged view of a portion in FIG. 17C.

Reference is made to FIG. 34A, illustrating an enlarged view of a portion in FIG. 17C. In some embodiments, the epitaxial layer 314 has a width $L_1$ measured of approximately between 5 and 25.0 nm and a height $L_2$ measured of approximately between 20 and 100 nm. The epitaxial layer 314 transforms the rectangular nanowire 214a into a multi-faceted structure. As previously discussed, the thickness of the sacrificial layer 212 determines the pitch $P_1$ between the nanowires 214a because the nanowires 214a are released from the layers of fins 220. The thickness of the sacrificial layer 212 ranges between about 0.5 and 20.0 nm. In some embodiments, if the sacrificial layers 212 have a thickness of 5 nm, the pitch $P_1$ between the nanowires 214a will be 5 nm.

Individual nanowire 214a provides a base for the epitaxial layer 314 to grow. The epitaxial layer 314 grows according to favourable crystalline development. A zig-zag contour of the epitaxial layer 314 is then created as shown in FIG. 34A. More specifically, due to faster growth rate along the <100> and <110> plane of the nanowire 214a and slower growth rate along the <111> plane, the diamond shape of the epitaxial layer 314 is repeated in a smaller scale. The <111> facet of the epitaxial layer 314 is reproduced in each of the nanowires 214a, therefore the zig-zag contour. A larger contact area (interface) between the epitaxial layer 314 and the high-k gate dielectric layer 330 is created, and a higher electron mobility is observed along the <111> plane. The epitaxial layer 314 can be adapted to both NMOS and PMOS channel region.

Reference is made to FIG. 34B, illustrating an enlarged view of a portion in FIG. 33C. In some embodiments, the epitaxial layer 714 has a width $L_1$ measured of approximately between 4 and 25.0 nm and a height $L_3$ measured of approximately between 4 and 25 nm. The epitaxial layer 714 transforms the rectangular nanowire 614a into a diamond shaped structure. The pitch $P_3$ between the nanowires 614a will be 22 nm.

Individual nanowire 614a provides a base for the epitaxial layer 714 to grow. The epitaxial layer 714 grows according to favourable crystalline development. A complete diamond contour of the epitaxial layer 714 is then created as shown in FIG. 34B. The <111> facet of the epitaxial layer 714 surrounds each of the nanowires 614a, therefore the independent diamond contour. A larger contact area (interface) between the epitaxial layer 714 and the high-k gate dielectric layer 730 is created, and a higher electron mobility is observed along the <111> plane. The epitaxial layer 714 can be adapted to both NMOS and PMOS channel region.

Reference is made to FIG. 34C, illustrating an embodiment of the instant disclosure. In some embodiments, the epitaxial layer 1114 has a width $L_1$ measured of approximately between 4 and 25.0 nm and a height $L_4$ measured of approximately between 20 and 100 nm. The epitaxial layer 1114 transforms the rectangular nanowire 1014a into a diamond shaped structure. The pitch $P_5$ between the nanowires 614a will be more than 5 nm but less than 22 nm.

Individual nanowire 1014a provides a base for the epitaxial layer 1114 to grow. The epitaxial layer 1114 grows according to favourable crystalline development. A complete diamond contour of the epitaxial layer 1114 is then created as shown in FIG. 34C and the tip of the epitaxial layer 1114 just touch its neighbouring epitaxial layer 1114. Due to the pitch $P_5$, the epitaxial layer 1114 does not overlap one another neither separated. The epitaxial layer 1114 makes point contact with its adjacent epitaxial layer 1114. The <111> facet of the epitaxial layer 1114 surrounds each of the nanowires 1014a, therefore the independent diamond contour.

Reference is made back to FIGS. 34A-34C. The epitaxial layer has a saw-like outline around the first portions of the nanowires. This contour falls into a predetermined configuration. As shown in FIGS. 34A-34C, angle a, which is measured between any two peaks of the epitaxial layer 314, is given by the Equation 1 of crystallography as the following:

$$a = 2 \times \tan^{-1}(\sqrt{2}) = 109° \qquad \text{Equation 1}$$

The angle a is equal to 109°, and the angle b as shown in FIGS. 34A-34C is calculated by 180° minus angle a (b=180°−a). The angle b, which is measured by the tip of the epitaxial layer, is therefore equal to 71°. The epitaxial layer satisfies the angle requirement where the valley has the angle a (109°) and the tip has the angle b (71°).

Desirable ohmic contact can be made on <111> facets when the epitaxial layer includes group IV and group III/V material. Group IV material includes but not limited to Ge, Si, and SiGe. Group III/V material includes InAs, GaAs, GaSb, and InSb. In some embodiments, Ge is used as the nanowire material. A precursor in the epi process may be $GeH_4$ or $Ge_2H_6$. The flow rate ranges between 50 and 800 sccm. A reaction temperature is controlled between about 390 and 500° C., and the pressure is approximately between 10 and 100 torr. In some embodiments, Si is used as the nanowire material. A precursor in the epi process may be $SiH_4$, $Si_2H_6$, or dicholorosilane (DCS). The flow rate ranges between 20 and 800 sccm. A reaction temperature is controlled between about 400 and 700° C., and the pressure is approximately between 20 and 200 torr. In some embodiments, SiGe is used as the nanowire material. A precursor in the epi process may be a combination of $SiH_4/GeH_4$ and $Si_2H_6/Ge_2H_6$. The flow rate ranges between 20 and 800 sccm. A reaction temperature is controlled between about 390 and 550° C., and the pressure is approximately between 20 and 200 torr. Group IV nanowire materials and their reaction conditions are listed in Table 1.

TABLE 1

| | Precursor | Flow rates (sccm) | Temperature (° C.) | P (Torr) |
| --- | --- | --- | --- | --- |
| Ge | $GeH_4$ | 50-800 | 450-500 | 10-100 |
| | $Ge_2H_6$ | 50-800 | 390-500 | 10-100 |
| Si | $SiH_4$ | 20-500 | 450-550 | 20-200 |
| | $Si_2H_6$ | 20-500 | 400-550 | 20-200 |
| | DCS | 20-500 | 500-700 | 20-200 |
| SiGe | $SiH_4/GeH_4$ | 20-800 | 450-550 | 20-200 |
| | $Si_2H_6/Ge_2H_6$ | 20-800 | 450-550 | 20-200 |

In some embodiments, InAs is used as the nanowire material. A precursor in the epi process may be trimethylindium (TMIn) or trimethylaluminium (TMA). The flow rate ranges between 50 and 500 sccm. A ratio between In:As ranges between about 10 and 100. A reaction temperature is controlled between about 400 and 540° C., and the pressure is approximately between 10 and 400 torr. In some embodiments, GaAs is used as the nanowire material. A precursor in the epi process may be trimethylgallium (TMGa) or tertiarybutylarsine (TBA). The flow rate ranges between 5 and 500 sccm. A ratio between As:Ga ranges between about 10 and 100. A reaction temperature is controlled between about 400 and 600° C., and the pressure is approximately between 20 and 200 torr. In some embodiments, GaSb is used as the nanowire material. A precursor in the epi process may be TMGa or trimethylstibine (TMSb). The flow rate ranges between 1 and 150 sccm. A ratio between Sb:Ga ranges between about 1 and 20. A reaction temperature is controlled between about 450 and 550° C., and the pressure is approximately between 10 and 400 torr. In some embodiments, InSb is used as the nanowire material. A precursor in the epi process may be TMIn or TMSb. The flow rate ranges between 1 and 500 sccm. A ratio between Sb:In ranges between about 1 and 20. A reaction temperature is controlled between about 400 and 550° C., and the pressure is approximately between 10 and 400 torr. Group III/V nanowire materials and their reaction conditions are listed in Table 2.

TABLE 2

| | Precursor | Flow rates (sccm) | V:III ratio | Temperature (° C.) | P (Torr) |
|---|---|---|---|---|---|
| InAs | TMIn | 50-500 | 10-100 | 400-540 | 10-400 |
| | TBA | 50-500 | 10-100 | 400-540 | 10-400 |
| GaAs | TMGa | 5-50 | 10-100 | 400-600 | 10-400 |
| | TEGa | 20-150 | 10-100 | 400-600 | 10-400 |
| | TBA | 50-500 | 10-100 | 400-600 | 10-400 |
| GaSb | TMGa | 5-50 | 1-20 | 450-550 | 10-400 |
| | TEGa | 20-150 | 1-20 | 450-550 | 10-400 |
| | TMSb | 1-20 | 1-20 | 450-550 | 10-400 |
| InSb | TMIn | 50-500 | 1-20 | 400-550 | 10-400 |
| | TMSb | 1-20 | 1-20 | 400-550 | 10-400 |

In some embodiments, precursor TBA may be replaced by $AsH_3$. In some embodiments, precursor TMSb may be replaced by TESb.

The nanowires undergo nanowire epitaxial re-growing process, the configuration of the nanowires is transformed into <111> plane projected diamond shape. The channel region therefore has larger contact area between the nanowire and the high-k gate dielectric and desirable electrical property such as ohmic resistance can be obtained in the <111> plane orientation.

In some embodiments, a multi-stack nanowire device includes a plurality of fins. Each of the fins has a multi-layer stack comprising a first nanowire and a second nanowire. A first portion of the first nanowire and second nanowire are doped to form source and drain regions. A second portion of the first nanowire and second nanowire is channel regions between the source and drain regions. An epitaxial layer wraps around the second portion of first nanowire and second nanowire. A gate is disposed over the second portion of the first nanowire and second nanowire.

In some embodiments, a multi-stack nanowire device includes a plurality of fins. A first portion of the nanowire is doped to form source and drain regions and a second portion of the nanowire is channel region between the source and drain regions. A plurality of epitaxial layers encircles the second portion of the nanowire. The epitaxial layers are spaced apart. A gate disposed over the second portion of the nanowire.

In some embodiments, a method of fabricating a multi-stack nanowire device includes forming a multi-layer stack on a semiconductor substrate. The multi-layer stack includes at least two nanowire layers and a sacrificial layer interposing between the two nanowire layers. The multi-layer stack is patterned to form a fin. A first nanowire and a second nanowire is formed from the fin by removing a first portion of the sacrificial layer. An epitaxial layer is formed on first portions of the first nanowire and second nanowire. A gate structure is formed on the first portions of the first nanowire and second nanowire. A source and drain region is formed on second portions of the first nanowire and second nanowire.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a multi-layer stack comprising a first nanowire and a second nanowire, wherein the first nanowire comprises first source/drain regions and a first channel region between the first source/drain regions, and the second nanowire comprises second source/drain regions and a second channel region between the second source/drain regions;
an epitaxial layer wrapping around the first channel region of the first nanowire and the second channel region of the second nanowire, wherein the epitaxial layer has a portion between the first nanowire and the second nanowire and an inner surface in contact with the first channel region, and the epitaxial layer is in direct contact with an entirety of a topmost surface of the first channel region of the first nanowire; and
a gate dielectric layer in contact with an outer surface of the epitaxial layer opposite to the inner surface of the epitaxial layer, wherein an interface between the gate dielectric layer and the outer surface of epitaxial layer is non-parallel with a sidewall of the first nanowire.

2. The semiconductor device of claim 1, wherein the epitaxial layer has a zigzag contour.

3. The semiconductor device of claim 1, wherein the epitaxial layer includes Ge, Si, SiGe or a combination thereof.

4. The semiconductor device of claim 1, wherein the interface between the gate dielectric layer and the outer surface of the epitaxial layer is a <111> plane.

5. The semiconductor device of claim 1, further comprising a work function metal layer over the gate dielectric layer.

6. The semiconductor device of claim 1, wherein the interface between the gate dielectric layer and the outer surface of the epitaxial layer is non-parallel with a top surface of the first nanowire.

7. The semiconductor device of claim 1, wherein the interface between the gate dielectric layer and the outer surface of the epitaxial layer is non-parallel with a bottom surface of the first nanowire.

8. The semiconductor device of claim 1, wherein the interface between the gate dielectric layer and the outer surface of the epitaxial layer is non-parallel with a sidewall of the second nanowire.

9. The semiconductor device of claim 1, wherein when viewed in a cross section taken along a direction parallel with a height of the first nanowire, the epitaxial layer completely surrounds the first channel region of the first nanowire.

10. A semiconductor device comprising:
a plurality of nanowires each having source/drain regions and a channel region between the source/drain regions;
a plurality of epitaxial layers respectively wrapping and directly contacting the channel regions of the nanowires, wherein the epitaxial layers are spaced apart, and an outer surface of at least one of the epitaxial layers is not conformal to an outer surface of at least one of the nanowires wrapped by the at least one of the epitaxial layers; and a gate electrode disposed around the epitaxial layers.

11. The semiconductor device of claim 10, wherein the outer surface of the at least one of the epitaxial layers has a diamond contour.

12. The semiconductor device of claim 10, wherein the epitaxial layers include Ge, Si, SiGe or a combination thereof.

13. The semiconductor device of claim 10, further comprising a gate dielectric layer in contact with the epitaxial layers.

14. The semiconductor device of claim 13, wherein an interface between the gate dielectric layer and at least one of the epitaxial layers is a <111> plane.

15. The semiconductor device of claim 10, further comprising a high-k gate dielectric layer wrapping around the epitaxial layers.

16. The semiconductor device of claim 15, wherein the gate electrode comprises a work function metal layer over the high-k gate dielectric layer.

17. A semiconductor device, comprising:
a plurality of nanowires each having source/drain regions and a channel region between the source/drain regions;
a plurality of epitaxial layers, each of which wraps and directly contacts a respective one of the channel regions of the nanowires, wherein each of the epitaxial layers comprises a tip and facets meeting at the tip, and the tips of an adjacent pair of the epitaxial layers are sandwiched between the adjacent pair of the epitaxy layers and are in contact with each other;
a gate dielectric layer in contact with the tips of the adjacent pair of the epitaxial layers; and
a gate electrode disposed around the gate dielectric layer and the epitaxial layers.

18. The semiconductor device of claim 17, wherein the gate dielectric layer is in contact with the facets of the epitaxial layers.

19. The semiconductor device of claim 17, wherein an interface between the gate dielectric layer and one of the epitaxial layers is a <111> plane.

20. The semiconductor device of claim 19, wherein a sidewall of one of the nanowires is non-parallel with the <111> plane.

* * * * *